(12) United States Patent
Kang et al.

(10) Patent No.: US 8,901,694 B2
(45) Date of Patent: Dec. 2, 2014

(54) OPTICAL INPUT/OUTPUT DEVICE AND METHOD OF FABRICATING THE SAME

(75) Inventors: Pil-Kyu Kang, Anyang-si (KR);
Joong-Han Shin, Seoul (KR);
Byung-Lyul Park, Seoul (KR);
Gil-Heyun Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 13/614,730

(22) Filed: Sep. 13, 2012

(65) Prior Publication Data
US 2013/0062719 A1 Mar. 14, 2013

(30) Foreign Application Priority Data
Sep. 14, 2011 (KR) .................. 10-2011-0092652

(51) Int. Cl.
| | | |
|---|---|---|
| H01L 31/0232 | (2014.01) | |
| H01L 27/14 | (2006.01) | |
| H01L 31/00 | (2006.01) | |
| G02B 6/00 | (2006.01) | |
| G02B 6/12 | (2006.01) | |
| G02B 6/42 | (2006.01) | |

(52) U.S. Cl.
CPC .......... G02B 6/4206 (2013.01); H01L 31/0232 (2013.01); G02B 6/42 (2013.01); G02B 6/4204 (2013.01); G02B 6/4201 (2013.01); G02B 6/12004 (2013.01)
USPC ............ 257/432; 257/466; 257/E31.128; 257/E31.127; 257/431; 385/14; 385/12

(58) Field of Classification Search
CPC .... G02B 6/12004; G02B 6/42; G02B 6/4204; G02B 6/12; G02B 6/13; G02B 6/4201; G02B 6/4206; H01L 31/0232; H01L 27/14625
USPC .............. 385/14, 12, 132; 257/431, 466, 184, 257/E31.128, E31.127, 98; 438/29, 31
See application file for complete search history.

(56) References Cited

U.S. PATENT DOCUMENTS

| | | | |
|---|---|---|---|
| 5,747,860 A * | 5/1998 | Sugiyama et al. ............ | 257/432 |
| 6,897,498 B2 | 5/2005 | Gothoskar et al. | |
| 2010/0133585 A1 | 6/2010 | Kim et al. | |
| 2010/0207223 A1* | 8/2010 | Feng et al. .................... | 257/432 |
| 2010/0330727 A1* | 12/2010 | Hill et al. ........................ | 438/69 |
| 2012/0025265 A1 | 2/2012 | Ji et al. | |

FOREIGN PATENT DOCUMENTS

| | | |
|---|---|---|
| KR | 2000-0027652 A | 5/2000 |
| KR | 10-0745274 B1 | 8/2007 |
| KR | 10-2010-0063607 A | 6/2010 |
| KR | 10-2012-0011117 A | 2/2012 |

* cited by examiner

*Primary Examiner* — Fernando L Toledo
*Assistant Examiner* — Aaron Gray
(74) *Attorney, Agent, or Firm* — Sughrue Mion, PLLC

(57) ABSTRACT

An optical input/output (I/O) device is provided. The device includes a substrate including an upper trench; a waveguide disposed within the upper trench of the substrate; a photodetector disposed within the upper trench of the substrate and comprising a first end surface optically connected to an end surface of the waveguide; and a light-transmitting insulating layer interposed between the end surface of the waveguide and the first end surface of the photodetector.

17 Claims, 53 Drawing Sheets

OPTICAL INPUT/OUTPUT DEVICE AND METHOD OF FABRICATING THE SAME

CROSS-REFERENCE TO RELATED APPLICATION

This application claims priority under 35 U.S.C. §119 to Korean Patent Application No. 10-2011-0092652 filed on Sep. 14, 2011, the disclosure of which is hereby incorporated by reference in its entirety.

BACKGROUND

1. Field

Devices, apparatus, and articles of manufacture consistent with the present disclosure relate to a butt-coupled-type optical input/output (I/O) device and a method of fabricating the same.

2. Description of Related Art

An optical input/output (I/O) device is a device configured to transmit/receive data using light. The optical I/O device may include a waveguide configured to transmit an optical signal, and a photodetector (PD) optically connected to the waveguide. The PD may convert the optical signal and an electrical signal into each other.

Optical I/O devices may be classified into a butt-coupled-type optical I/O device in which a PD is optically connected to an end surface of a waveguide, and an evanescent-coupled-type optical I/O device in which a PD is optically connected to a lateral surface of a waveguide.

SUMMARY

One or more exemplary embodiments provide an optical input/output (I/O) device and a method of fabricating the same, which may prevent occurrence of crystal defects on a path through which an optical signal travels, to improve reliability.

One or more exemplary embodiments also provide a semiconductor device, a memory module, and an electronic system including the optical I/O device.

Aspects of the inventive concept should not be limited by the above description, and other unmentioned aspects will be clearly understood by one of ordinary skill in the art from exemplary embodiments described herein.

In accordance with an aspect of an exemplary embodiment, there is provided an optical input/output (I/O) device that includes a substrate including an upper trench; a waveguide disposed within the upper trench of the substrate; a photodetector (PD) disposed within the upper trench of the substrate and comprising a first end surface optically connected to an end surface of the waveguide; and a light-transmitting insulating layer interposed between the end surface of the waveguide and the first end surface of the PD.

The substrate may include a first region where the waveguide is disposed, and a second region where the PD is disposed. A horizontal width of the upper trench disposed in the second region may be greater that a horizontal width of the upper trench disposed in the first region.

A distance between a first sidewall of the upper trench and a first lateral surface of the waveguide may be equal to a distance between the first sidewall of the upper trench and a first lateral surface of the PD.

A horizontal length of the upper trench disposed in the second region may be greater than the sum of a horizontal length of the PD and a horizontal length of the light-transmitting insulating layer.

A distance between a second end surface of the PD and the upper trench may be equal to the horizontal length of the light-transmitting insulating layer.

The optical I/O device may further include a lower trench disposed under the upper trench. A horizontal width of the lower trench disposed in the first region may be equal to a horizontal width of the lower trench disposed in the second region.

A first sidewall of the lower trench may be vertically aligned with a first sidewall of the upper trench.

The horizontal width of the lower trench may be equal to a horizontal width of the upper trench disposed in the first region.

The substrate may include a seed region exposed by the upper trench. The seed region is disposed in the second region of the substrate.

A horizontal width of the PD may be equal to a horizontal width of the waveguide.

The waveguide may include silicon (Si), and the PD may include germanium (Ge).

The PD may include a first doping region, a second doping region spaced apart from the first doping region, and an intrinsic region. The first doping region may include first impurities and the second doping region may include second impurities, and the second impurities may be of a different conductivity type from the first impurities.

The optical I/O device may further include an upper cladding insulating layer disposed on the waveguide and the PD. The upper cladding insulating layer may include a same material as the light-transmitting insulating layer.

In accordance with an aspect of another exemplary embodiment, there is provided an optical I/O device that includes a substrate including a trench, a lower cladding insulating layer configured to cover a bottom surface of the trench of the substrate, a light-transmitting insulating layer disposed on the lower cladding insulating layer, a waveguide configured to contact a first lateral surface of the light-transmitting insulating layer, and a PD configured to contact a second lateral surface of the light-transmitting insulating layer.

A top surface of the PD may be at the same level as a top surface of the waveguide.

BRIEF DESCRIPTION OF THE DRAWINGS

The above and/or other aspects will be apparent from the following description of exemplary embodiments, taken in conjunction with the accompanying drawings, in which:

FIGS. 7A through 30A are x-axial cross-sectional views illustrating a method of fabricating the optical I/O device shown in FIGS. 1A through 1C according to an exemplary embodiment;

FIGS. 7B through 30B are y-axial cross-sectional views illustrating the method of fabricating the optical I/O device shown in FIGS. 1A through 1C;

FIGS. 31A through 33A are x-axial cross-sectional views illustrating a method of fabricating the optical I/O device shown in FIGS. 2A through 2C according to an exemplary embodiment;

FIGS. 31B through 33B are y-axial cross-sectional views illustrating the method of fabricating the optical I/O device shown in FIGS. 2A through 2C;

FIGS. 34A through 48A are x-axial cross-sectional views illustrating a method of fabricating the optical I/O device shown in FIGS. 6A through 6C according to an exemplary embodiment;

FIGS. 34B through 48B are y-axial cross-sectional views illustrating the method of fabricating the optical I/O device shown in FIGS. 6A through 6C;

DETAILED DESCRIPTION

Figure 1A:
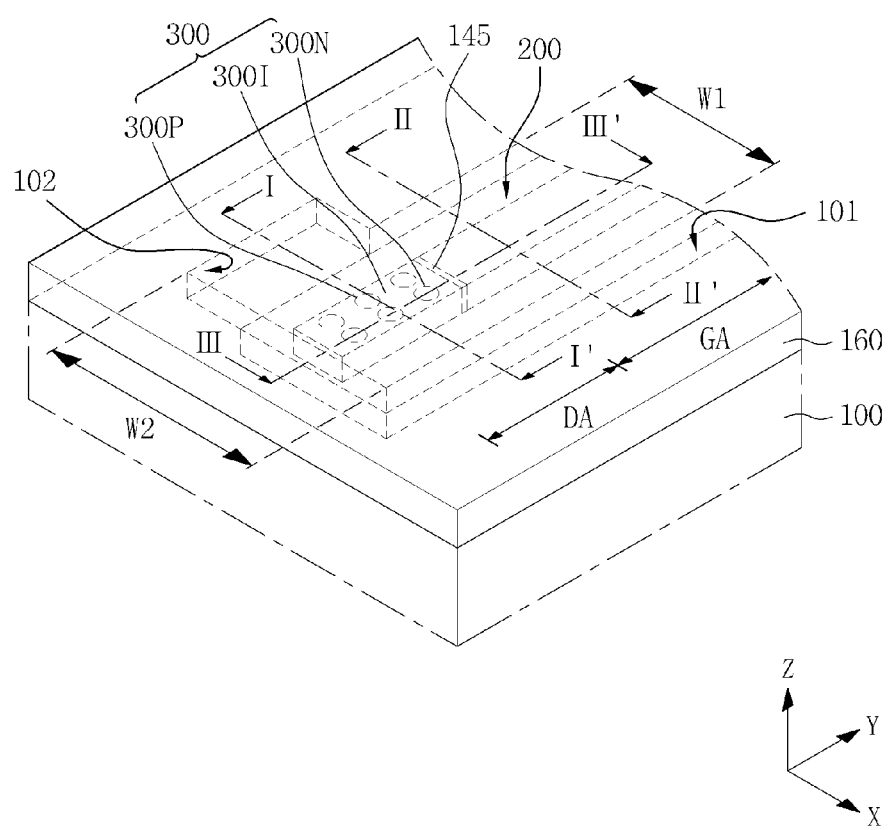
FIG. 1A is a perspective view of an optical input/output (I/O) device according to a first exemplary embodiment.

Various exemplary embodiments will now be described more fully with reference to the accompanying drawings in which some exemplary embodiments are shown. The inventive concept may, however, be embodied in different forms and should not be construed as limited to the exemplary embodiments set forth herein. Rather, these exemplary embodiments are provided so that this disclosure is thorough and complete and fully conveys the scope of the inventive concept to one skilled in the art.

In addition, like numbers refer to like element throughout. The drawings are not necessarily to scale, emphasis instead being placed upon clear illustrations. In the drawings, the thicknesses of layers and regions may be exaggerated for clarity. It will also be understood that when a layer is referred to as being "on" another layer or substrate, it can be directly on the other layer or substrate or intervening layers may also be present.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Exemplary Embodiment 1

Figure 1B:
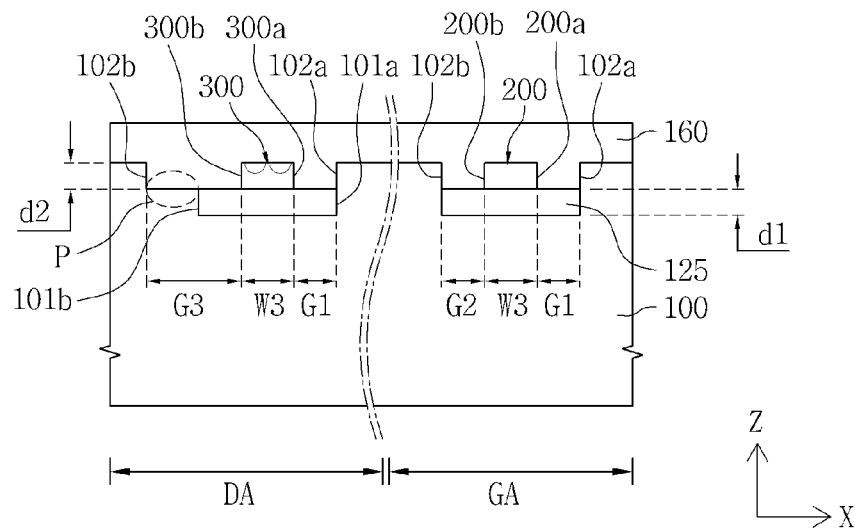
FIG. 1B is a cross-sectional view taken along lines I-I' and II-II' of FIG. 1A.
Figure 1C:
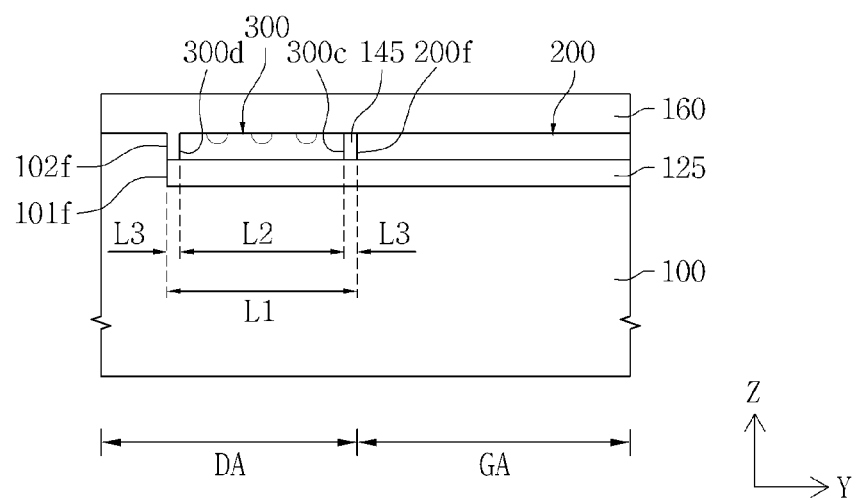
FIG. 1C is a cross-sectional view taken along line III-III' of FIG. 1A.

FIG. 1A is a perspective view of an optical input/output (I/O) device according to a first exemplary embodiment of the inventive concept, FIG. 1B is a cross-sectional view taken along lines I-I' and II-II' of FIG. 1A, and FIG. 1C is a cross-sectional view taken along line III-III' of FIG. 1A.

Referring to FIGS. 1A through 1C, the optical I/O device according to the first exemplary embodiment may include a substrate 100 including a first region GA and a second region DA, a waveguide 200 disposed in the first region GA of the substrate 100, a photodetector (PD) 300 disposed in the second region DA of the substrate 100, and a light-transmitting insulating layer 145 disposed between an end surface 200f of the waveguide 200 and a first end surface 300c of the PD 300.

The substrate 100 may be a bulk silicon wafer. The substrate 100 may include a lower trench 101 and an upper trench 102. The upper trench 102 may be disposed on the lower trench 101. The lower trench 101 and the upper trench 102 may run across the first region GA and the second region DA in a Y-axial direction.

A first sidewall 101a of the lower trench 101 may be vertically aligned with a first sidewall 102a of the upper trench 102. An end-portion sidewall 101f of the lower trench 101 may be vertically aligned with an end-portion sidewall 102f of the upper trench 102.

The lower trench 101 may have a first vertical depth d1. The upper trench 102 may have a second vertical depth d2. The second vertical depth d2 may be equal to the first vertical depth d1. Here, each of the first and second vertical depths d1 and d2 may refer to a z-axial straight length.

A horizontal width of the lower trench 101 disposed in the first region GA may be equal to a horizontal width of the lower trench 101 disposed in the second region DA. For example, the lower trench 101 may have a first horizontal width W1 in both the first and second regions GA and DA. Here, the horizontal width may refer to an x-axial straight length.

A lower cladding insulating layer 125 may be disposed within the lower trench 101. The lower cladding insulating layer 125 may cover a bottom surface of the lower trench 101. For example, the lower cladding insulating layer 125 may completely fill the lower trench 101. The lower cladding insulating layer 125 may have the same horizontal width and vertical length as the lower trench 101. For example, the lower cladding insulating layer 125 may have the first horizontal width W1 and the first vertical depth d1.

The lower cladding insulating layer 125 may have a lower refractive index than the substrate 100. The lower cladding insulating layer 125 may include a different material with respect to the substrate 100. The lower cladding insulating layer 125 may have a different etch selectivity with respect to the substrate 100. For example, the lower cladding insulating layer 125 may be one of a silicon oxide ($SiO_2$) layer, a silicon nitride (SiN) layer, and a stack structure thereof.

A horizontal width of the upper trench 102 disposed in the first region GA may be different from a horizontal width of the upper trench 102 disposed in the second region DA. For example, the upper trench 102 disposed in the first region GA may have the first horizontal width W1, while the upper trench 102 disposed in the second region DA may have a second horizontal width W2. The second horizontal width W2 may be greater than the first horizontal width W1.

A second sidewall 102b of the upper trench 102 may have a shape obtained by shifting a second sidewall 101b of the lower trench 101 in a minus (−) x-axial direction. The upper trench 102 may expose a seed region P adjacent to the second sidewall 102b of the lower trench 101 in the second region DA. The seed region P may be defined by the second region DA of the substrate 100 exposed by a bottom surface of the upper trench 102. A horizontal width of the seed region P may be equal to a value obtained by subtracting the first horizontal width W1 from the second horizontal width W2. Here, the minus (−) x-axial direction may be opposite to the x-axial direction.

A horizontal length of the lower trench 101 in the second region DA of the substrate 100 may be equal to a horizontal length of the upper trench 102 in the second region DA of the substrate 100. For example, the lower trench 101 and the upper trench 102 may have a first horizontal length L1. The seed region P may have the first horizontal length L1. Here, the horizontal length may refer to a y-axial straight length.

The waveguide 200 may be optically connected to the PD 300. For example, the end surface 200f of the waveguide 200 may be optically connected to the first end surface 300c of the PD 300. The end surface 200f of the waveguide 200 may be disposed in an end portion in a lengthwise direction of the waveguide 200. The end surface 200f of the waveguide 200 may be perpendicular to the lengthwise direction of the waveguide 200. The end surface 200f of the waveguide 200 may be a surface perpendicular to the y-axial direction and parallel to the z-axial direction. For example, the lengthwise direction of the waveguide 200 may be a horizontal direction, and the end surface 200f of the waveguide 200 may refer to a vertical sectional surface. The waveguide 200 and the PD 300 may be optically connected to each other according to a path through which the optical signal travels. The optical I/O device according to the first exemplary embodiment may be a butt-coupled-type optical I/O device.

The butt-coupled-type optical I/O device in which the PD is disposed on the path through which the optical signal travels may have a higher responsivity than an evanescent-type optical I/O device. Here, responsivity may refer to a ratio of an electrical output signal to an optical signal applied to the PD.

The waveguide 200 may include single crystalline silicon. The waveguide 200 may be disposed on the lower cladding insulating layer 125 in the first region GA. The waveguide 200 may be disposed within the upper trench 102 in the first region GA. For example, the waveguide 200 may have a third horizontal width W3 smaller than the first horizontal width W1 of the upper trench 102. The waveguide 200 may have a thickness equal to the second vertical depth d2. A top surface of the waveguide 200 may be at the same level as a top surface of the substrate 100.

Here, it is assumed that, in the optical I/O device according to the first exemplary embodiment, the top surface of the waveguide 200 is at the same level as the top surface of the substrate 100. However, the top surface of the waveguide 200 may be higher than the top surface of the substrate 100.

A first lateral surface 200a of the waveguide 200 may be spaced a first distance G1 apart from the first sidewall 102a of the upper trench 102. A second sidewall 200b of the waveguide 200 may be spaced a second distance G2 apart from the second sidewall 102b of the upper trench 102. The second distance G2 may be equal to the first distance G1. Here, each of the first and second distances G1 and G2 may refer to an x-axial straight distance.

The PD 300 may convert an optical signal into an electric signal, or an electric signal into an optical signal. For instance, the PD 300 may convert an optical signal transmitted through the waveguide 200 into an electric signal.

The PD 300 may include single crystalline Germanium (Ge). The PD 300 may be disposed on the lower cladding insulating layer 125 in the second region DA. The PD 300 may be disposed within the upper trench 102 of the second region DA. For example, the PD 300 may have the third horizontal width W3 like the waveguide 200. The PD 300 may have a thickness equal to the second vertical depth d2. A top surface of the PD 300 may be at the same level as the top surface of the substrate 100. The top surface of the PD 300 may be at the same level as the top surface of the waveguide 200.

The PD 300 may include a first lateral surface 300a disposed toward the first sidewall 102a of the upper trench 102, a second lateral surface 300b disposed toward the second sidewall 102b of the upper trench 102, a first end surface 300c disposed toward the end surface 200f of the waveguide 200, and a second end surface 300d disposed toward the end-portion sidewall 102f of the upper trench 102. The first end surface 300c of the PD 300 may face the end surface 200f of the waveguide 200. The second end surface 300d of the PD 300 may face the end-portion sidewall 102f of the upper trench 102.

The first lateral surface 300a of the PD 300 may be spaced the first distance G1 apart from the first sidewall 102a of the upper trench 102. A distance between the first lateral surface 300a of the PD 300 and the first sidewall 102a of the upper trench 102 may be equal to a distance between the first lateral surface 200a of the waveguide 200 and the first sidewall 102a of the upper trench 102.

The second lateral surface 300b of the PD 300 may be spaced a third distance G3 apart from the second sidewall 102b of the upper trench 102. The third distance G3 may be greater than the second distance G2. A distance between the second lateral surface 300b of the PD 300 and the second sidewall 102b of the upper trench 102 may be greater than a distance between the second lateral surface 200b of the waveguide 200 and the second sidewall 102b of the upper trench 102.

A horizontal length of the PD 300 in the second region DA may be smaller than the horizontal length of the upper trench 102 in the second region DA. For example, the PD 300 may have a second horizontal length L2 smaller than the first horizontal length L1.

The second end surface 300d of the PD 300 may be spaced apart from the end-portion sidewall 102f of the upper trench 102. For example, the second end surface 300d of the PD 300 may be spaced a distance equal to a third horizontal length L3 apart from the end-portion sidewall 102f of the upper trench 102.

The PD 300 may be free from crystal defects. The PD 300 may receive an optical signal, which does not pass through crystal defects, from the waveguide 200. The optical I/O device according to the first exemplary embodiment may have improved reliability.

The PD 300 may include a first doping region 300P, a second doping region 300N, and an intrinsic region 300I. The second doping region 300N may be spaced apart from the first doping region 300P. For example, the intrinsic region 300I may be disposed between the first doping region 300P and the second doping region 300N. The second doping region 300N may include impurities of a different conductivity from the first doping region 300P. For example, the first doping region 300P may include p-type impurities, while the second doping region 300N may include n-type impurities.

The light-transmitting insulating layer 145 may be disposed between the end surface 200f of the waveguide 200 and the first end surface 300c of the PD 300. The light-transmitting insulating layer 145 may include a first lateral surface contacting the end surface 200f of the waveguide 200, and a second lateral surface contacting the first end surface 300c of the PD 300. The light-transmitting insulating layer 145 may be disposed on the path through which the optical signal travels. The optical I/O device according to the first exemplary embodiment may be a butt-coupled-type optical I/O device having a relatively high responsivity. A reduction in transmission efficiency of the optical signal transmitted by the light-transmitting insulating layer 145 may be counterbalanced by the high responsivity of the butt-coupled-type optical I/O device. In other words, reliability degradation of the optical signal transmitted by the light-transmitting insulating layer 145 may be prevented.

The light-transmitting insulating layer 145 may have a different etch selectivity with respect to the substrate 100. The light-transmitting insulating layer 145 may include a different material with respect to the substrate 100. For example, the light-transmitting insulating layer 145 may be one of a silicon oxide layer, a silicon nitride layer, and a stack structure thereof. The light-transmitting insulating layer 145 may include the same material as the lower cladding insulating layer 125.

A horizontal length of the light-transmitting insulating layer 145 may be equal to a distance between the second end surface 300d of the PD 300 and the end-portion sidewall 102f of the upper trench 102. For example, the light-transmitting insulating layer 145 may have the third horizontal length L3. The third horizontal length L3 may range from about 0.5 nm to about 50 nm. When the third horizontal length L3 is less than about 0.5 nm, the PD 300 may develop crystal defects. When the third horizontal length L3 is more than about 50 nm, the waveguide 200 may be optically disconnected from the PD 300.

A difference between the first horizontal length L1 and the second horizontal length L2 may be equal to twice the third horizontal length L3. The light-transmitting insulating layer 145 and the PD 300 may be disposed within the upper trench 102 of the second region DA.

The optical I/O device according to the first exemplary embodiment may further include an upper cladding insulating layer 160 disposed on the waveguide 200 and the PD 300. The upper cladding insulating layer 160 may fill a space between the second end surface 300d of the PD 300 and the end-portion sidewall 102f of the upper trench 102.

The upper cladding insulating layer 160 may have a lower refractive index than the substrate 100. For example, the upper cladding insulating layer 160 may be one of a silicon oxide layer, a silicon nitride layer, and a stack structure thereof. The upper cladding insulating layer 160 may include the same material as the light-transmitting insulating layer 145.

Exemplary Embodiment 2

Figure 2A:
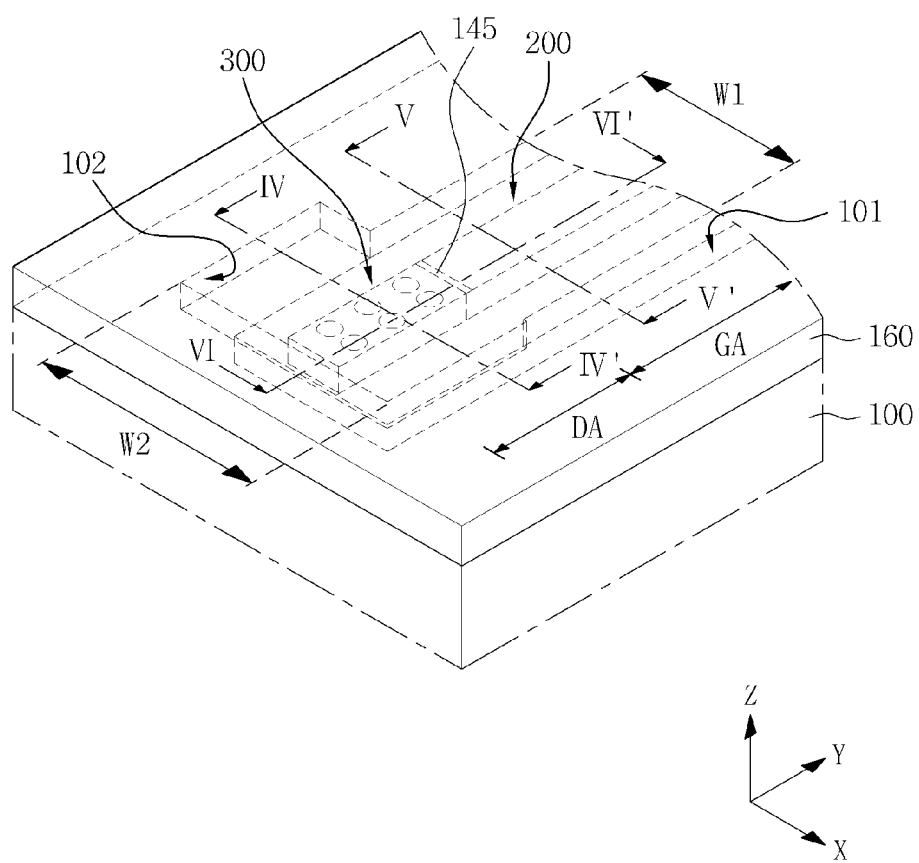
FIG. 2A is a perspective view of an optical I/O device according to a second exemplary embodiment.
Figure 2B:
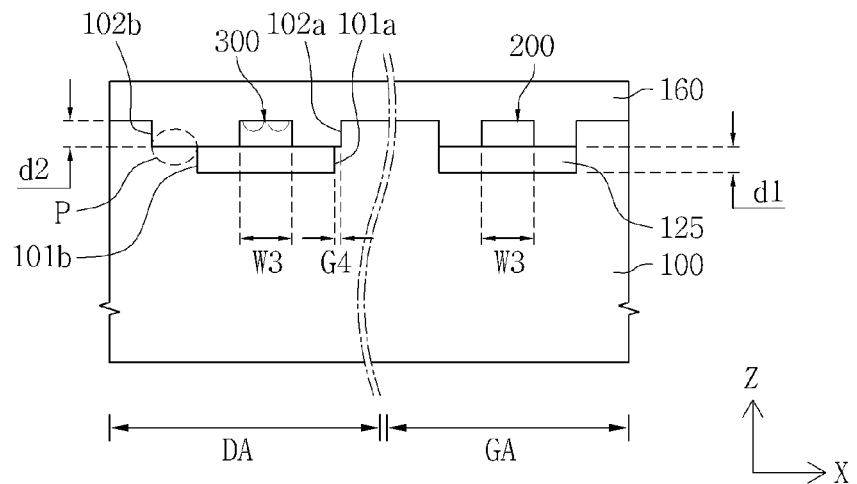
FIG. 2B is a cross-sectional view taken along lines IV-IV' and V-V' of FIG. 2A.
Figure 2C:
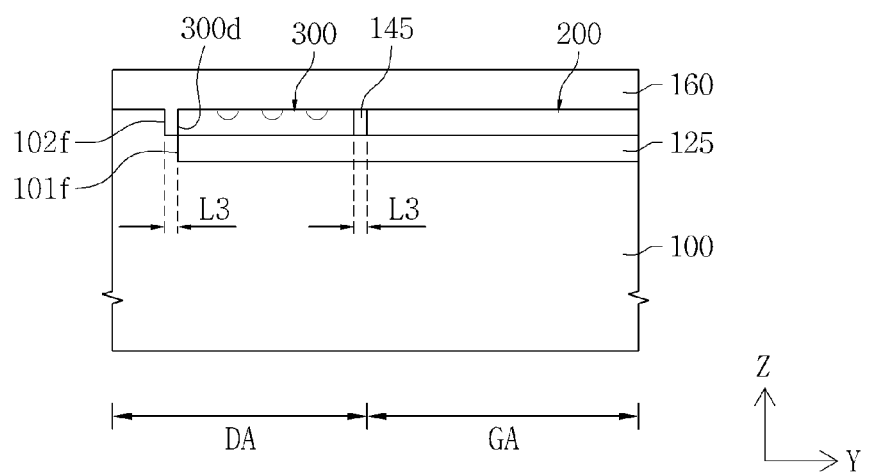
FIG. 2C is a cross-sectional view taken along line VI-VI' of FIG. 2A.

FIG. 2A is a perspective view of an optical I/O device according to a second exemplary embodiment of the inventive concept, FIG. 2B is a cross-sectional view taken along lines IV-IV' and V-V' of FIG. 2A, and FIG. 2C is a cross-sectional view taken along line VI-VI' of FIG. 2A.

Hereinafter, differences between the optical I/O devices according to the first and second exemplary embodiments will be chiefly described with reference to FIGS. 2A through 2C. Thus, a detailed description of components that are the same as or similar to the components of the optical I/O device according to the first exemplary embodiment will be omitted.

Referring to FIGS. 2A through 2C, the optical I/O device according to the second exemplary embodiment may include a substrate 100 including a lower trench 101 and an upper trench 102, a waveguide 200 disposed within the upper trench 102 of a first region GA of the substrate 100, a PD 300 disposed within the upper trench 102 of a second region DA of the substrate 100, and a light-transmitting insulating layer 145 interposed between the waveguide 200 and the PD 300.

A first sidewall 101a of the lower trench 101 may be arranged so as not to be vertically aligned with a first sidewall 102a of the upper trench 102. An end-portion sidewall 101f of the lower trench 101 may be arranged so as not to be vertically aligned with an end-portion sidewall 102f of the upper trench 102. The upper trench 102 may have a different horizontal length from the lower trench 101 in the second region DA.

For example, the first sidewall 102 of the upper trench 102 may be spaced a fourth distance G4 apart from the first sidewall 101a of the lower trench 101 in an x-axial direction. The fourth distance G4 may be equal to or less than a horizontal length of the light-transmitting insulating layer 145. For example, the fourth distance G4 may be equal to a third horizontal length L3. When the fourth distance G4 is greater than the horizontal length of the light-transmitting insulating layer 145, the PD 300 may develop crystal defects.

In addition, the end-portion sidewall 102f of the upper trench 102 may be spaced the third horizontal length L3 apart from the end-portion sidewall 101f of the lower trench 101 in a minus (−) y-axial direction. The upper trench 102 may have a horizontal length greater by the third horizontal length L3 than the lower trench 101 in the second region DA. A difference in horizontal length between the upper trench 102 and the lower trench 101 in the second region DA may be equal to the third horizontal length L3. Here, the minus (−) y-axial direction may be opposite to a y-axial direction.

Exemplary Embodiment 3

Figure 3A:
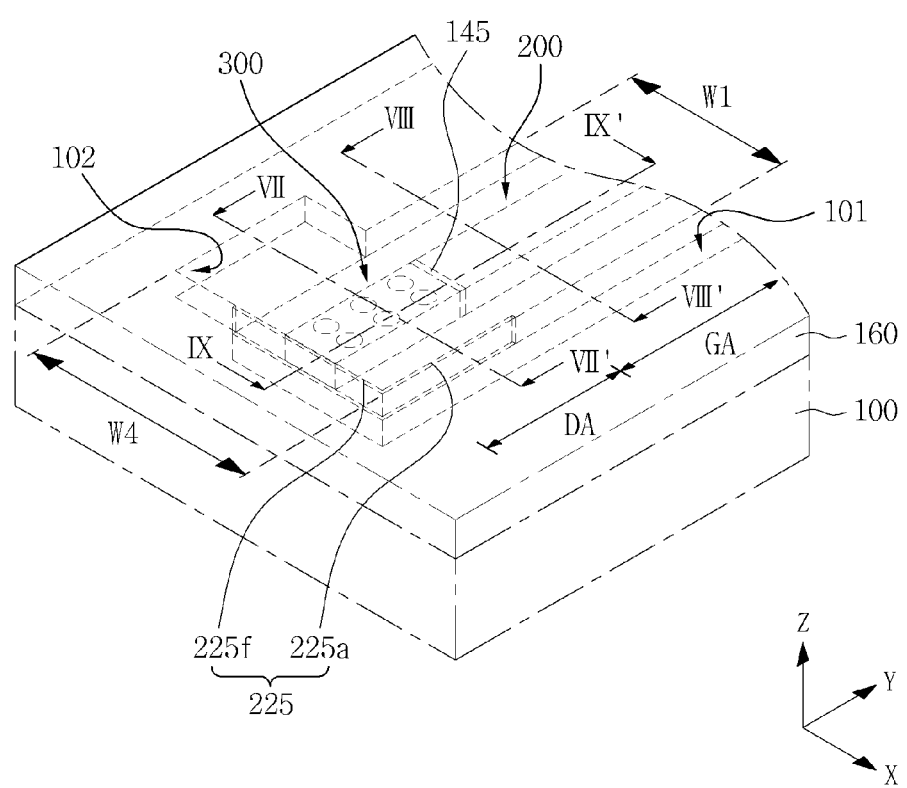
FIG. 3A is a perspective view of an optical I/O device according to a third exemplary embodiment.
Figure 3B:
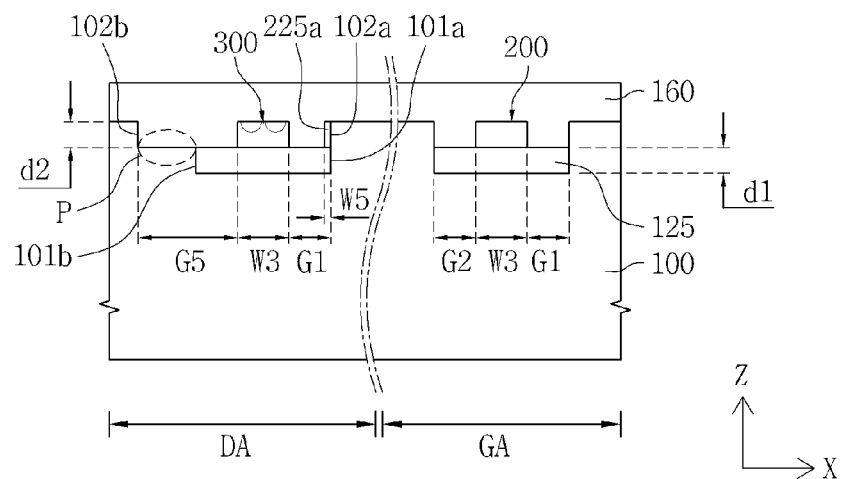
FIG. 3B is a cross-sectional view taken along lines VII-VII' and VIII-VIII' of FIG. 3A.
Figure 3C:
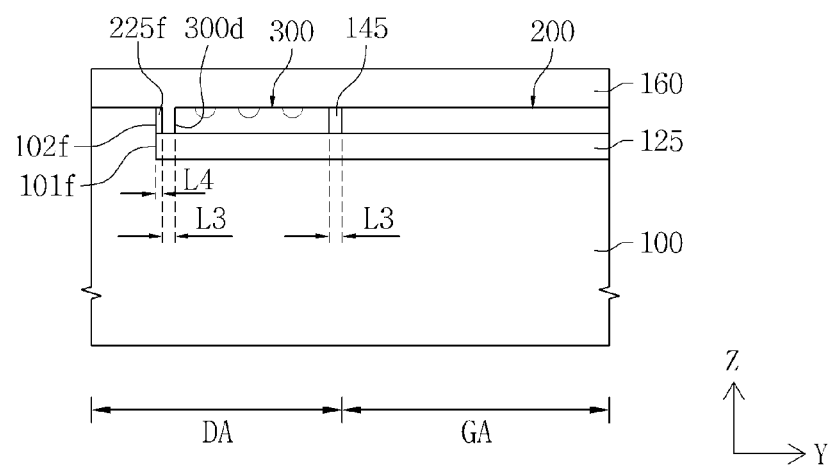
FIG. 3C is a cross-sectional view taken along line IX-IX' of FIG. 3A.

FIG. 3A is a perspective view of an optical I/O device according to a third exemplary embodiment, FIG. 3B is a cross-sectional view taken along lines VII-VII' and VIII-VIII' of FIG. 3A, and FIG. 3C is a cross-sectional view taken along line IX-IX' of FIG. 3A.

Hereinafter, differences between the optical I/O devices according to the first and third exemplary embodiments will be chiefly described with reference to FIGS. 3A through 3C. Thus, a detailed description of components that are the same as or similar to the components of the optical I/O device according to the first exemplary embodiment will be omitted.

Referring to FIGS. 3A through 3C, the optical I/O device according to the third exemplary embodiment may include a substrate 100 including a lower trench 101 and an upper trench 102, a waveguide 200 disposed within the upper trench 102 of a first region GA of the substrate 100, a PD 300 disposed within the upper trench 102 of a second region DA of the substrate 100, and a light-transmitting insulating layer 145 disposed between the waveguide 200 and the PD 300.

The optical I/O device according to the third exemplary embodiment may further include a silicon pattern 225 configured to cover a portion of a sidewall of the upper trench 102. For example, the silicon pattern 225 may include a first silicon pattern 225a covering the first sidewall 102a of the upper trench 102, and a second silicon pattern 225f covering a partial region of the end-portion sidewall 102f of the upper trench 102. The silicon pattern 225 may include the same material as the waveguide 200. For example, the silicon pattern 225 may include single crystalline silicon.

The first silicon pattern 225a may have a fifth horizontal width W5. The fifth horizontal width W5 may be less than a first distance G1. When the fifth horizontal width W5 is greater than the first distance G1, a region where the waveguide 200 is optically connected to the PD 300 may be reduced. When the fifth horizontal width W5 is greater than the first distance G1, transmission efficiency of an optical signal between the waveguide 200 and the PD 300 may be reduced.

A horizontal length of the first silicon pattern 225a may be equal to a horizontal length of the upper trench 102 disposed in the second region DA. The first silicon pattern 225a may be integrally formed with the second silicon pattern 225f. The first silicon pattern 225a and the second silicon pattern 225f may be provided such that there is no interface between the first silicon pattern 225a and the second silicon pattern 225f.

The second silicon pattern 225f may have the same horizontal width as the lower trench 101. For example, the second silicon pattern 225f may have the first horizontal width W1. The second silicon pattern 225f may be disposed such that there is no second silicon pattern 225f on the sidewall of the upper trench 102 connected to a seed region P.

The upper trench 102 may have a first horizontal width W1 in the first region GA, and a fourth horizontal width W4 in a partial region of the second region DA. The fourth horizontal width W4 may be greater than the first horizontal width W1. The partial region of the second region DA may be a region wherein the seed region P is exposed.

The second sidewall 102b of the upper trench 102 may be spaced a fifth distance G5 apart from the PD 300. The fifth distance G5 may be greater than the second distance G2.

The fourth horizontal width W4 may be different from the second horizontal width W2 of the optical I/O device according to the first exemplary embodiment. For example, the fourth horizontal width W4 may be greater by the fifth horizontal width W5 than the second horizontal width W2. The fifth distance G5 may be different from the third distance G3 of the optical I/O device according to the first exemplary embodiment. For example, the fifth distance G5 may be greater by the fifth horizontal width W5 than the third distance G3.

Exemplary Embodiment 4

Figure 4A:
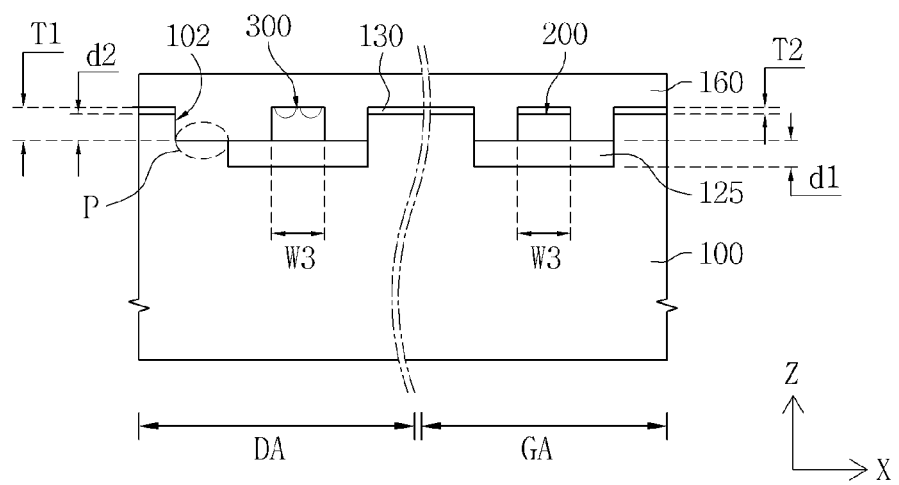
FIG. 4A is an x-axial cross-sectional view of an optical I/O device according to an exemplary fourth embodiment.
Figure 4B:
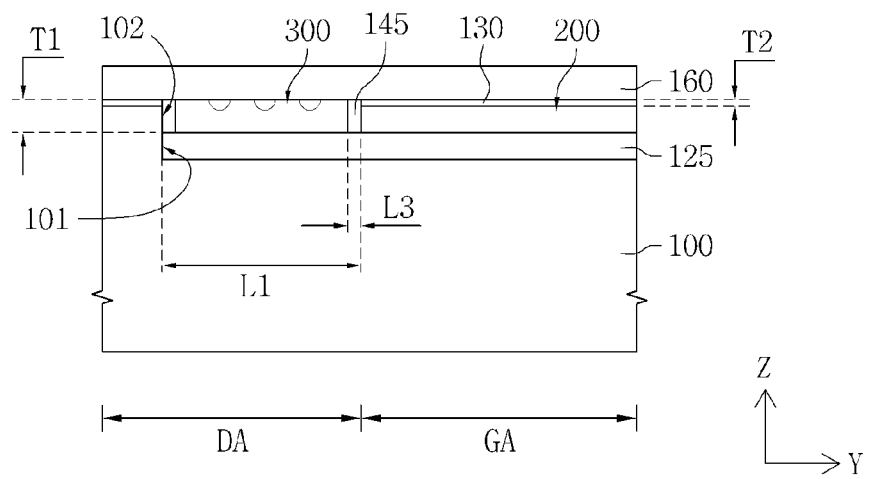
FIG. 4B is a y-axial cross-sectional view of the optical I/O device according to the fourth exemplary embodiment.

FIG. 4A is an x-axial cross-sectional view of an optical I/O device according to a fourth exemplary embodiment, and FIG. 4B is a y-axial cross-sectional view of the optical I/O device according to the fourth exemplary embodiment.

Hereinafter, differences between the optical I/O devices according to the first and fourth exemplary embodiments will be chiefly described with reference to FIGS. 4A and 4B. Thus, a detailed description of components that are the same as or similar to the components of the optical I/O device according to the first exemplary embodiment will be omitted.

Referring to FIGS. 4A and 4B, the optical I/O device according to the fourth exemplary embodiment may include a substrate 100, a waveguide 200 disposed in a first region GA of the substrate 100, a PD 300 disposed in a second region DA of the substrate 100, and a light-transmitting insulating layer 145 interposed between the waveguide 200 and the PD 300.

The PD 300 may have a first vertical thickness T1. The first vertical thickness T1 may be greater than a second vertical depth d2 of an upper trench 102. The PD 300 may have a greater thickness than the waveguide 200. As compared with a method of fabricating the optical I/O device according to the first exemplary embodiment, a process of recessing a germanium pattern may be omitted from the method of fabricating the optical I/O device according to the fourth exemplary embodiment.

A capping layer 130 may be disposed on a top surface of the substrate 100 and a top surface of the waveguide 200. The capping layer 130 may have a second vertical thickness T2. The second vertical thickness T2 may be equal to a value obtained by subtracting the second vertical depth d2 from the first vertical thickness T1. Here, each of the first vertical thickness T1 and the second vertical thickness T2 may refer to a z-axial straight length.

Exemplary Embodiment 5

Figure 5A:
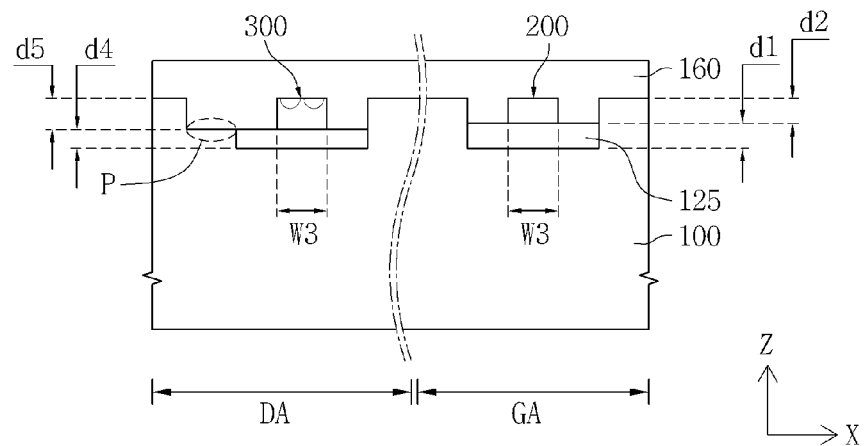
FIG. 5A is an x-axial cross-sectional view of an optical I/O device according to a fifth exemplary embodiment.
Figure 5B:
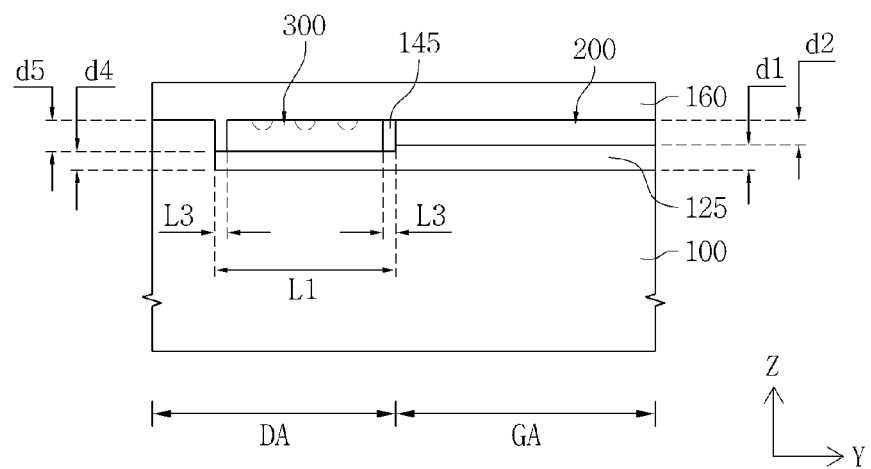
FIG. 5B is a y-axial cross-sectional view of the optical I/O device according to the fifth exemplary embodiment.

FIG. 5A is an x-axial cross-sectional view of an optical I/O device according to a fifth exemplary embodiment, and FIG. 5B is a y-axial cross-sectional view of the optical I/O device according to the fifth exemplary embodiment.

Hereinafter, differences between the optical I/O devices according to the first and fifth exemplary embodiments will be chiefly described with reference to FIGS. 5A and 5B. Thus, a detailed description of components that are the same as or similar to the components of the optical I/O device according to the first exemplary embodiment will be omitted.

Referring to FIGS. 5A and 5B, the optical I/O device according to the fifth exemplary embodiment may include a substrate 100, a waveguide 200 disposed in a first region GA of the substrate 100, a PD 300 disposed in a second region DA of the substrate 100, and a light-transmitting insulating layer 145 interposed between the waveguide 200 and the PD 300.

The substrate 100 may include a lower trench 101 and an upper trench 102. The lower trench 101 may have different vertical depths in the first region GA and the second region DA. For example, the lower trench 101 may have a vertical depth d1 in the first region GA, and a fourth vertical depth d2 in the second region DA. The fourth vertical depth d4 may be less than the first vertical depth d1. The lower trench 101 may have a smaller vertical depth in the second region DA than in the first region GA.

A lower cladding insulating layer 125 may be disposed within the lower trench 101. Thus, the lower cladding insulating layer 125 may have different vertical thicknesses in the first region GA and the second region DA. For example, the lower cladding insulating layer 125 may have a vertical thickness equal to the first vertical depth d1 in the first region GA, and a vertical thickness equal to the fourth vertical depth d4 in the second region DA. The lower cladding insulating layer 125 may have a smaller vertical thickness in the second region DA than in the first region GA.

The upper trench 102 may have different vertical depths in the first region GA and the second region DA. For example, the upper trench 102 may have a second vertical depth d2 in the first region GA, and a fifth vertical depth d5 in the second region DA. The fifth vertical depth d5 may be greater than the second vertical depth d2. The upper trench 102 may have a greater vertical depth in the second region DA than in the first region GA. The sum of the first and second vertical depths d1 and d2 may be equal to the sum of the fourth and fifth vertical depths d4 and d5.

A top surface of the waveguide 200 may be at the same level as a top surface of the PD 300. The waveguide 200 and the PD 300 may have different vertical thicknesses. For example, the waveguide 200 may have a vertical thickness equal to the second vertical depth d2, while the PD 300 may have a vertical thickness equal to the fifth vertical depth d5. The PD 300 may have a greater vertical thickness than the waveguide 200.

The light-transmitting insulating layer 145 may have the same vertical thickness as the PD 300. For example, the light-transmitting insulating layer 145 may have a vertical thickness equal to the fifth vertical depth d5.

Exemplary Embodiment 6

Figure 6A:
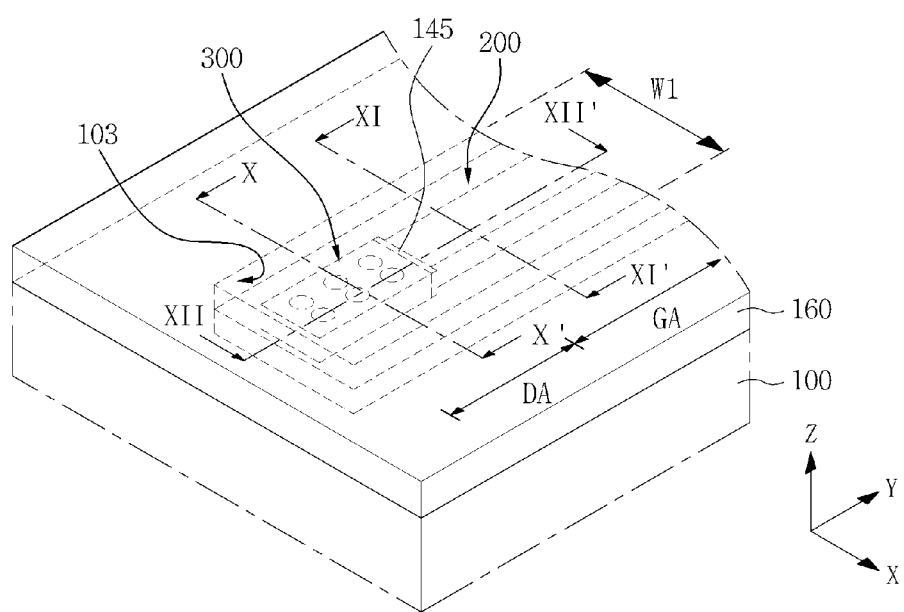
FIG. 6A is a perspective view of an optical I/O device according to a sixth exemplary embodiment.
Figure 6B:
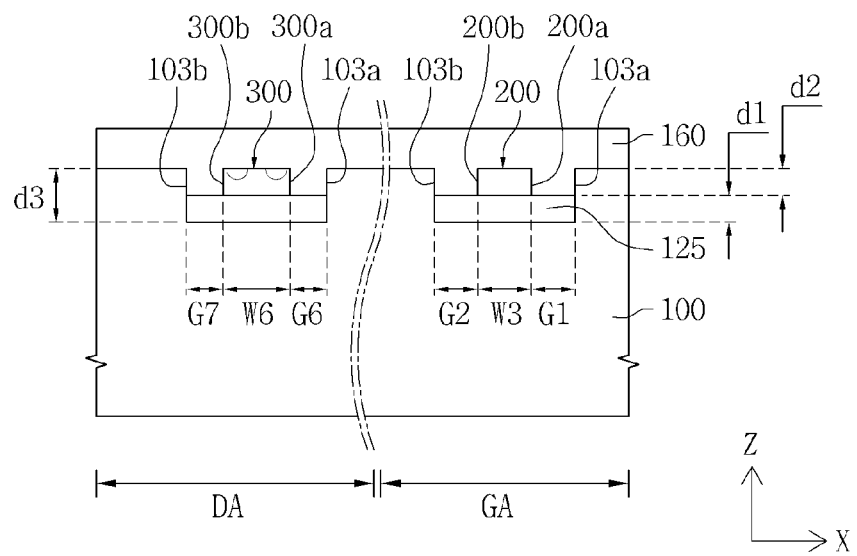
FIG. 6B is a cross-sectional view taken along lines X-X' and XI-XI' of FIG. 6A.
Figure 6C:
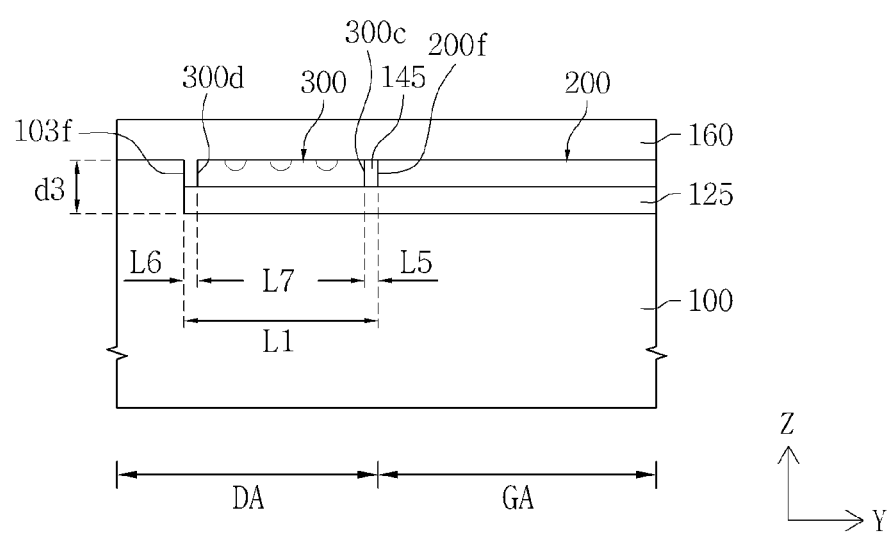
FIG. 6C is a cross-sectional view taken along line XII-XII' of FIG. 6A.

FIG. 6A is a perspective view of an optical I/O device according to a sixth exemplary embodiment, FIG. 6B is a cross-sectional view taken along lines X-X' and XI-XI' of FIG. 6A, and FIG. 6C is a cross-sectional view taken along line XII-XII' of FIG. 6A.

Hereinafter, differences between the optical I/O devices according to the first and sixth exemplary embodiments will be chiefly described with reference to FIGS. 6A through 6C. Thus, a detailed description of components that are the same as or similar to the components of the optical I/O device according to the first exemplary embodiment will be omitted.

Referring to FIGS. 6A through 6C, the optical I/O device according to the sixth exemplary embodiment may include a substrate 100 including a first region GA and a second region DA, a waveguide 200 disposed in the first region GA of the substrate 100, a PD 300 disposed in the second region DA of the substrate 100, and a light-transmitting insulating layer 145 interposed between the waveguide 200 and the PD 300.

The substrate 100 may include a first trench 103 having a first horizontal width W1 and a third vertical depth d3. A lower cladding insulating layer 125 having the first horizontal width W1 and a vertical depth d1 may be disposed within the first trench 103. The third vertical depth d3 may be greater than the first vertical depth d1. The difference between the third vertical depth d3 and the first vertical depth d1 may be defined as a second vertical depth d2.

The first trench 103 may have the same horizontal length as the lower trench 101 and the upper trench 102 of the light I/O device according to the first exemplary embodiment of the inventive concept. For example, the first trench 103 may have a first horizontal length L1.

The waveguide 200 may be disposed on the lower cladding insulating layer 125 in the first region GA. A first lateral surface 200a of the waveguide 200 may be spaced a first distance G1 apart from a first sidewall 103a of the first trench 103. A second sidewall 200b of the waveguide 200 may be spaced a second distance G2 apart from a second sidewall 103b of the first trench 103. The first distance G1 may be equal to the second distance G2.

The PD 300 may be disposed on the lower cladding insulating layer 125 in the second region DA. The PD 300 may have a different horizontal width from the waveguide 200. For example, the waveguide 200 may have a third horizontal width W3, and the PD 300 may have a sixth horizontal width W6. The sixth horizontal width W6 may be greater than the third horizontal width W3. The PD 300 may have a greater horizontal width than the waveguide 200.

The PD 300 may include a first sidewall 300a disposed toward the first sidewall 103a of the first trench 103, a second sidewall 300b disposed toward the second sidewall 103b of the first trench 103, a first end surface 300c disposed toward an end surface 200f of the waveguide 200, and a second end surface 300d disposed toward an end-portion sidewall 103f of the first trench 103.

The first lateral surface 300a of the PD 300 may be spaced a sixth distance G6 apart from the first sidewall 103a of the first trench 103. The second lateral surface 300b of the PD 300 may be spaced a seventh distance G7 apart from the second sidewall 103b of the first trench 103. The sixth distance G6 may be equal to the seventh distance G7. The sixth distance G6 may be smaller than the first distance G1. The seventh distance G7 may be smaller than the second distance G2.

A distance between the first end surface 300c of the PD 300 and the end surface 200f of the waveguide 200 may correspond to a fifth horizontal length L5. The light-transmitting insulating layer 145 may have the fifth horizontal length L5.

The light-transmitting insulating layer 145 of the light I/O device according to the sixth exemplary embodiment may have a different horizontal length from the light-transmitting insulating layer 145 according to the first exemplary embodiment. The fifth horizontal length L5 may be different from the third horizontal length L3.

A distance between the second end surface 300d of the PD 300 and the end-portion sidewall 103f of the first trench 103 may be a sixth horizontal length L6. The sixth horizontal length L6 may be different from the fifth horizontal length L5.

The PD 300 may have a seventh horizontal length L7. The seventh horizontal length L7 may be smaller than the first horizontal length L1. The PD 300 of the optical I/O device according to the sixth exemplary embodiment may have a different horizontal length from the PD 300 of the optical I/O device according to the first exemplary embodiment. The seventh horizontal length L7 may be different from the second horizontal length L2.

The sum of the fifth horizontal length L5, the sixth horizontal length L6, and the seventh horizontal length L7 may be equal to the first horizontal length L1.

Exemplary Embodiment 7

FIGS. 7A through 30A are x-axial cross-sectional views illustrating a method of fabricating the optical I/O device shown in FIGS. 1A through 1C, and FIGS. 7B through 30B are y-axial cross-sectional views illustrating the method of fabricating the optical I/O device shown in FIGS. 1A through 1C, according to a seventh exemplary embodiment.

Figure 7A:
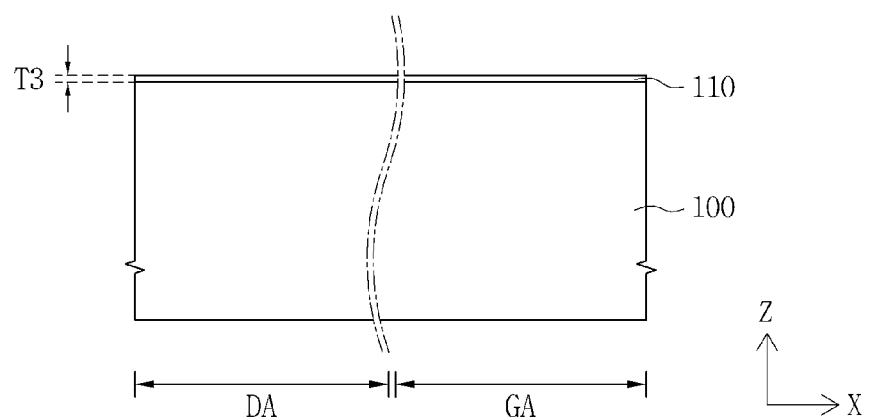
Figure 7B:
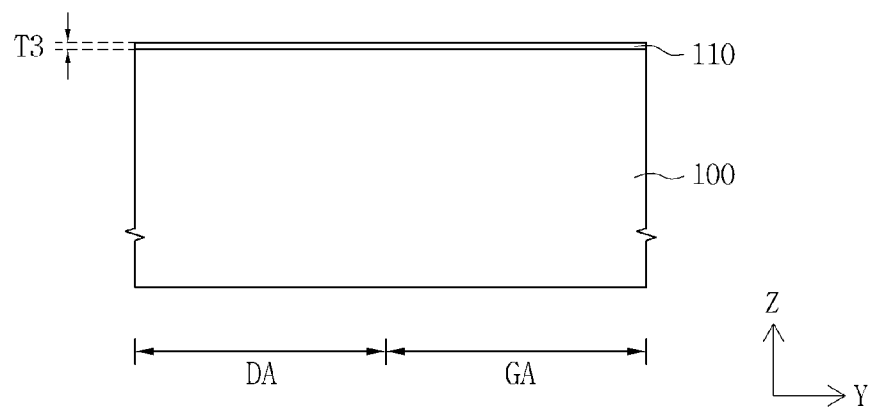

Hereinafter, the method of fabricating the optical I/O device shown in FIGS. 1A through 1C according to the seventh exemplary embodiment will be described with reference to FIGS. 1A through 1C, 7A through 30A, and 7B through 30B. To begin with, the method of fabricating the optical I/O device shown in FIGS. 1A through 1C may include preparing a substrate 100 including a first region GA and a second region DA as shown in FIGS. 7A and 7B.

Thereafter, the method of fabricating the optical I/O device shown in FIGS. 1A through 1C may include forming a first insulating layer 110 having a third vertical thickness T3 on the substrate 100.

The formation of the first insulating layer 110 may include a thermal oxidation process or a chemical vapor deposition (CVD) process. The first insulating layer 110 may have a different etch selectivity with respect to the substrate 100. The first insulating layer 110 may include a different material with respect to the substrate 100. For example, the first insulating layer 110 may be one of a silicon oxide layer, a silicon nitride layer, a silicon oxynitride (SiON) layer, and a stack structure thereof.

Figure 8A:
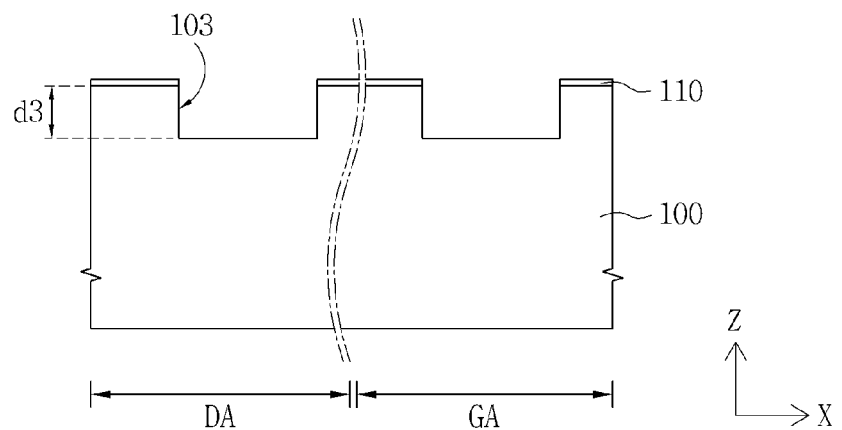
Figure 8B:
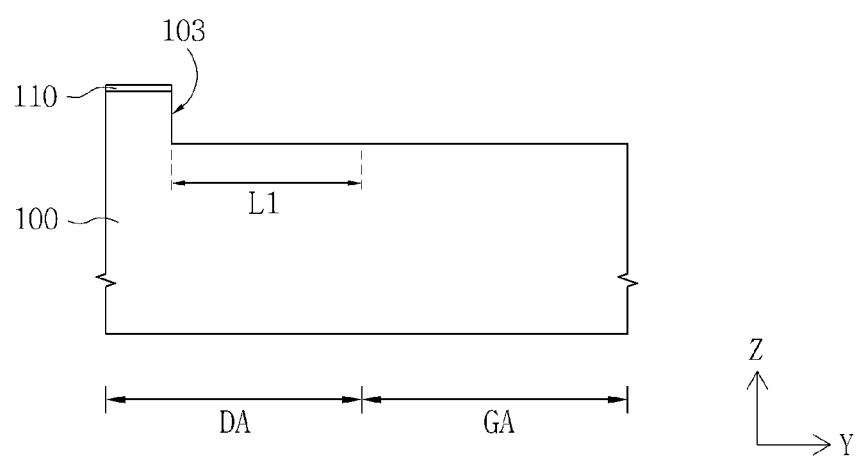

Next, the method of fabricating the optical I/O device shown in FIGS. 1A through 1C may include forming a first trench 103 having a first horizontal width W1 in the substrate 100 as shown in FIGS. 8A and 8B.

The formation of the first trench 103 may include etching the first insulating layer 110 and the substrate 100 disposed in the first region GA and the second region DA. The first trench 103 may run across the first region GA and the second region DA in the y-axial direction. The first trench 103 may have a third vertical depth d3 from a top surface of the substrate 100. The first trench 103 may have a first horizontal length L1 in the second region DA.

Figure 9A:
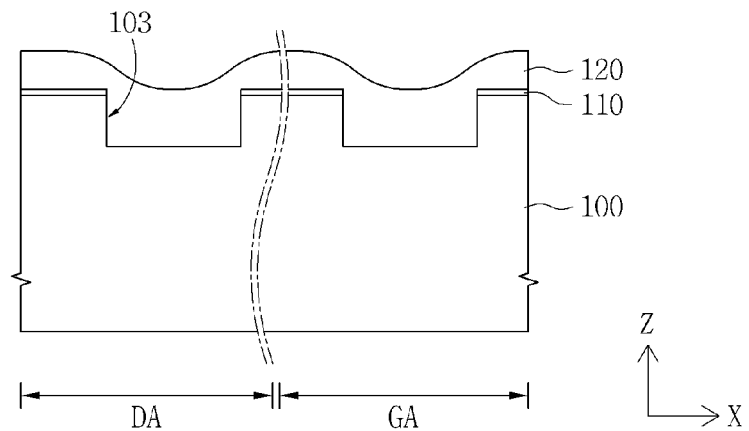
Figure 9B:
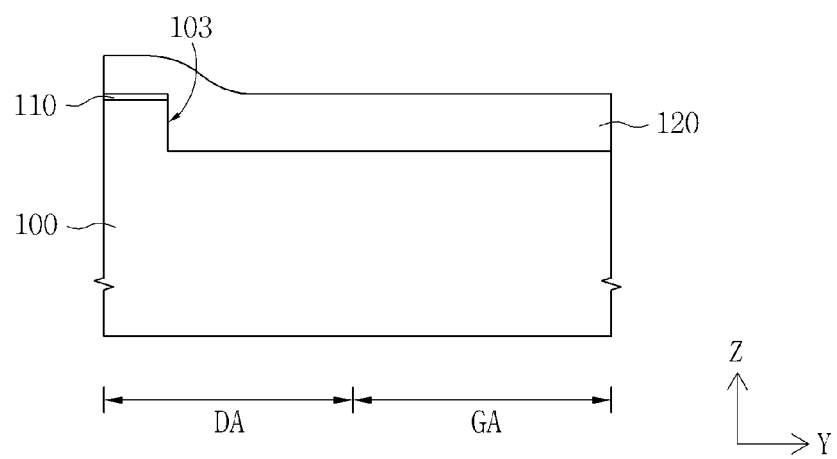

Afterwards, as shown in FIGS. 9A and 9B, the method of fabricating the optical I/O device shown in FIGS. 1A through 1C may include forming a second insulating layer 120 on the substrate 100 to fill the first trench 103.

The formation of the second insulating layer 120 may include a CVD process. The second insulating layer 120 may have a different etch selectivity with respect to the first insulating layer 110. The second insulating layer 120 may include a different material with respect to the first insulating layer 110. For example, the first insulating layer 110 may include a silicon nitride layer, while the second insulating layer 120 may include a silicon oxide layer.

Figure 10A:
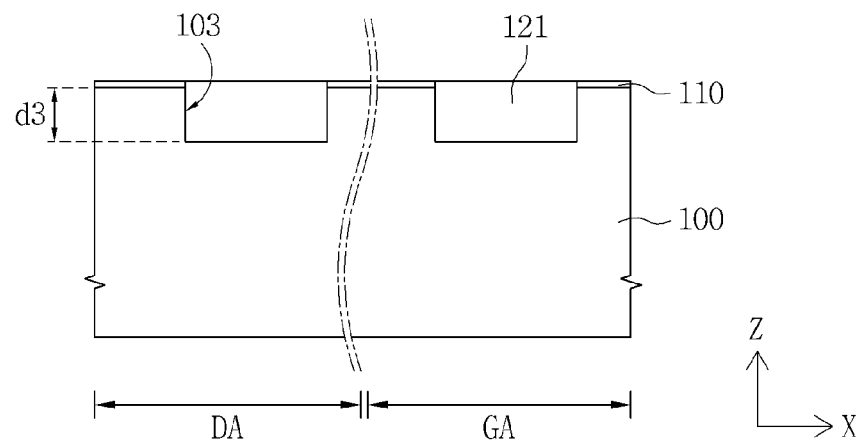
Figure 10B:
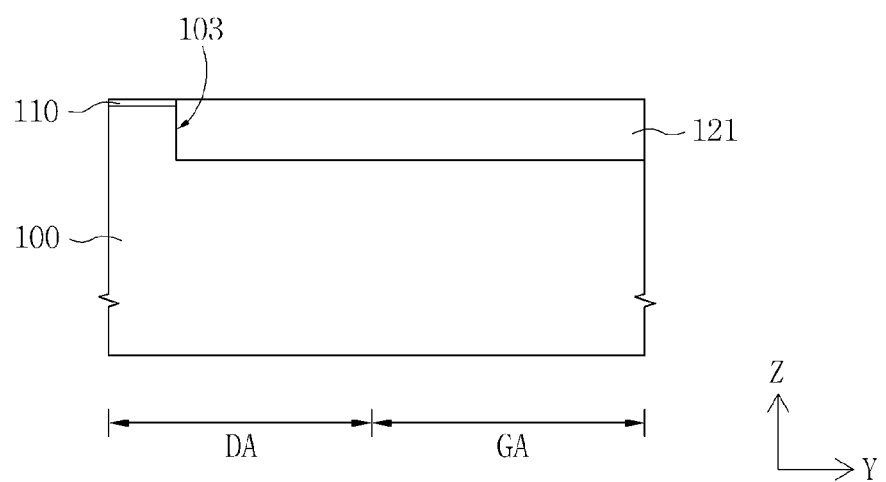

Thereafter, as shown in FIGS. 10A and 10B, the method of fabricating the optical I/O device shown in FIGS. 1A through 1C may include forming a first insulating pattern 121 to fill the first trench 103.

The formation of the first insulating pattern 121 may include planarizing the second insulating layer 120 to expose a top surface of the first insulating layer 110. The planarization of the second insulating layer 120 may include a chemical mechanical polishing (CMP) process. In this case, the first insulating layer 110 may be used as a polishing stopper.

Figure 11A:
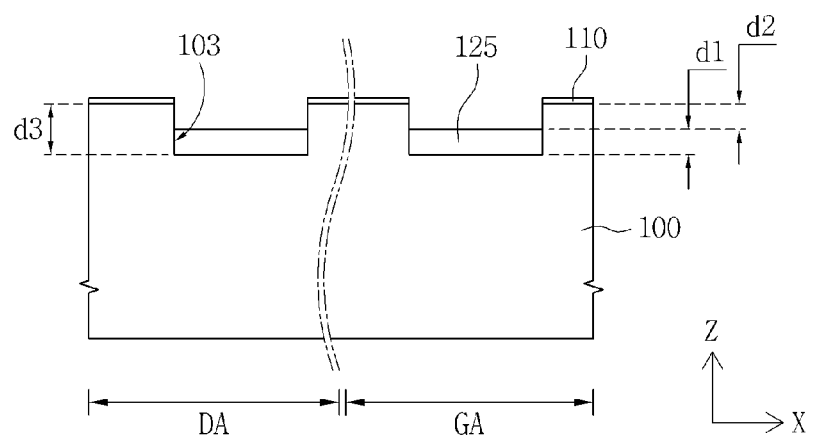
Figure 11B:
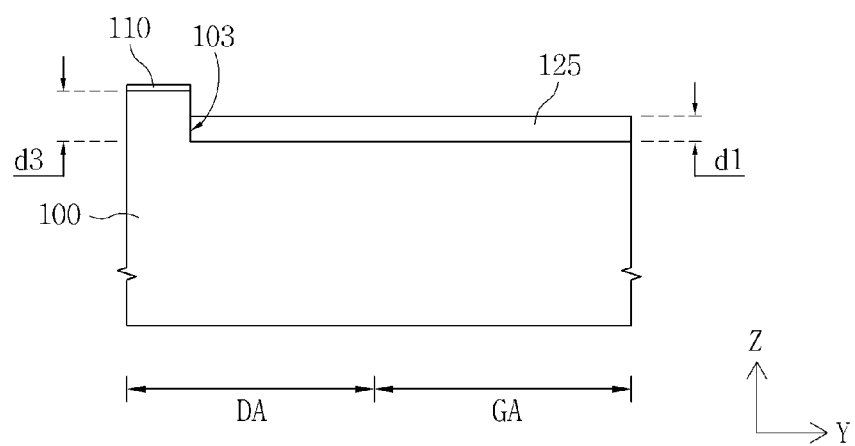

Next, as shown in FIGS. 11A and 11B, the method of fabricating the optical I/O device shown in FIGS. 1A through 1C may include forming a lower cladding insulating layer 125 to cover a bottom surface of the first trench 103.

The formation of the lower cladding insulating layer 125 may include recessing the first insulating pattern 121. The recessing of the first insulating pattern 121 may include recessing the first insulating pattern 121 to a second vertical depth d2. Thus, the lower cladding insulating layer 125 may have a vertical thickness equal to a first vertical depth d1. The first vertical depth d1 may be equal to the second vertical depth d2. The first vertical depth d1 may be a value obtained by subtracting the second vertical depth d2 from the third vertical depth d3.

Figure 12A:
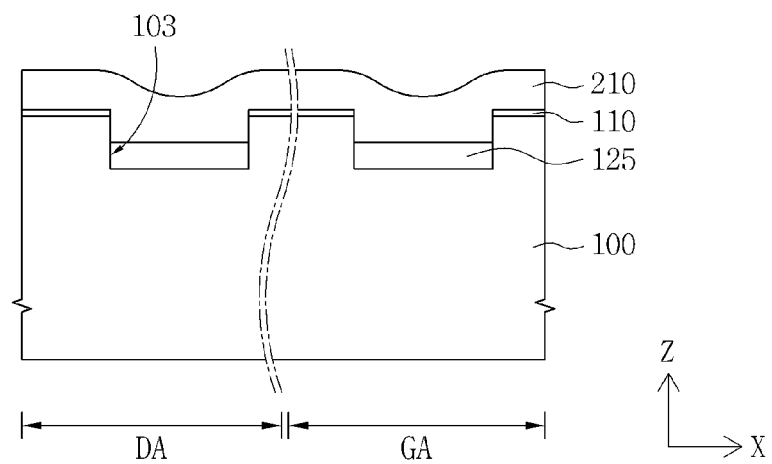
Figure 12B:
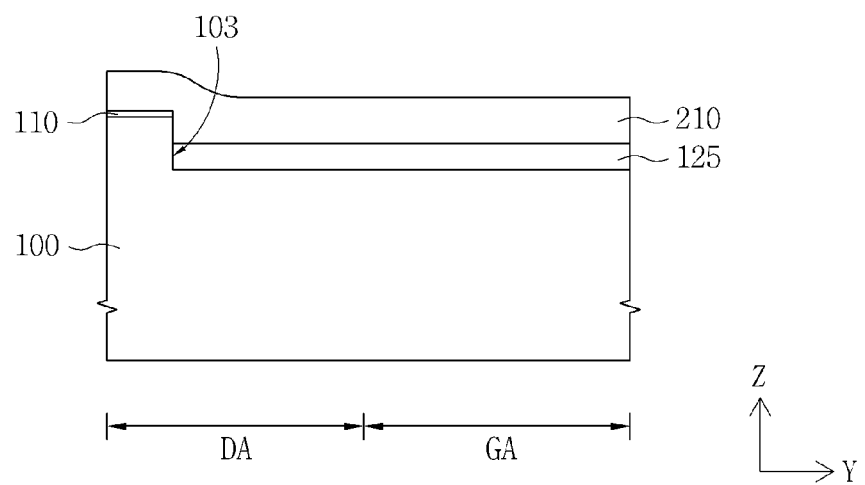

Subsequently, as shown in FIGS. 12A and 12B, the method of fabricating the optical I/O device shown in FIGS. 1A through 1C may include forming a first silicon layer 210 to fill the first trench 103.

The formation of the first silicon layer 210 may include forming an amorphous silicon (a-Si) layer to fill the first trench 103. The formation of the first silicon layer 210 may include a CVD process.

Figure 13A:
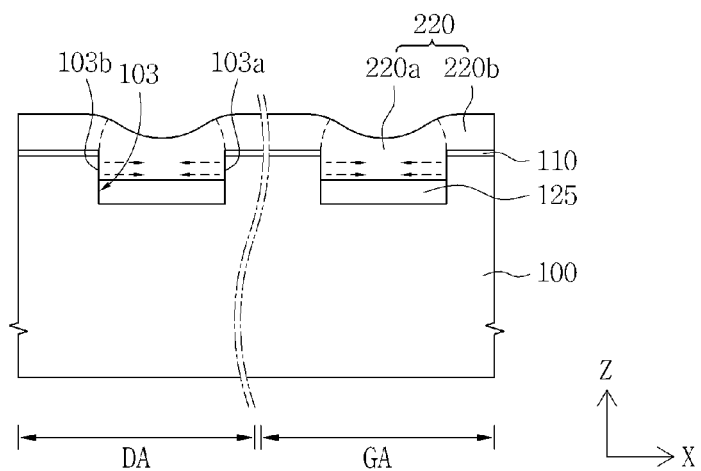
Figure 13B:
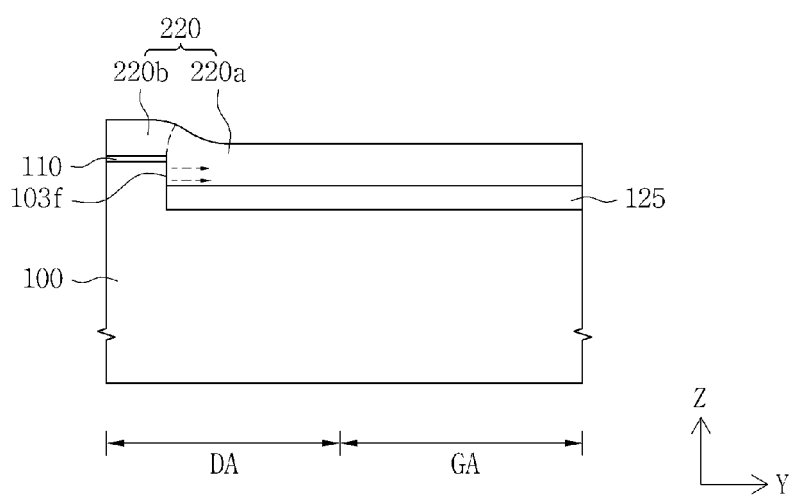

Afterwards, as shown in FIGS. 13A and 13B, the method of fabricating the optical I/O device shown in FIGS. 1A through 1C may include crystallizing the first silicon layer 210 to form a second silicon layer 220.

The formation of the second silicon layer 220 may include crystallizing the first silicon layer 210 using a rapid thermal annealing (RTA) process or a laser crystallization process. The laser crystallization process may include a laser-induced lateral epitaxial growth (LEG) process. In this case, the substrate 10 disposed on a first sidewall 103a, a second sidewall 103b, and an end-portion sidewall 103f of the first trench 103 may function as a crystallization seed.

Specifically, the formation of the second silicon layer 220 may include crystallizing a portion of the first silicon layer 210 using the substrate 100 disposed on the first sidewall 103a, the second sidewall 103b, and the end-portion sidewall 103f of the first trench 103 as the crystallization seed. In this case, the first silicon layer 210 disposed on the first insulating layer 110 may be crystallized without crystallization seeds. Thus, the second silicon layer 220 may include a single crystallization silicon region 220a and a polycrystalline silicon (poly-Si) region 220b. The single crystallization silicon region 220a may be disposed in and on the first trench 103. The poly-Si region 220b may be disposed on the first insulating layer 110.

Figure 14A:
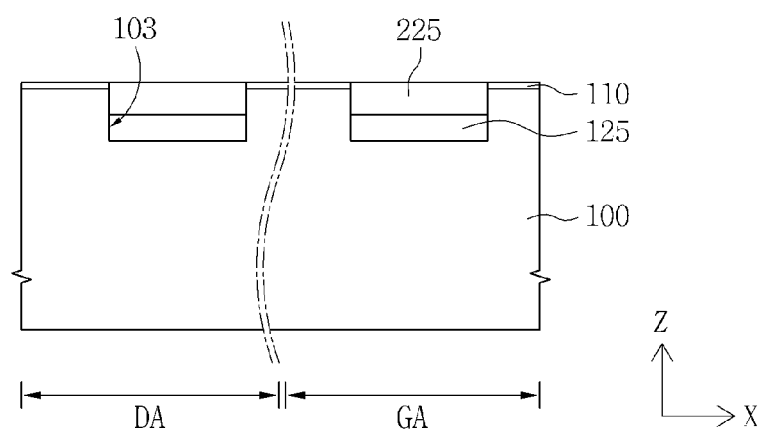
Figure 14B:
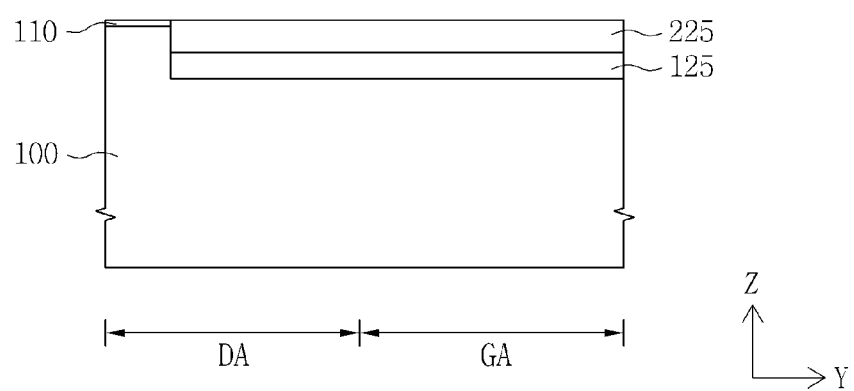

Next, as shown in FIGS. 14A and 14B, the method of fabricating the optical I/O device shown in FIGS. 1A through 1C may include forming a silicon pattern 225 to fill the first trench 103.

The formation of the silicon pattern 225 may include planarizing the second silicon layer 220 to expose the top surface of the first insulating layer 110. Thus, the silicon pattern 225 may include single crystalline silicon. The planarization of the second silicon layer 220 may include a CMP process. In this case, the first insulating layer 110 may be used as a polishing stopper.

Figure 15A:
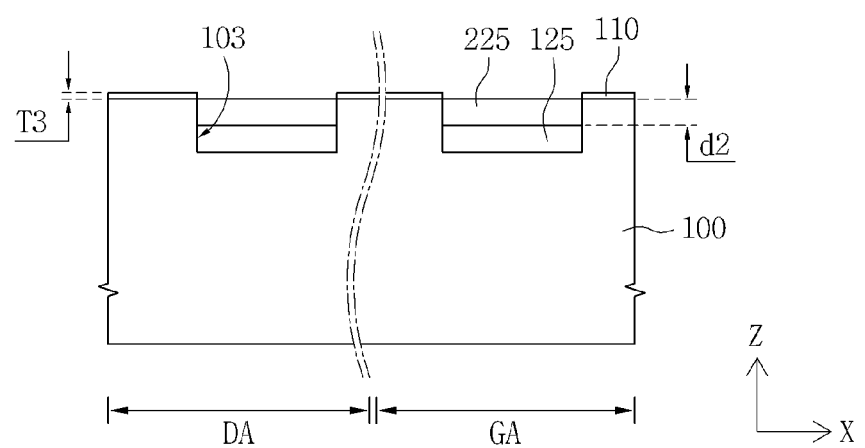
Figure 15B:
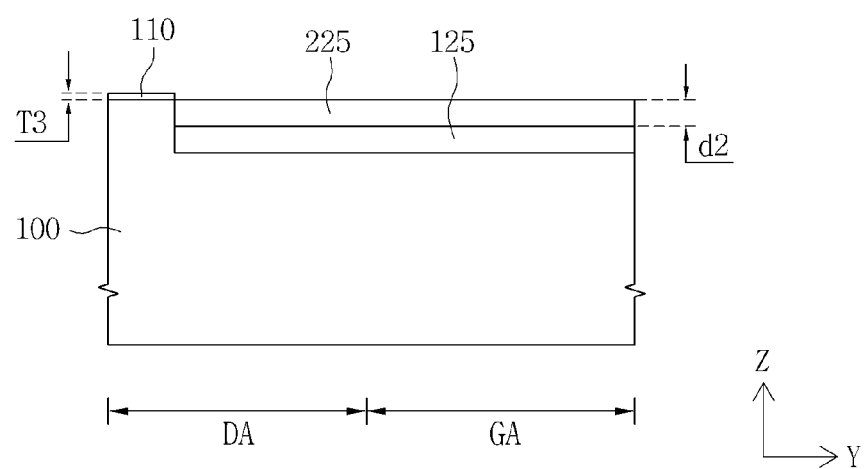

Subsequently, as shown in FIGS. 15A and 15B, the method of fabricating the optical I/O device shown in FIGS. 1A through 1C may include recessing the silicon pattern 225.

The recessing of the silicon pattern 225 may include recessing a top surface of the silicon pattern 225 to a depth equal to the third vertical thickness T3. Thus, the top surface of the silicon pattern 225 may be at the same level as the top surface of the substrate 100. The silicon pattern 225 may have a vertical thickness equal to the second vertical depth d2.

Here, the method of fabricating the optical I/O device shown in FIGS. 1A through 1C may include recessing the resultant structure until a top surface of a waveguide 200 is lower than the top surface of the substrate 100.

Figure 16A:
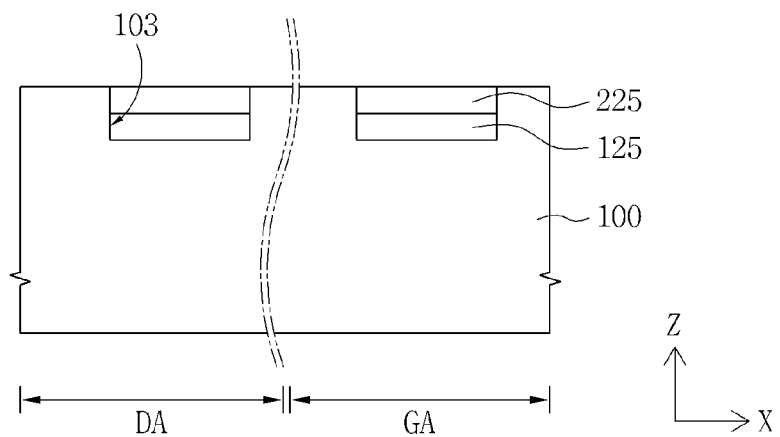
Figure 16B:
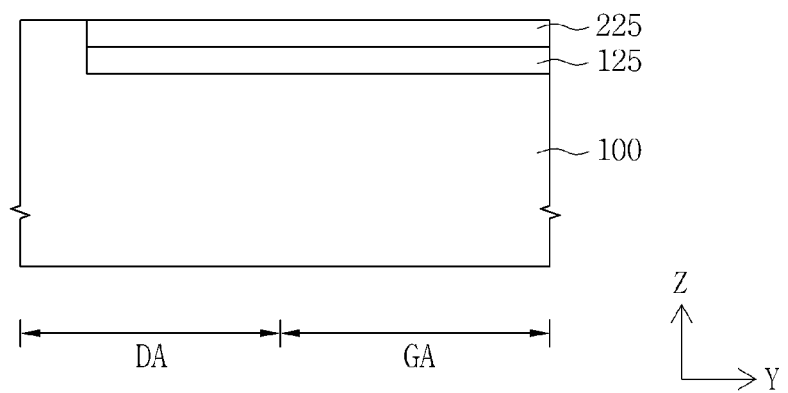

Thereafter, as shown in FIGS. 16A and 16B, the method of fabricating the optical I/O device shown in FIGS. 1A through 1C may include removing the first insulating layer 110 from the substrate 100.

Here, another example of a method of fabricating the optical I/O device shown in FIGS. 1A through 1C may include primarily planarizing the silicon pattern 225, removing the first insulating layer 110, and secondarily planarizing the silicon pattern 225.

Another example of a method of fabricating the optical I/O device shown in FIGS. 1A through 1C may include planarizing the silicon pattern 225 to expose a top surface of the substrate 100. Thus, another example of a method of fabricating the optical I/O device shown in FIGS. 1A through 1C may include simultaneously performing a process of planarizing the silicon pattern 225, a process of recessing the silicon pattern 225, and a process of removing the first insulating layer 110.

Figure 17A:
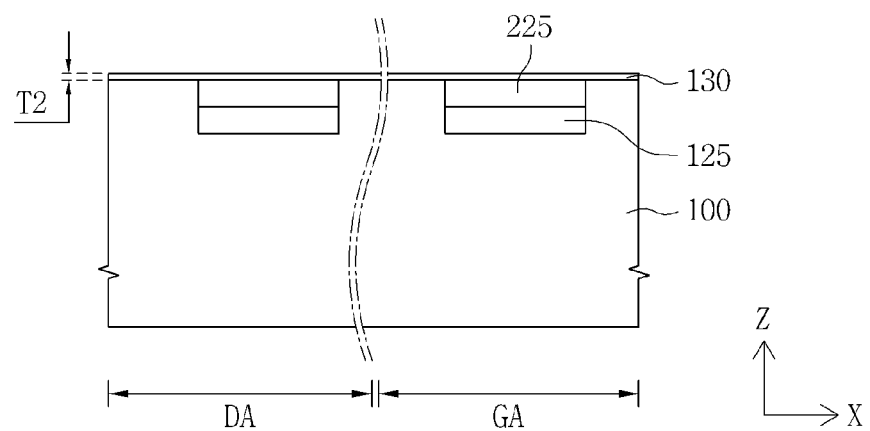
Figure 17B:
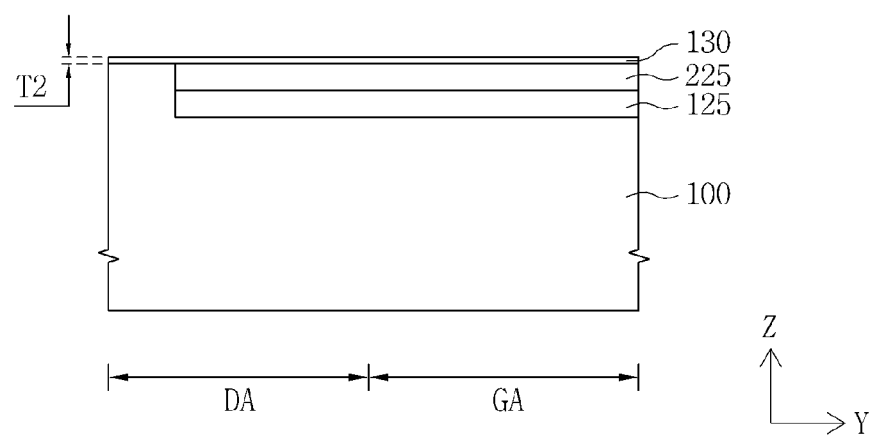

Next, as shown in FIGS. 17A and 17B, the method of fabricating the optical I/O device shown in FIGS. 1A through 1C may include forming a capping layer 130 having a second vertical thickness T2 on the substrate 100.

The formation of the capping layer 130 may include a CVD process. The capping layer 130 may have a different etch selectivity with respect to the substrate 100. The capping layer 130 may include a different material with respect to the substrate 100. For example, the capping layer 130 may be one of a silicon oxide layer, a silicon nitride layer, or a stack structure thereof.

Figure 18A:
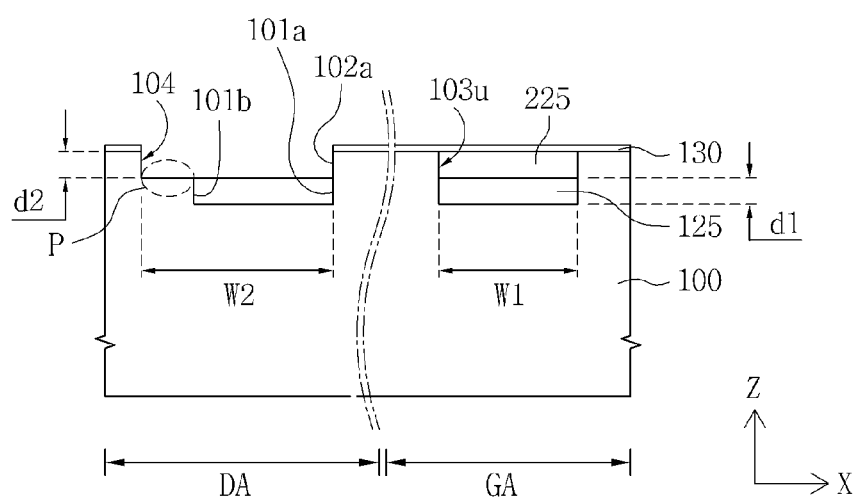
Figure 18B:
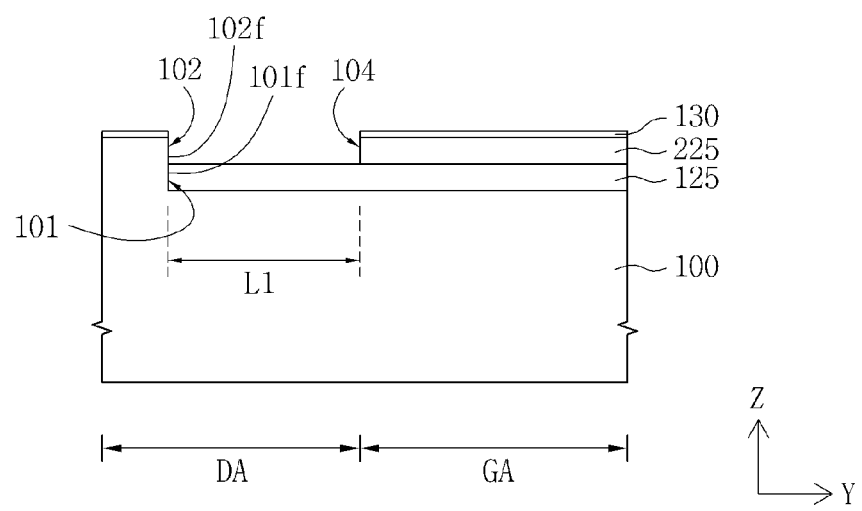

Subsequently, as shown in FIGS. 18A and 18B, the method of fabricating the optical I/O device shown in FIGS. 1A through 1C may include forming a second trench 104 in the second region D of the substrate 100.

The formation of the second trench 104 may include etching the capping layer 130 and the silicon pattern 225 in the second region DA. The second trench 104 may have a second vertical depth d2, a second horizontal width W2, and the first horizontal length L1.

Due to the formation of the second trench 104, the optical I/O device shown in FIGS. 1A through 1C may include a lower trench 101 in which the lower cladding insulating layer 125 is disposed, and an upper trench 102 disposed on the lower trench 101. That is, the formation of the second trench 104 may include forming the lower trench 101 and the upper trench 104.

The lower trench 101 may refer to the first trench 103 in which the lower cladding insulating layer 125 is disposed. Thus, the lower trench 101 may have the same horizontal width in the first region GA and the second region DA. For instance, the lower trench 101 may have the first horizontal width W1 in the first region GA and the second region DA. The lower trench 101 may have the first vertical depth d1.

The upper trench 102 may refer to a region $103u$ of the first trench 103 and the second trench 104 in which the lower cladding insulating layer 125 is not disposed. Here, the region $103u$ of the first trench 103 may refer to the first trench 103 disposed above the lower cladding insulating layer 125 in the first region GA.

The upper trench 102 may have different horizontal widths in the first region GA and the second region DA. For example, the upper trench 102 may have the first horizontal width W1 in the first region GA, and the second horizontal width W2 in the second region DA. The upper trench 102 may have the second vertical depth d2. Thus, the second trench 104 may refer to the upper trench 102 disposed in the second region DA.

The second trench 104 may include a sidewall vertically aligned with a first sidewall 101a of the lower trench 101 and an end-portion sidewall 101f of the lower trench 101. That is, a first sidewall 102a of the upper trench 102 may be vertically aligned with the first sidewall 101a of the lower trench 101. Also, the end-portion sidewall 102f of the upper trench 102 may be vertically aligned with the end-portion sidewall 101f of the lower trench 101.

The second trench 104 may expose a seed region P disposed adjacent to a second sidewall 101b of the lower trench 101. The seed region P may refer to the second region DA of the substrate 100 exposed by the second trench 104. That is, the formation of the second trench 104 may include exposing the seed region P disposed in the second region DA.

Figure 19A:
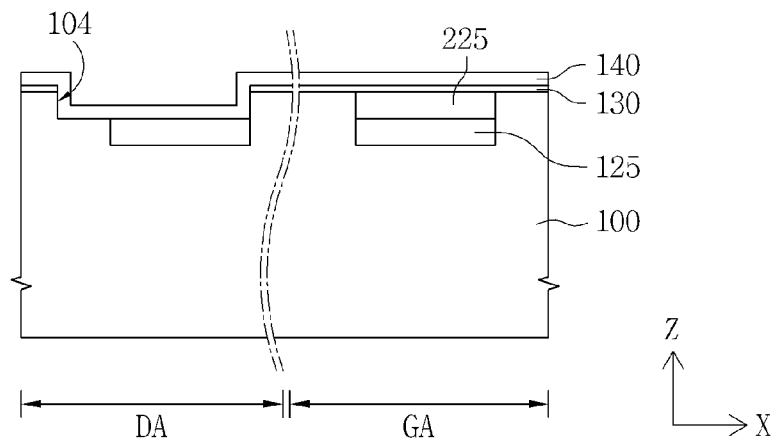
Figure 19B:
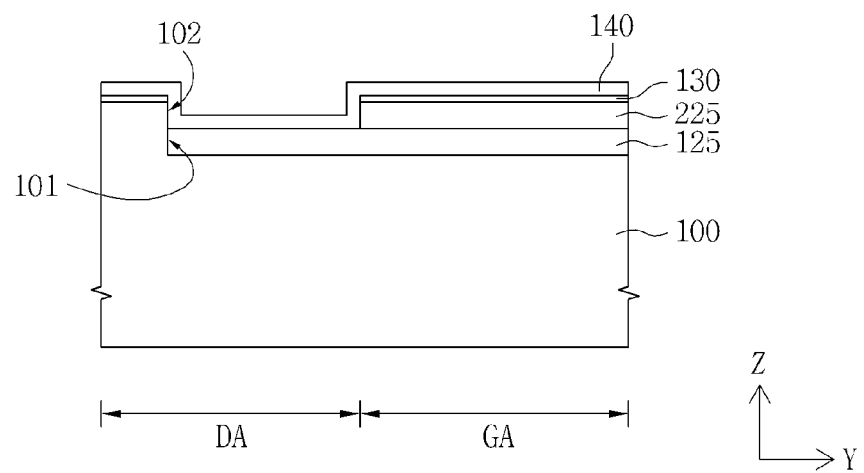

Subsequently, as shown in FIGS. 19A and 19B, the method of fabricating the optical I/O device shown in FIGS. 1A through 1C may include forming a third insulating layer 140 on the substrate 100.

The formation of the third insulating layer 140 may include a CVD process. The third insulating layer 140 may have a different etch selectivity with respect to the substrate 100. The third insulating layer 140 may include different material with respect to the substrate 100. For instance, the third insulating layer 140 may be one of a silicon oxide layer, a silicon nitride layer, and a stack structure thereof. The third insulating layer 140 may include the same material as the capping layer 130. The third insulating layer 140 may be a liner insulating layer.

Figure 20A:
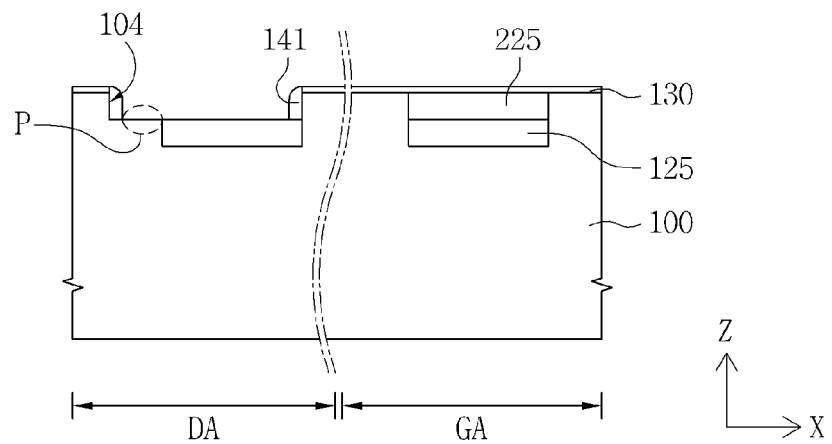
Figure 20B:
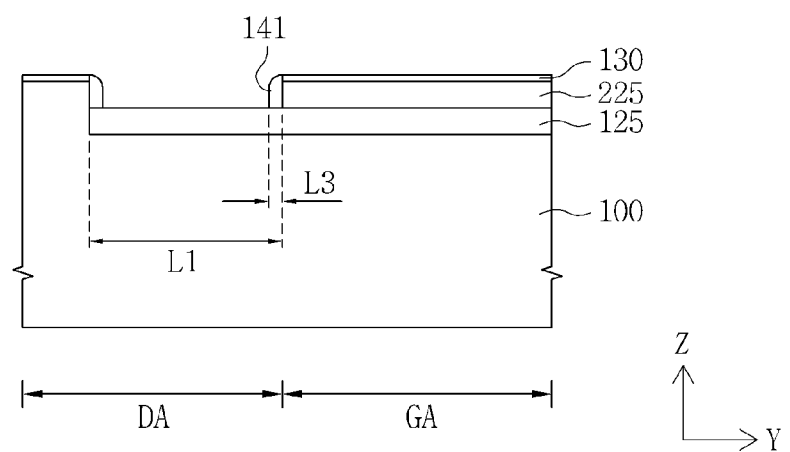

Next, as shown in FIGS. 20A and 20B, the method of fabricating the optical I/O device shown in FIGS. 1A through 1C may include forming spacers 141 along sidewalls of the second trench 104.

The formation of the spacers 141 may include spacer-etching the third insulating layer 140. The spacers 141 may have a third horizontal length L3. The third horizontal length L3 may be or correspond to a thickness less than about 50 nm such that the waveguide 200 and a PD 300, formed subsequently, may be optically connected to each other.

The formation of the spacers 141 may include exposing the seed region P. The formation of the spacers 141 may include removing the third insulating layer 140 from the seed region P.

Figure 21A:
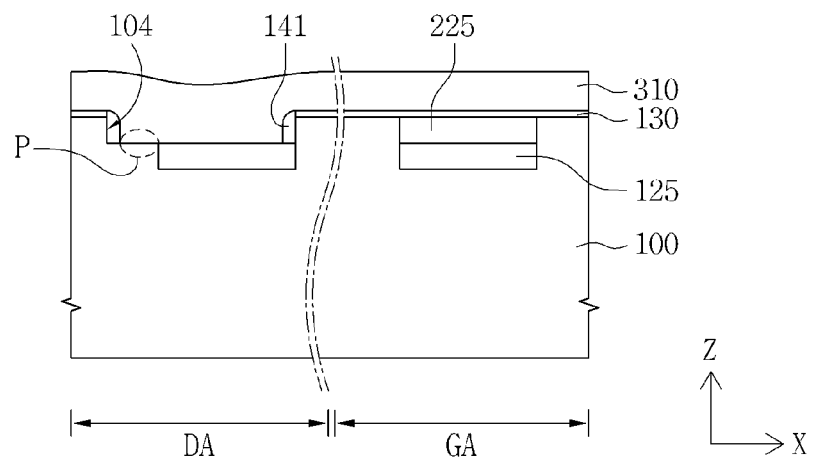
Figure 21B:
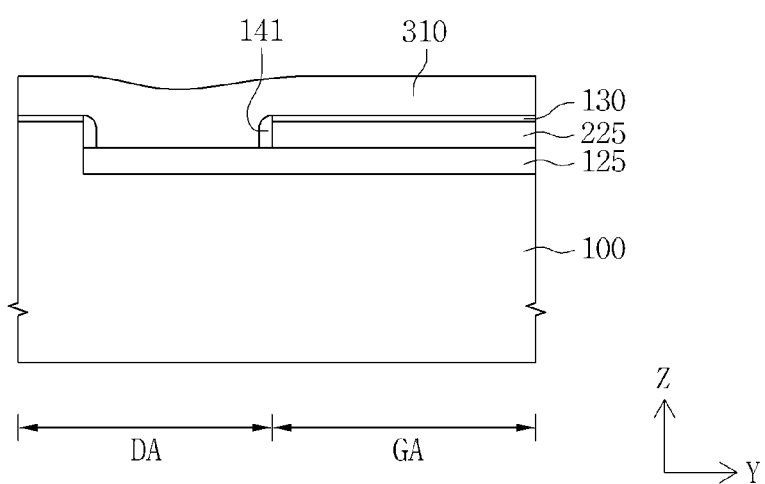

Subsequently, as shown in FIGS. 21A and 21B, the method of fabricating the optical I/O device shown in FIGS. 1A through 1C may include forming a first germanium layer 310 to fill the second trench 104.

The formation of the first germanium layer 310 may include forming an amorphous germanium (a-Ge) layer to fill the second trench 104. The formation of the first germanium layer 310 may include a CVD process.

Figure 22A:
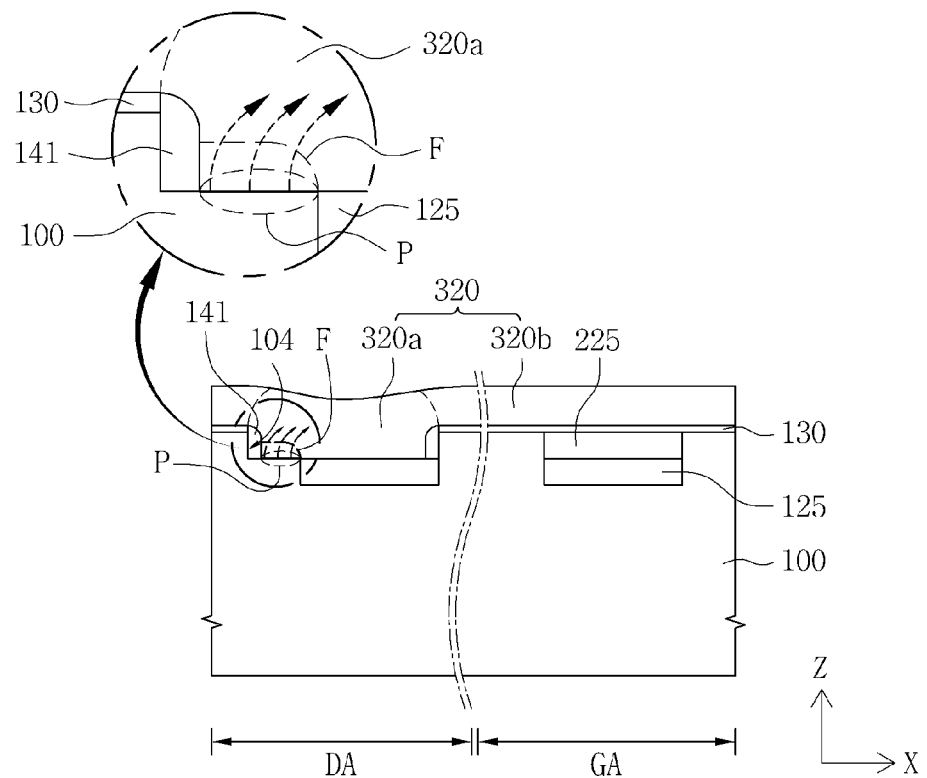
Figure 22B:
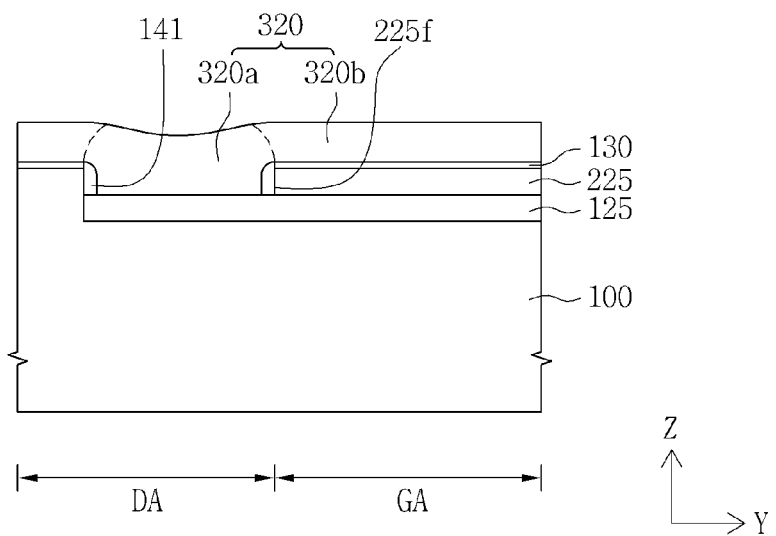

Thereafter, as shown in FIGS. 22A and 22B, the method of fabricating the optical I/O device shown in FIGS. 1A through 1C may include crystallizing the first germanium layer 310 to form a second germanium layer 320.

The formation of the second germanium layer 320 may include crystallizing the first germanium layer 310 using an RTA process or a laser crystallization process. The laser crystallization process may include a laser-induced LEF process. In this case, the seed region P may serve as a crystallization seed.

Specifically, the formation of the second germanium layer 320 may include crystallizing a portion of the first germanium layer 310 using the seed region P as a crystallization seed. When other kinds of crystals are used as crystallization seeds, crystal defects may occur in a region adjacent to the crystallization seeds. Thus, the second germanium layer 310 may include a crystal defect region F disposed on the seed region P. For example, the crystal defect region F may be disposed in the second germanium layer 310 disposed adjacent to the seed region P.

The first germanium layer 310 disposed on the capping layer 130 may be crystallized without crystallization seeds. Thus, the second germanium layer 320 may include a single crystalline germanium region 320a and a polycrystalline germanium (poly-Ge) region 320b. The single crystallization germanium region 310a may be disposed within and on the second trench 104. The poly-Ge region 320b may be disposed on the capping layer 130.

The third horizontal length L3 of the spacers 141 interposed between the silicon pattern 225 and the second germanium layer 320 may be at least about 0.5 nm. When the third horizontal length L3 is less than about 0.5 nm, an end surface 225f of the silicon pattern 225 may serve as a crystallization seed during crystallization of the first germanium layer 310. In this case, the second germanium layer 320 may include crystal defects in a region adjacent to the end surface 225f of the silicon pattern 225. Thus, the third horizontal length may range between about 0.5 nm and about 50 nm to prevent a reduction in transmission efficiency of an optical signal and occurrence of crystal defects.

Figure 23A:
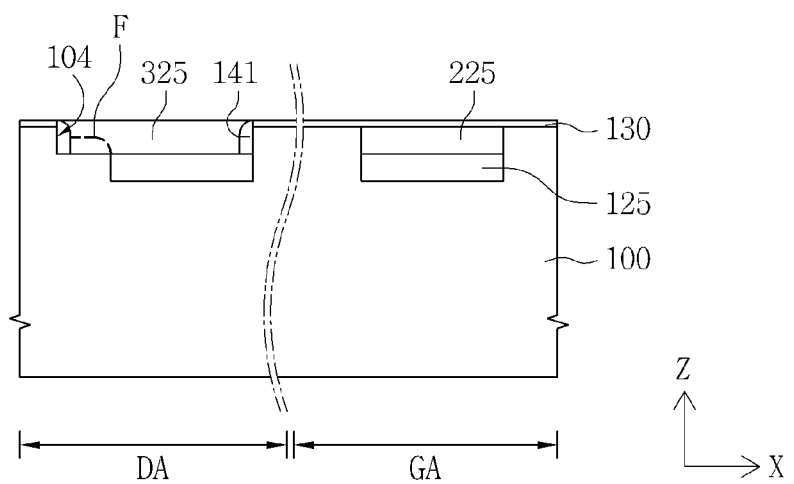
Figure 23B:
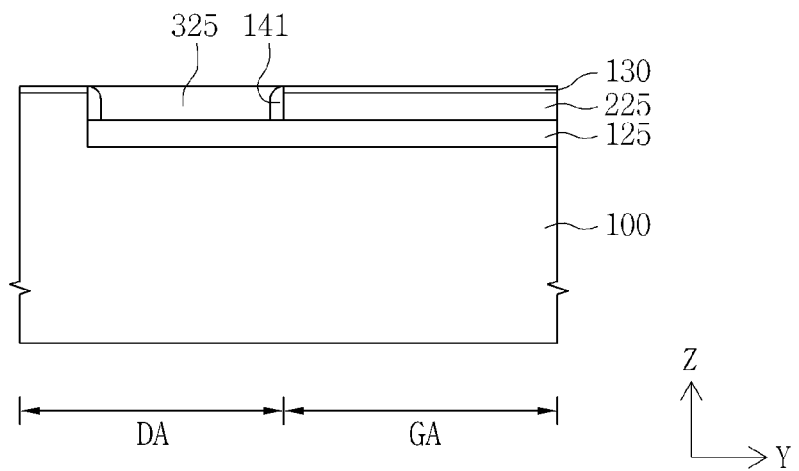

Next, as shown in FIGS. 23A and 23B, the method of fabricating the optical I/O device shown in FIGS. 1A through 1C may include forming a germanium pattern 325 to fill the second trench 104.

The formation of the germanium pattern 325 may include planarizing the second germanium layer 320 to expose a top surface of the capping layer 130. Thus, the germanium pattern 325 may include single crystalline germanium. The planarization of the second germanium layer 320 may include a CMP process. In this case, the capping layer 130 may be used as a polishing stopper.

Figure 24A:
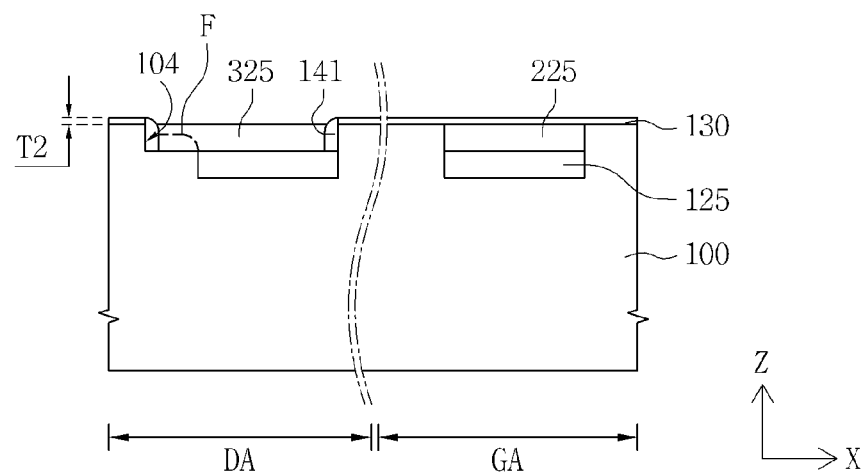
Figure 24B:
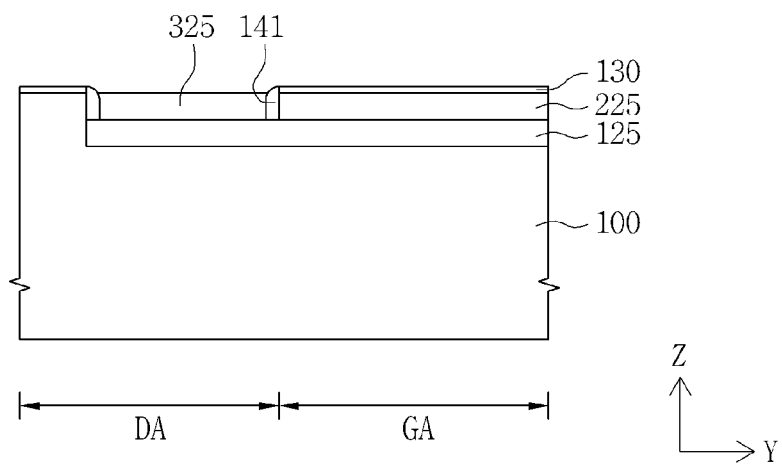

Subsequently, as shown in FIGS. 24A and 24B, the method of fabricating the optical I/O device shown in FIGS. 1A through 1C may include recessing the germanium pattern 325.

The recessing of the germanium pattern 325 may include recessing a top surface of the germanium pattern 325 to the second vertical thickness T2. Thus, the top surface of the germanium pattern 325 may be at the same level as the top surface of the substrate 100. The germanium pattern 325 may have a vertical thickness equal to the second vertical depth d2.

Figure 25A:
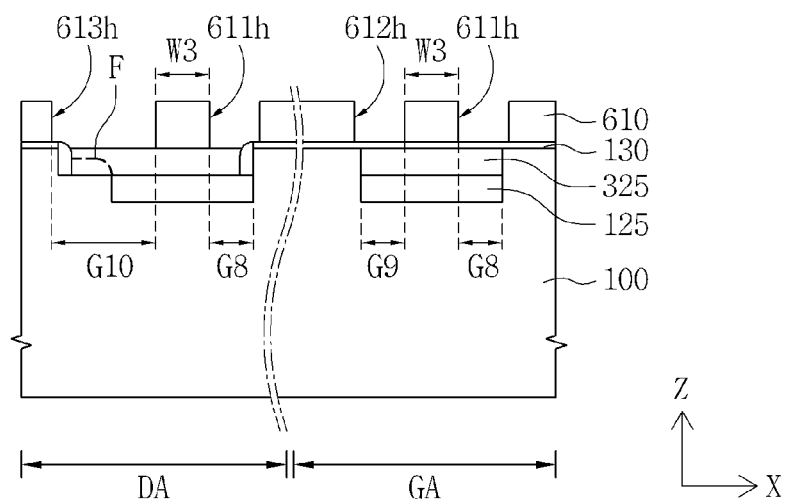
Figure 25B:
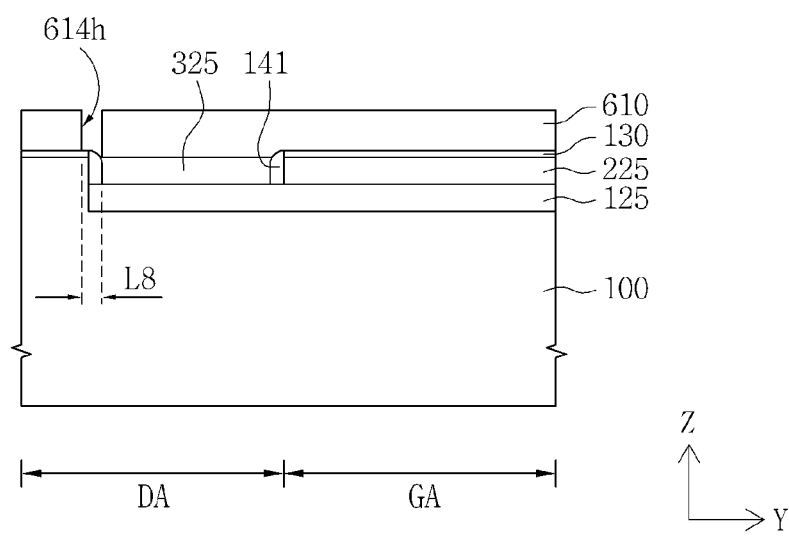

Thereafter, as shown in FIGS. 25A and 25B, the method of fabricating the optical I/O device shown in FIGS. 1A through 1C may include forming a first photoresist pattern 610 on the substrate 100.

The first photoresist pattern 610 may include a first hole 611h having an eighth distance G8, a second hole 612h having a ninth distance G9, a third hole 613h having a tenth distance G10, and a fourth hole 614h having an eighth horizontal length L8. The eighth distance G8 may be equal to the ninth distance G9. The tenth distance G10 may be greater than the ninth distance G9.

The first hole 611h may be disposed across the first region GA and the second region DA. The second hole 612h may be disposed in the first region GA. The third and fourth holes 613h and 614h may be disposed in the second region DA. The first through fourth holes 611h, 612h, 613h, and 614h may be connected to one another.

A distance between the first hole 611h in the first region GA and the second hole 612h in the first region GA may be the third horizontal width W3. A distance between the first hole 611h in the second region DA and the third hole 613h in the second region DA may be the third horizontal width W3. The distance between the first hole 611h in the first region GA and the second hole 612h in the first region GA may be equal to the distance between the first hole 611h in the second region DA and the third hole 613h in the second region DA.

The first through fourth holes 611h, 612h, 613h, and 614h may expose the spacers 141. However, alternatively, the first photoresist pattern 610 may be arranged so as not to expose the spacers 141 interposed between the waveguide 200 and the PD 300.

Figure 26A:
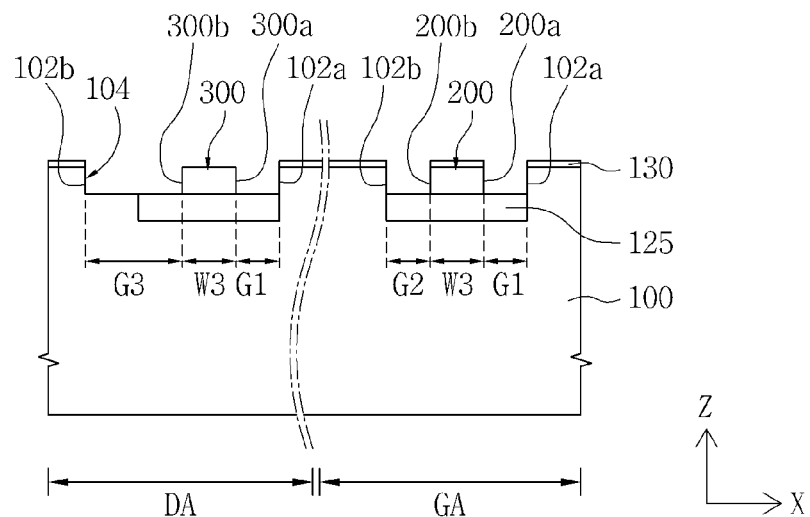
Figure 26B:
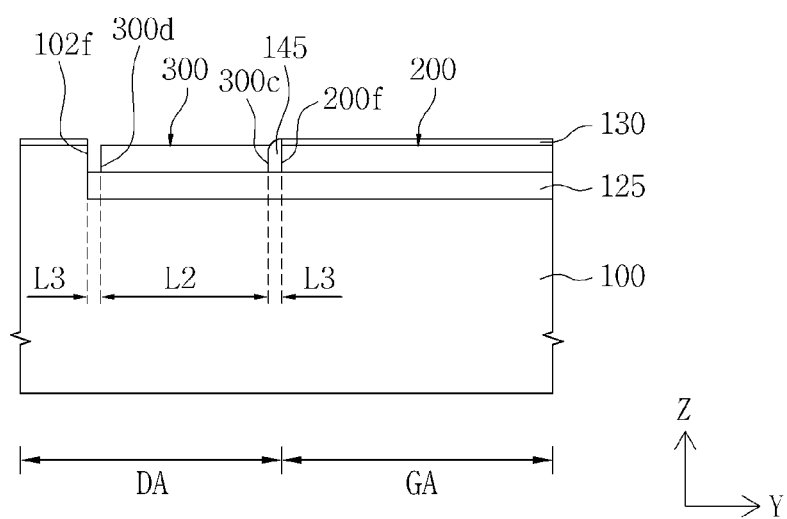

Next, as shown in FIGS. 26A and 26B, the method of fabricating the optical I/O device shown in FIGS. 1A through 1C may include forming the waveguide 200, the PD 300, and a light-transmitting insulating layer 145 using the first photoresist pattern 610.

The waveguide 200 may be formed in the first region GA due to the first and second holes 611h and 612h. Thus, the waveguide 200 may have the third horizontal width W3. There may be a first distance G1 between a first lateral surface 200a of the waveguide 200 and a first sidewall 102a of the upper trench 102. There may be a distance G2 between a second lateral surface 200b of the waveguide 200 and a second sidewall 102b of the upper trench 102. The first distance G1 may be equal to the second distance G2.

The PD 300 may be formed in the second region DA due to the first hole 611h, the third hole 613h, and the fourth hole 614h. Thus, the PD 300 may have third horizontal width W3.

The third hole 613h of the first photoresist pattern 610 may expose the crystal defect region F of the germanium pattern 325. Thus, the formation of the waveguide 200, the PD 300, and the light-transmitting insulating layer 145 may include removing the crystal defect region F. Accordingly, the PD 300 may be prevented from having crystal defects.

The PD 300 may include a first lateral surface 300a disposed toward the first sidewall 102a of the upper trench 102, a second lateral surface 300b disposed toward the second sidewall 102b of the upper trench 102, a first end surface 300c disposed toward the waveguide 200, and a second end surface 300d disposed toward an end-portion sidewall 102f of the upper trench 102. Thus, the first end surface 300c of the PD 300 may face an end surface 200f of the waveguide 200. The second end surface 300d of the PD 300 may face the end-portion sidewall 102f of the upper trench 102.

There may be the first distance G1 between the first lateral surface 300a of the PD 300 and the first sidewall 102a of the upper trench 102. There may be a third distance G3 between the second lateral surface 300b of the PD 300 and the second sidewall 102b of the upper trench 102.

A distance between the second end surface 300d of the PD 300 and the end-portion sidewall 102f of the upper trench 102 may be the third horizontal length L3. The PD 300 may have a second horizontal length L2. The second horizontal length L2 may be a value obtained by subtracting twice the third horizontal length L3 from the first horizontal length L1.

The light-transmitting insulating layer 145 may be formed due to the first and third holes 611h and 613h. The light-transmitting insulating layer 145 may be disposed in the second region DA. The light-transmitting insulating layer 145 may be interposed between the end surface 200f of the waveguide 200 and the first end surface 300c of the PD 300. The light-transmitting insulating layer 145 may have the same horizontal length as the spacers 141. For example, the light-transmitting insulating layer 145 may have the third horizontal length L3.

Figure 27A:
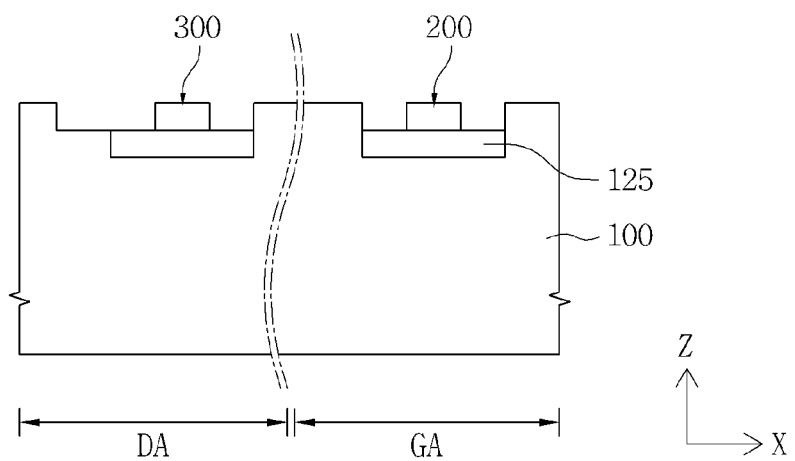
Figure 27B:
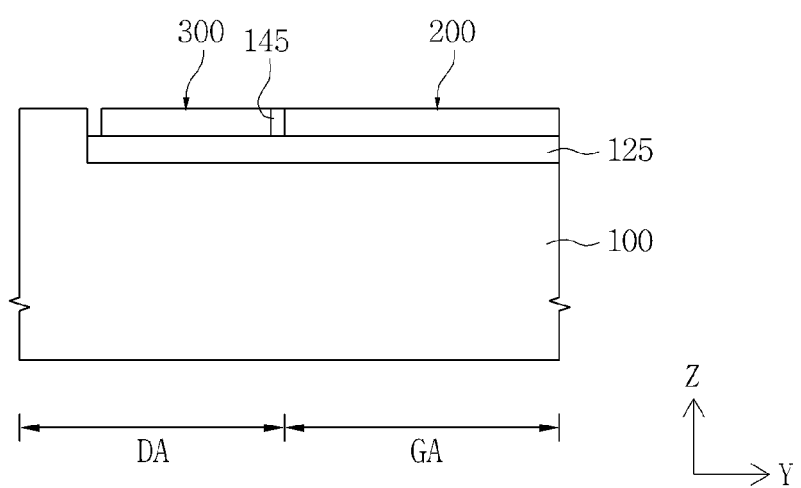

Subsequently, as shown in FIGS. 27A and 27B, the method of fabricating the optical I/O device shown in FIGS. 1A through 1C may include removing the capping layer 130.

The removal of the capping layer 130 may include planarizing a top surface of the light-transmitting insulating layer 145. Thus, the top surface of the light-transmitting insulating layer 145 may be at the same level as the top surface of the PD 300. To this end, the removal of the capping layer 130 may include planarizing the capping layer 130 to expose the top surface of the substrate 100. The planarization of the capping layer 130 may include a CMP process.

Figure 28A:
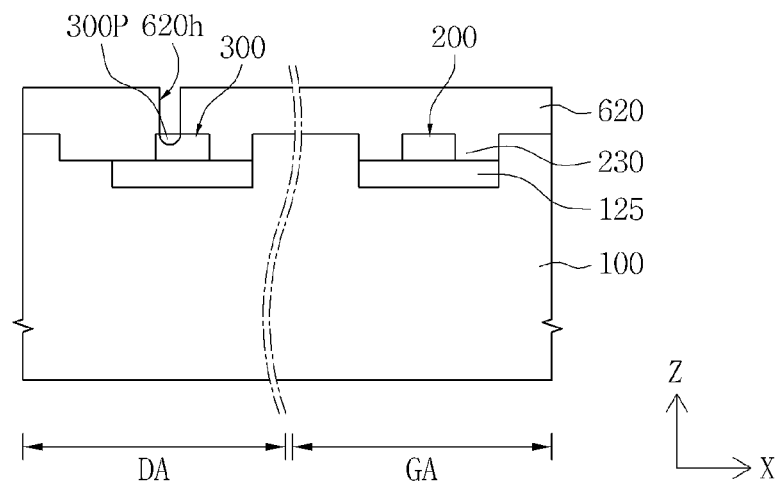
Figure 28B:
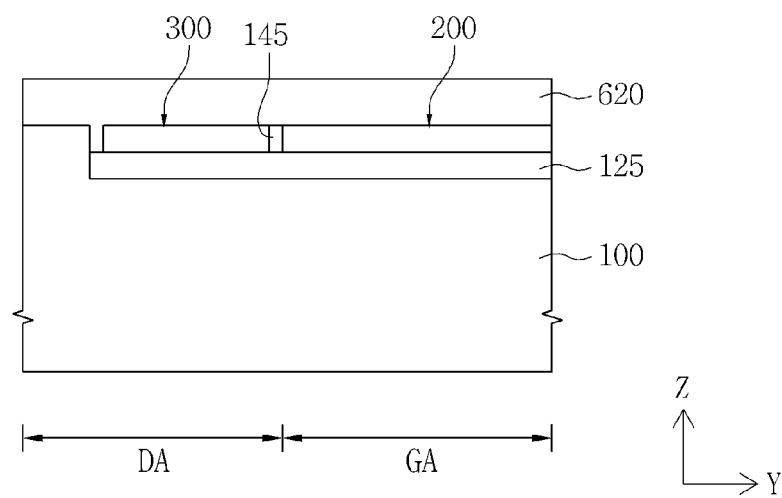

Thereafter, as shown in FIGS. 28A and 28B, the method of fabricating the optical I/O device shown in FIGS. 1A through 1C may include forming a second photoresist pattern 620 on the substrate 100.

The second photoresist pattern 620 may include a fifth hole 620h exposing a first doping region 300P of the PD 300.

Next, the method of fabricating the optical I/O device shown in FIGS. 1A through 1C may include doping first impurities using the second photoresist pattern 620.

The doping of the first impurities may include implanting the first impurities into the first doping region 300P.

Afterwards, the method of fabricating the optical I/O device shown in FIGS. 1A through 1C may include removing the second photoresist pattern 620.

Figure 29A:
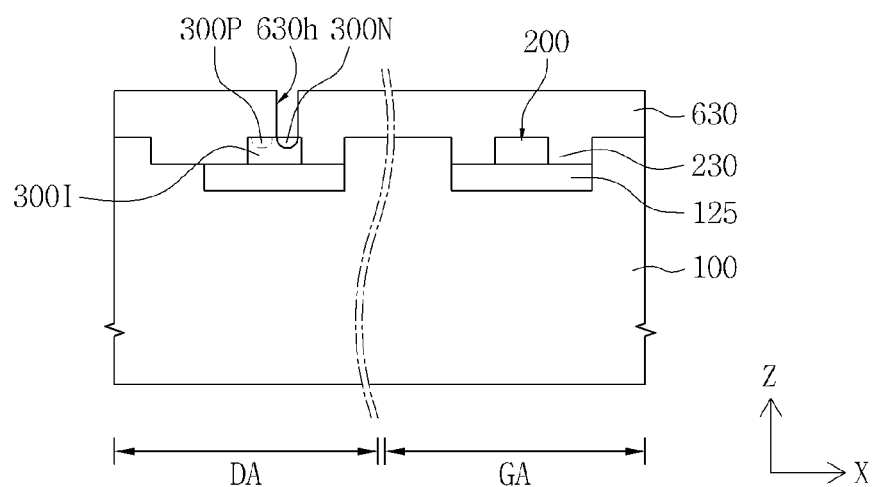
Figure 29B:
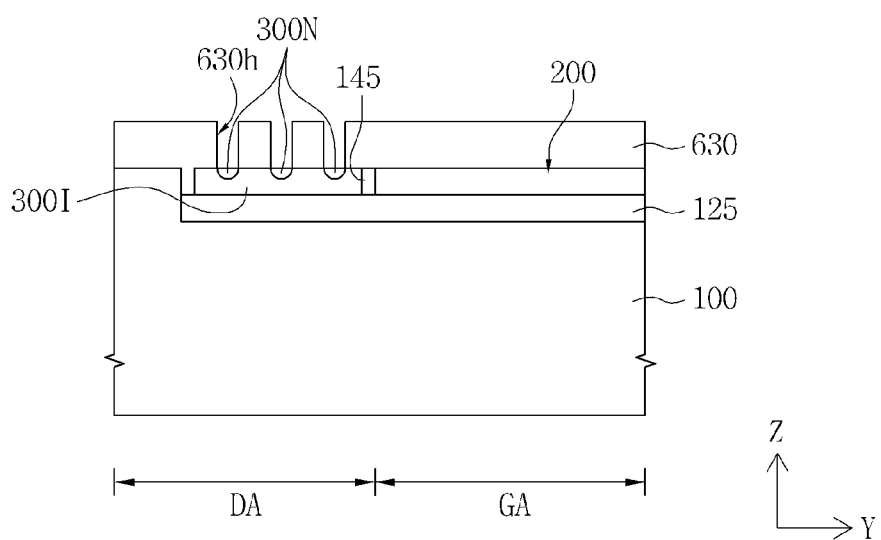

Thereafter, as shown in FIGS. 29A and 29B, the method of fabricating the optical I/O device shown in FIGS. 1A through 1C may include forming a third photoresist pattern 630 on the substrate 100.

The third photoresist pattern 630 may include a sixth hole 630h exposing a second doping region 300N of the PD 300.

Next, the method of fabricating the optical I/O device shown in FIGS. 1A through 1C may include doping second impurities using the third photoresist pattern 630.

The doping of the second impurities may include implanting the second impurities into the second doping region 300N. The second impurities may be impurities of a different conductivity type from the first impurities. For example, the first doping region 300P may include p-type impurities, while the second doping region 300N may include n-type impurities.

The second doping region 300N may be spaced apart from the first doping region 300P. A region except the first and second doping regions 300P and 300N may be an intrinsic region 300I. That is, the intrinsic region 300I may be interposed between the first and second regions 300P and 300N.

Figure 30A:
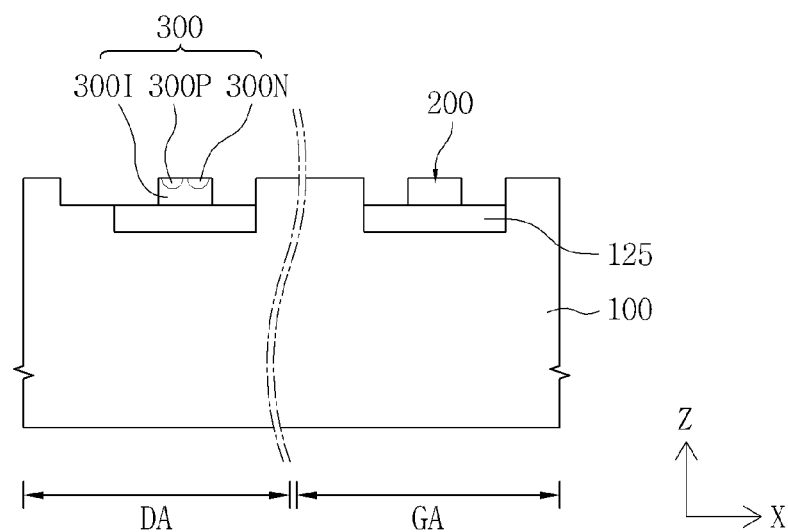
Figure 30B:
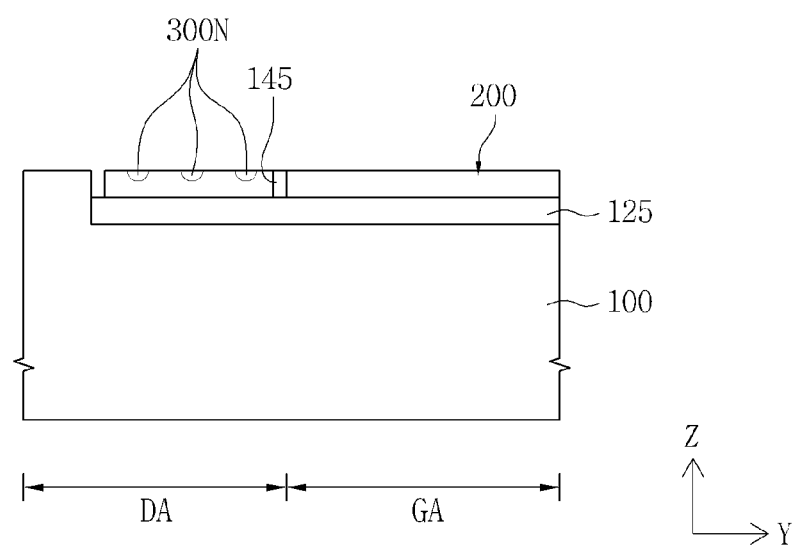

Subsequently, as shown in FIGS. 30A and 30B, the method of fabricating the optical I/O device shown in FIGS. 1A through 1C may include removing the third photoresist pattern 630.

Finally, as shown in FIGS. 1A through 1C, the method of fabricating the optical I/O device according to the exemplary embodiment may include forming an upper cladding insulating layer 160 on the waveguide 200 and the PD 300.

The formation of the upper cladding insulating layer 160 may include a CVD process. The upper cladding insulating layer 160 may include the same material as the light-transmitting insulating layer 145.

Exemplary Embodiment 8

FIGS. 31A through 33A are x-axial cross-sectional views illustrating a method of fabricating the optical I/O device shown in FIGS. 2A through 2C, and FIGS. 31B through 33B are y-axial cross-sectional views illustrating the method of fabricating the optical I/O device shown in FIGS. 2A through 2C.

Hereinafter, differences between the methods of fabricating the optical I/O devices according to the first and second exemplary embodiments will be chiefly described with reference to FIGS. 2A through 2C, 31A through 33A, and 31B through 33B. Thus, a detailed description of processes that are the same as or similar to the processes of the method of fabricating the optical I/O device according to the seventh exemplary embodiment will be omitted.

Figure 31A:
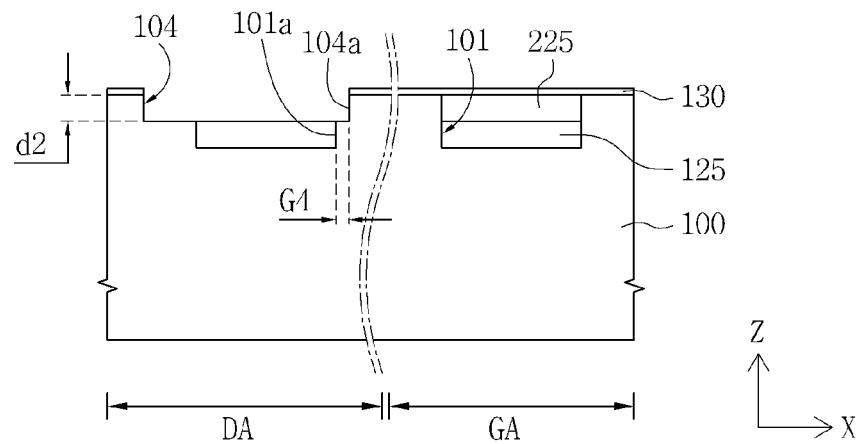
Figure 31B:
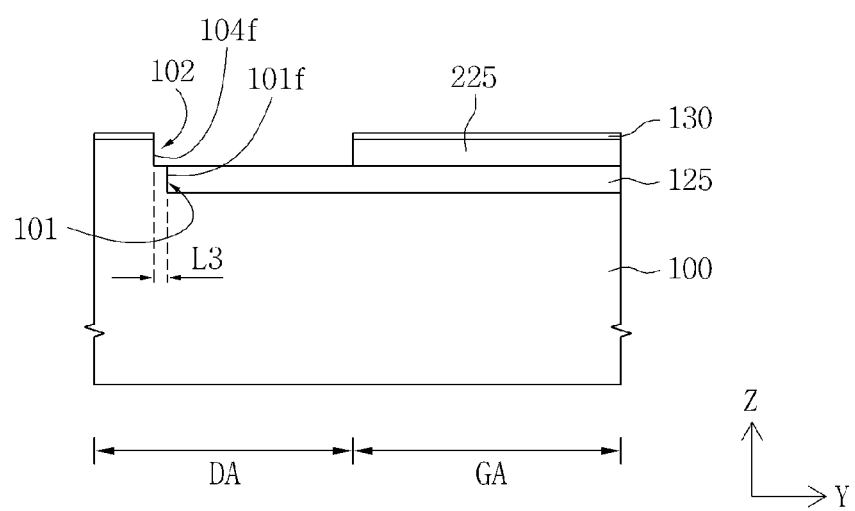

To begin with, as shown in FIGS. 31A and 31B, the method of fabricating the optical I/O device shown in FIGS. 2A through 2C may include forming a lower trench 101 in a substrate 100, and forming an upper trench 102 on the lower trench 101.

The formation of the lower trench 101 and the upper trench 102 may include forming a second trench 104 in a second region DA of the substrate 100 where the lower cladding insulating layer 125 and a silicon pattern 225 are formed.

A first sidewall 104a of the second trench 104 may be formed so as not to be vertically aligned with a first sidewall 101a of the lower trench 101. For example, the first sidewall 104a of the second trench 104 may be spaced apart from the first sidewall 101a of the lower trench 101 in an x-axial direction. The first sidewall 104a of the second trench 104 may be spaced a fourth distance G4 apart from the first sidewall 101a of the lower trench 101.

In addition, an end-portion sidewall 104f of the second trench 104 may be formed so as not to be vertically aligned with the end-portion sidewall 101f of the lower trench 101. For example, the end-portion sidewall 104f of the second trench 104 may be spaced apart from the end-portion sidewall 101f of the lower trench 101 in a y-axial direction. The distance between the end-portion sidewall 104f of the second trench 101 may be a third horizontal length L3. The fourth distance G4 may be equal to the third horizontal length L3.

Figure 32A:
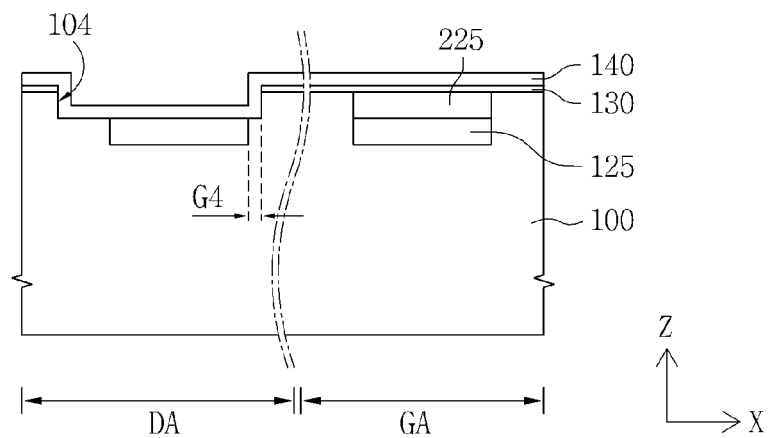
Figure 32B:
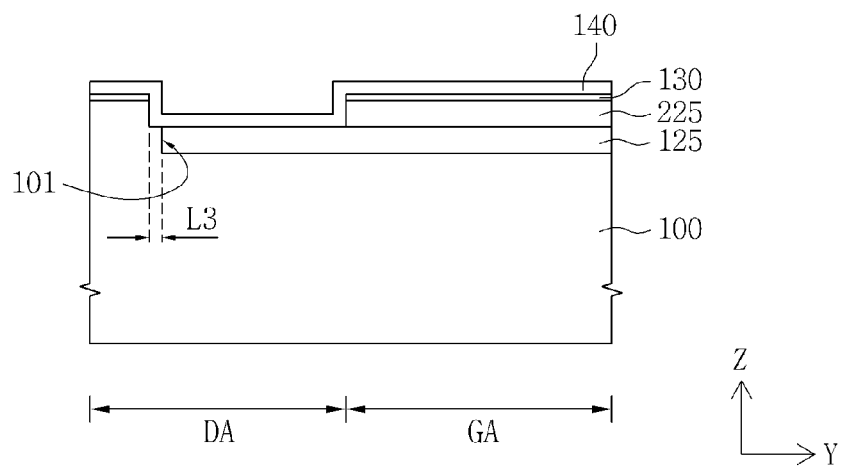

Thereafter, as shown in FIGS. 32A and 32B, the method of fabricating the optical I/O device shown in FIGS. 2A through 2C may include forming a third insulating layer 140 on the substrate 100.

Figure 33A:
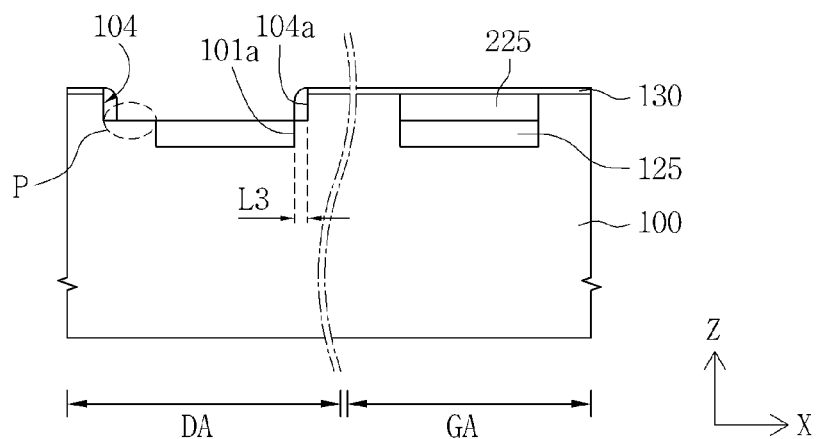
Figure 33B:
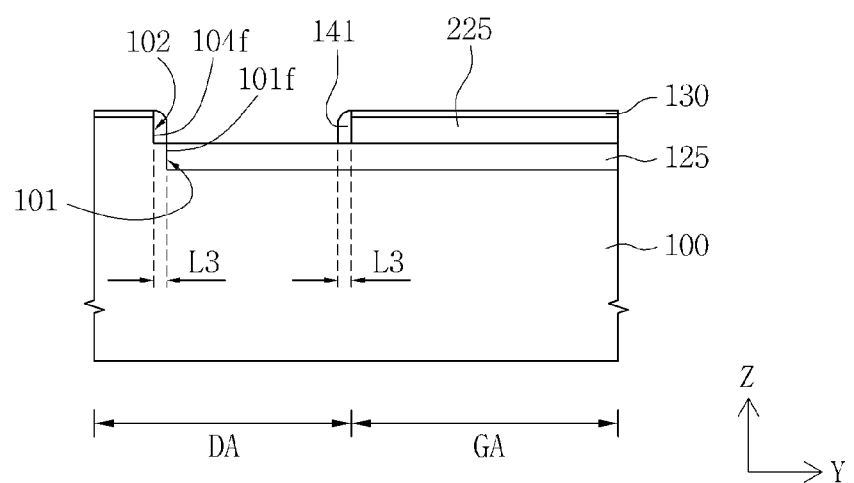

Next, as shown in FIGS. 33A and 33B, the method of fabricating the optical I/O device shown in FIGS. 2A through 2C may include forming spacers along sidewalls of the second trench 104.

The spacers 141 may have the third horizontal length L3. When the spacers 141 have a smaller horizontal length than the third horizontal length L3, a top surface of the substrate 100 adjacent to the end-portion sidewall 101f of the lower trench 101 may be exposed by the second trench 104. Thus, the exposed top surface of the substrate 100 may be used as a crystallization seed during a subsequent process of crystallizing a first germanium layer 310. As a result, crystal defects may be prevented from being included in a PD 300 formed due to a subsequent process.

Exemplary Embodiment 9

FIGS. 34A through 48A are x-axial cross-sectional views illustrating a method of fabricating the optical I/O device shown in FIGS. 6A through 6C, and FIGS. 34B through 48B are y-axial cross-sectional views illustrating the method of fabricating the optical I/O device shown in FIGS. 6A through 6C.

Hereinafter, differences between the methods of fabricating the optical I/O devices according to the first and sixth exemplary embodiments will be chiefly described with reference to FIGS. 34A through 48A, and 34B through 48B. Thus, a detailed description of processes that are the same as or similar to the processes of the method of fabricating the optical I/O device according to the seventh exemplary embodiment will be omitted.

Figure 34A:
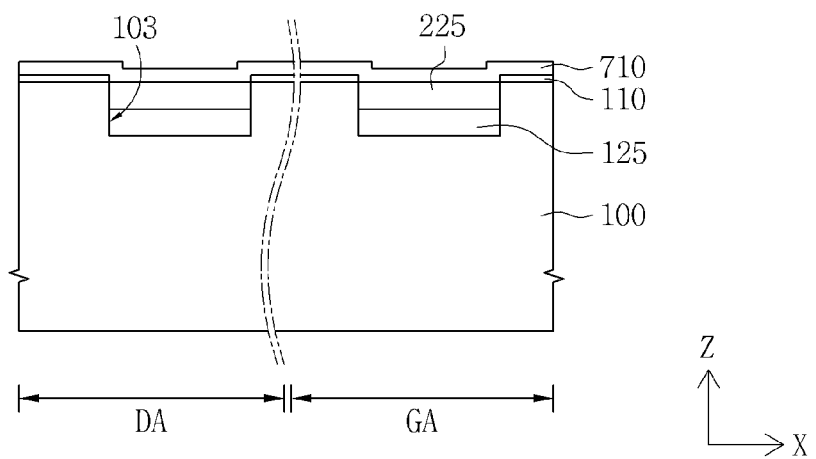
Figure 34B:
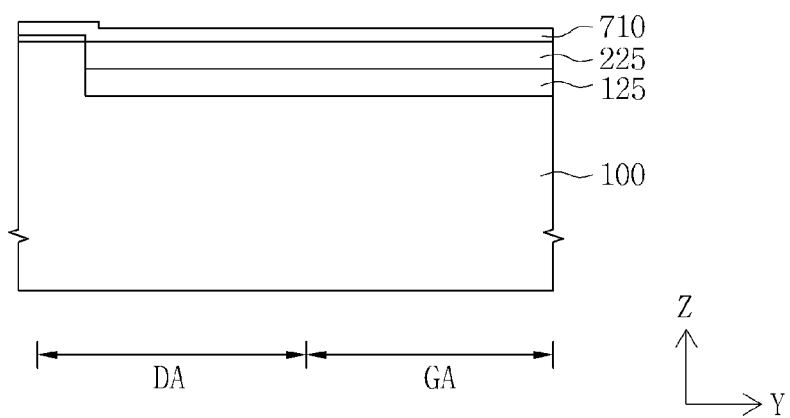

To begin with, as shown in FIGS. 34A and 34B, the method of fabricating the optical I/O device shown in FIGS. 6A through 6C may include forming a first trench 103 including a lower cladding insulating layer 125 and a silicon pattern 225 in a substrate 100 having a first insulating layer 110.

Thereafter, the method of fabricating the optical I/O device according to the ninth exemplary embodiment may include forming a fourth insulating layer 710 on the substrate 100.

The formation of the fourth insulating layer 710 may include a CVD process. The fourth insulating layer 710 may have a different etch selectivity with respect to the first insulating layer 110. For example, the first insulating layer 110 may include a silicon nitride layer, while the fourth insulating layer 110 may include a silicon oxide layer.

Figure 35A:
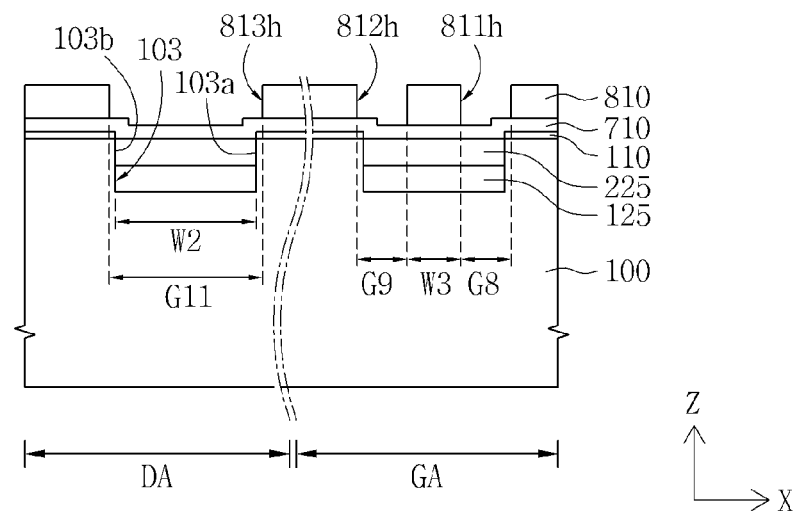
Figure 35B:
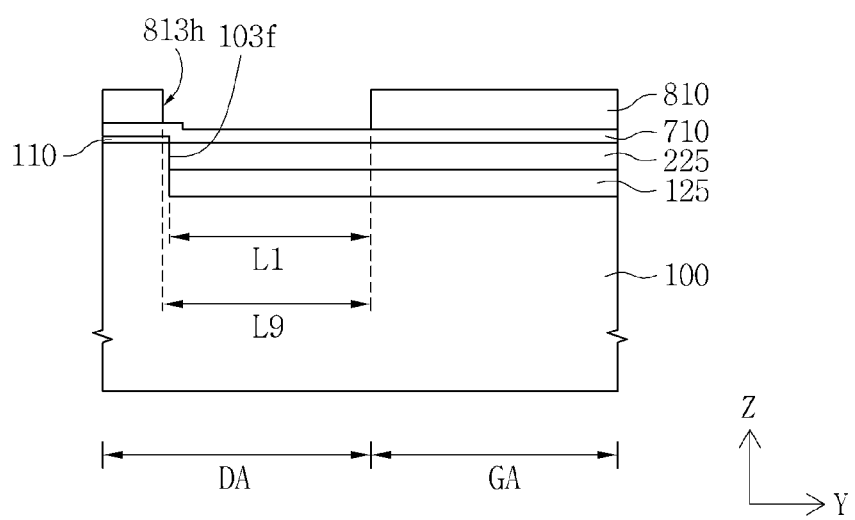

Next, as shown in FIGS. 35A and 35B, the method of fabricating the optical I/O device shown in FIGS. 6A through 6C may include forming a fourth photoresist pattern 810 on the substrate 100.

The fourth photoresist pattern 810 may include a seventh hole 811h having an eighth distance G8, an eighth hole 812h having a ninth distance G9, and a ninth hole 813h having an eleventh distance G11. The ninth hole 813h may have a ninth horizontal length L9. The eleventh distance G11 may be greater than the second horizontal width W2. The ninth horizontal length L9 may be greater than a first horizontal length L1.

The seventh, eighth, and ninth holes 811h, 812h, and 813h may expose a first sidewall 103a, a second sidewall 103b, and an end-portion sidewall 103f of the first trench 103.

Figure 36A:
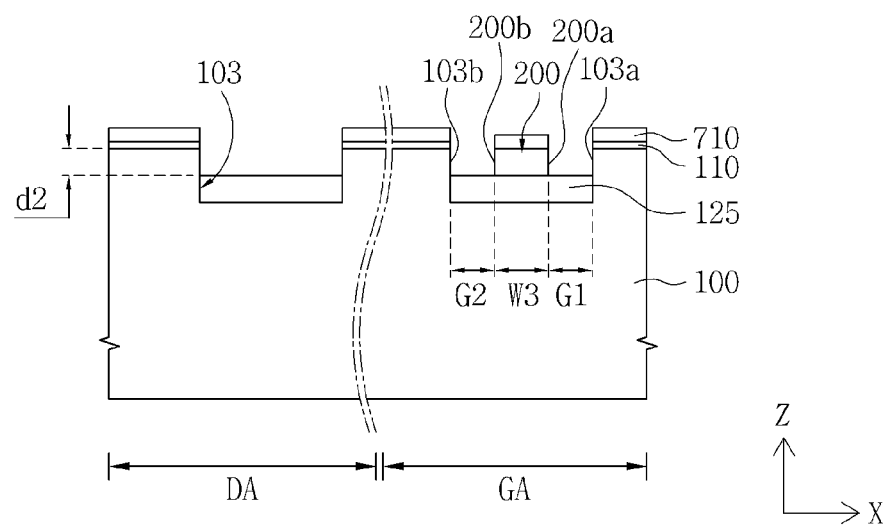
Figure 36B:
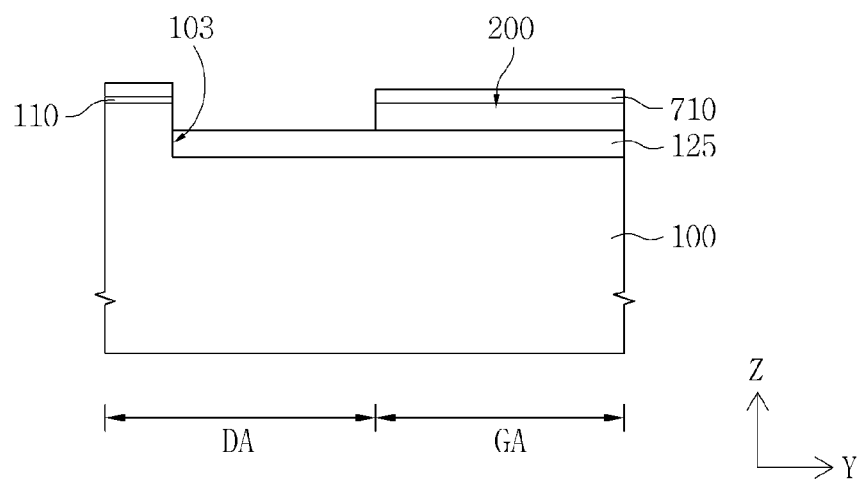

Subsequently, as shown in FIGS. 36A and 36B, the method of fabricating the optical I/O device shown in FIGS. 6A through 6C may include forming a waveguide 200 using the fourth photoresist pattern 810.

The waveguide 200 may have a second vertical depth d2 and the third horizontal width W3. A first lateral surface 200a of the waveguide 200 may be spaced a distance G1 apart from a first sidewall 102a of the upper trench 102. A second lateral surface 200b of the waveguide 200 may be spaced a second distance G2 apart from a second sidewall 102b of the upper trench 102. The first distance G1 may be equal to the second distance G2.

The formation of the waveguide 200 may include removing the first silicon pattern 225 from a second region DA using the ninth hole 813h of the fourth photoresist pattern 810.

Figure 37A:
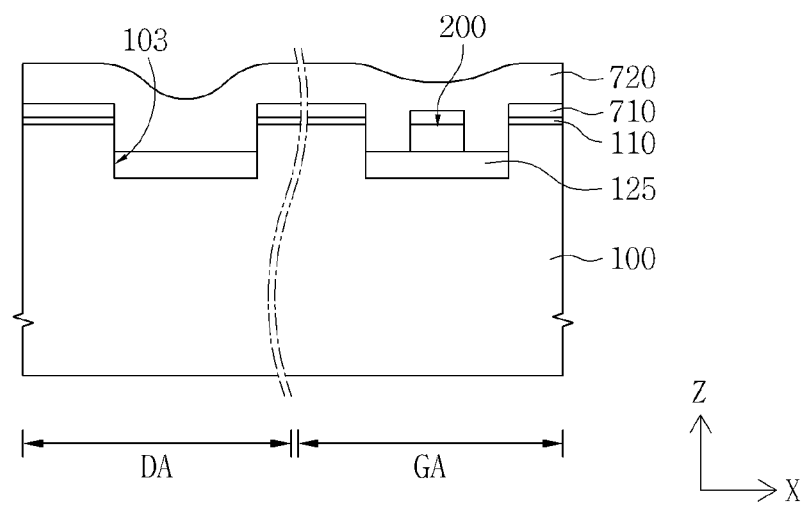
Figure 37B:
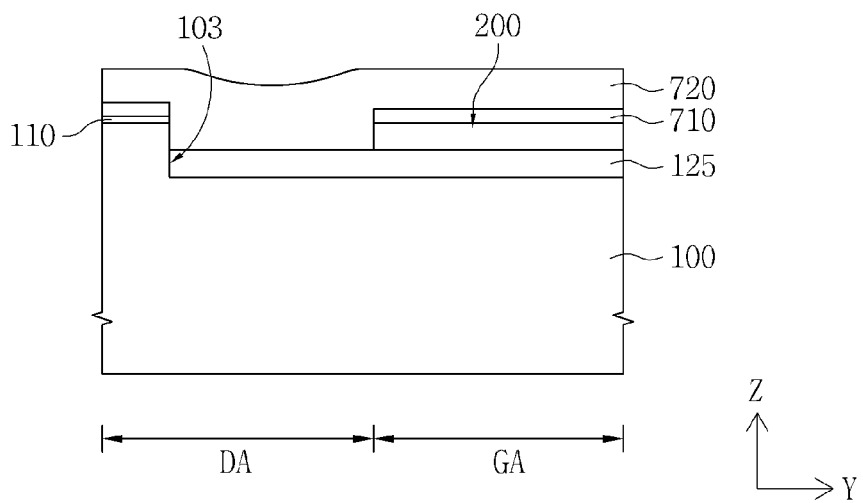

Thereafter, as shown in FIGS. 37A and 37B, the method of fabricating the optical I/O device shown in FIGS. 6A through 6C may include forming a fifth insulating layer 720 to fill the first trench 103.

The formation of the fifth insulating layer 720 may include a CVD process. The fifth insulating layer 720 may include the same material as the lower cladding insulating layer 125.

Figure 38A:
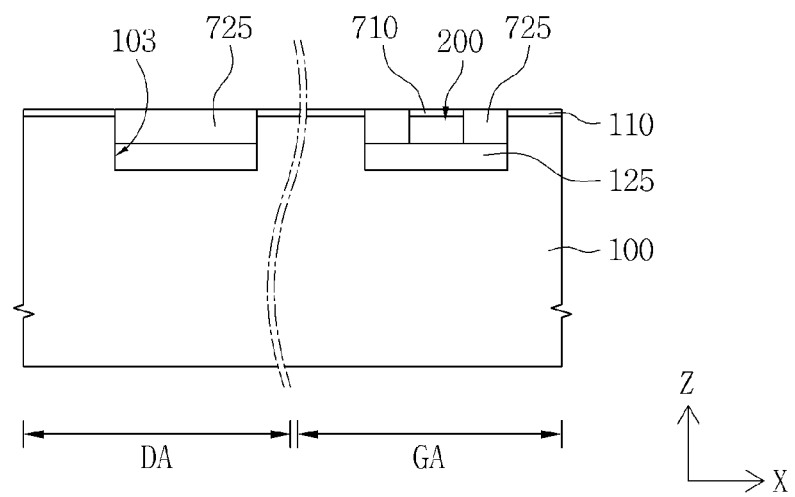
Figure 38B:
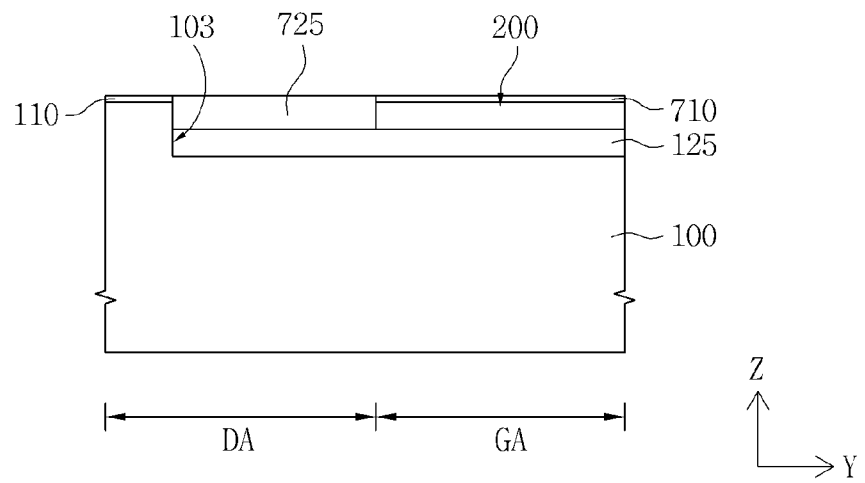

Next, as shown in FIGS. 38A and 38B, the method of fabricating the optical I/O device shown in FIGS. 6A through 6C may include forming a second insulating pattern 725 to fill the first trench 103.

The formation of the second insulating pattern 725 may include planarizing the fourth insulating layer 710 and the fifth insulating layer 710 until a top surface of the first insulating layer 110 is exposed. A top surface of the waveguide 200 may be lower than the top surface of the first insulating layer 110. Thus, the fourth insulating layer 710 may remain on the top surface of the waveguide 200.

Figure 39A:
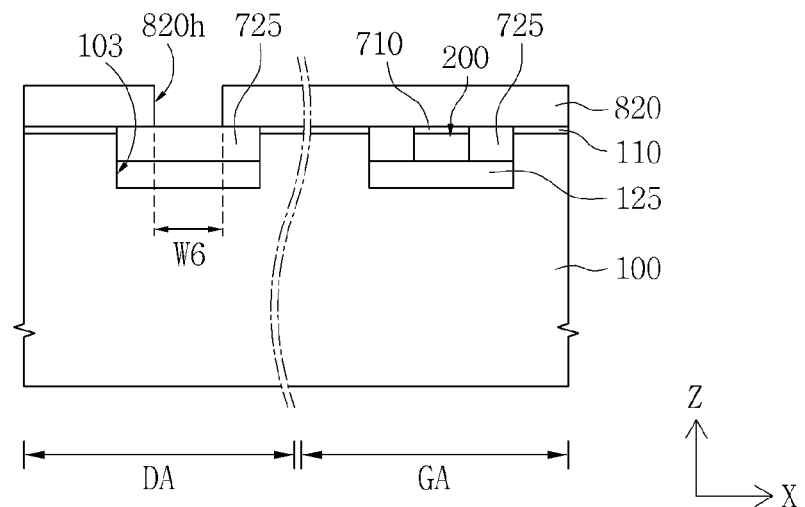
Figure 39B:
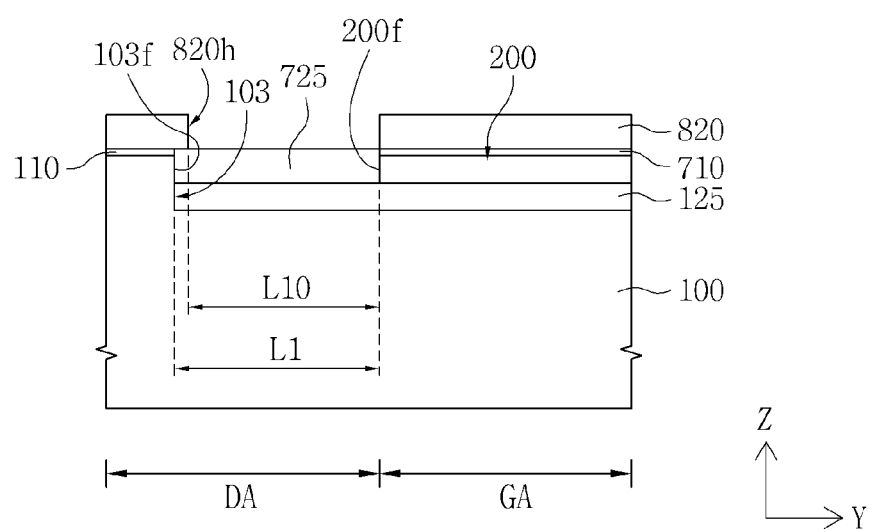

Subsequently, as shown in FIGS. 39A and 39B, the method of fabricating the optical I/O device shown in FIGS. 6A through 6C may include forming a fifth photoresist pattern 820 on the substrate 100.

The fifth photoresist pattern 820 may include a tenth hole 820h. The tenth hole 820h may have a sixth horizontal width W6 and a tenth horizontal length L10. The sixth horizontal width W6 may be greater than the third horizontal width W3. The tenth horizontal length L8 may be smaller than the first horizontal length L1 of the first trench 103. The tenth hole 820h may be disposed in the second region DA of the substrate 100. The tenth hole 820h may include a sidewall vertically aligned with an end surface 200f of the waveguide 200.

The fifth photoresist pattern 820 may cover an end-portion sidewall 103f of the first trench 103. That is, the tenth hole 820h may not expose the end-portion sidewall 103f of the first trench 103.

Figure 40A:
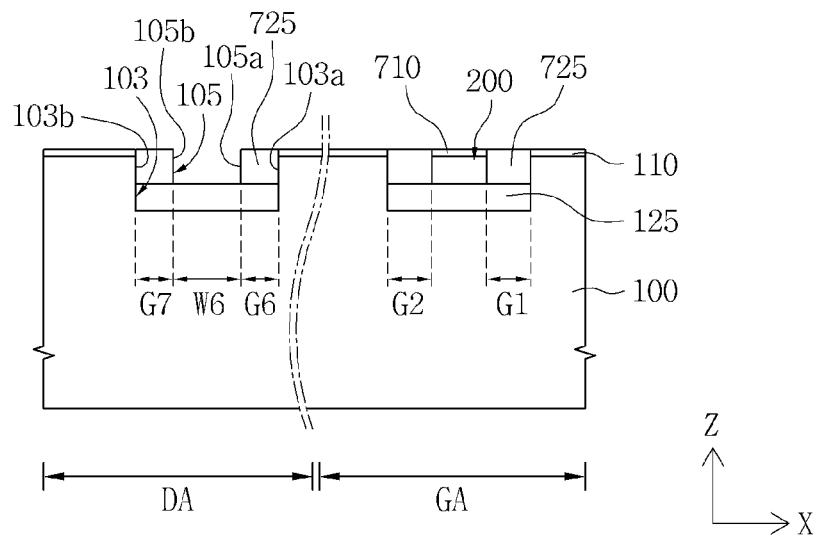
Figure 40B:
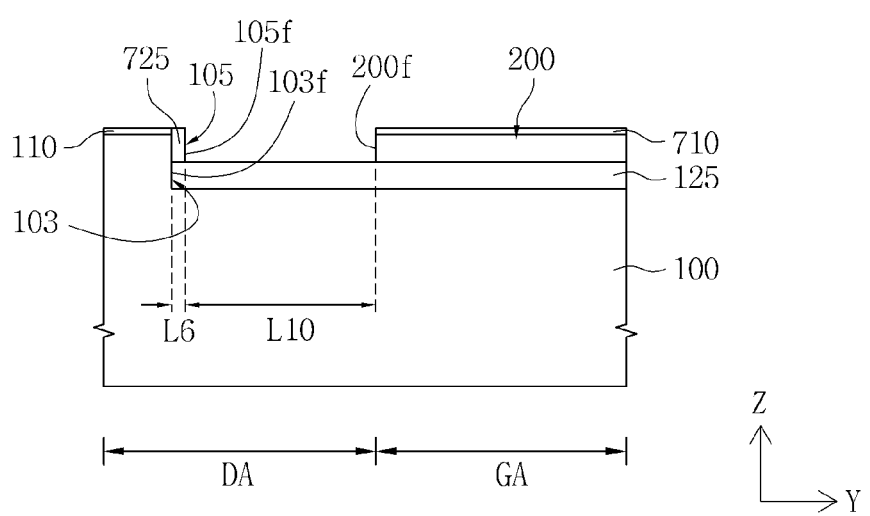

Afterwards, as shown in FIGS. 40A and 40B, the method of fabricating the optical I/O device shown in FIGS. 6A through 6C may include forming a third trench 103 using the fifth photoresist pattern 802.

The third trench 105 may be disposed in the second region DA of the substrate 100. The third trench 105 may expose the end surface 200f of the waveguide 200. The third trench 105 may have the sixth horizontal width W6 and the tenth horizontal length L10.

The third trench 105 may include a first sidewall 105a disposed toward the first sidewall 103a of the first trench 103, a second sidewall 105b disposed toward the second sidewall 103b of the first trench 103, and an end-portion sidewall 105f disposed toward the end-portion sidewall 103f of the first trench 103.

The first sidewall 105a of the third trench 105 may be spaced a sixth distance L6 apart from the first sidewall 103a of the first trench 103. The second lateral surface 105b of the third trench 105 may be spaced a seventh distance G7 apart from the second sidewall 103b of the first trench 103. The sixth distance G6 may be equal to the seventh distance G7. The sixth distance G6 may be smaller than the first distance G1. The seventh distance G7 may be smaller than the second distance G2.

The end-portion sidewall 105f of the third trench 105 may be spaced a sixth horizontal length L6 apart from the end-portion sidewall 101f of the first trench 101. That is, the second insulating pattern 725 interposed between the end-portion sidewall 105f of the third trench 105 and the end-portion sidewall 101f of the first trench 101 may have the sixth horizontal length L6.

Figure 41A:
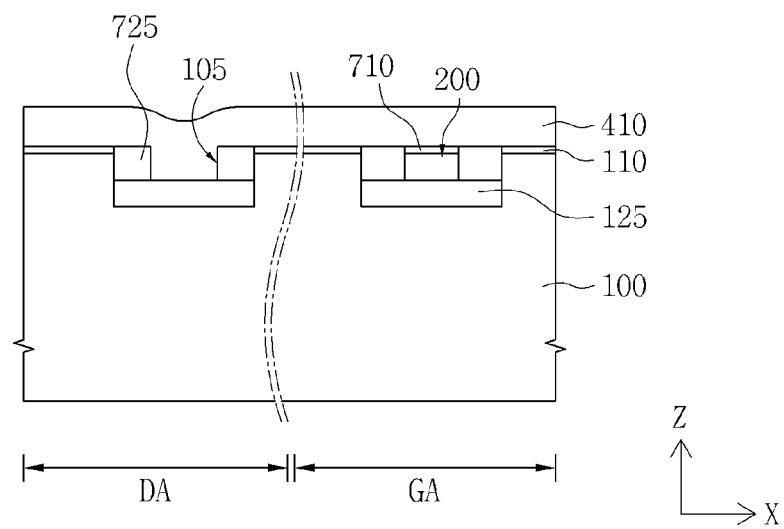
Figure 41B:
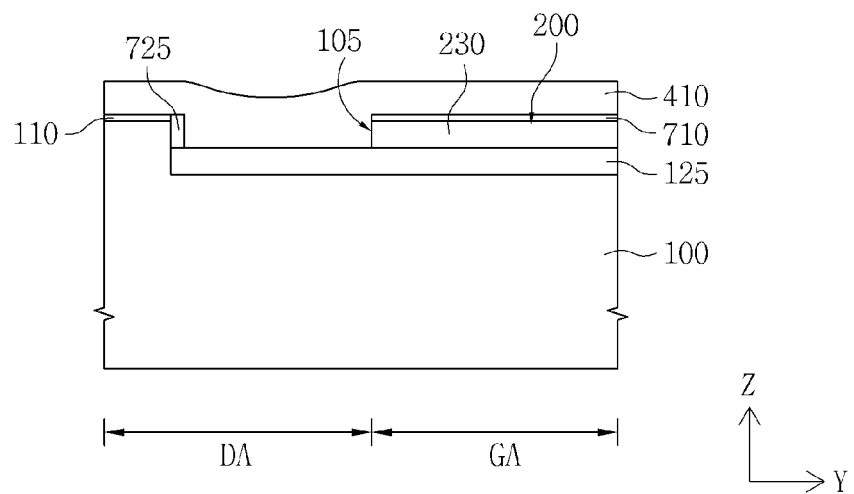

Next, as shown in FIGS. 41A and 41B, the method of fabricating the optical I/O device shown in FIGS. 6A through 6C may include forming a third germanium layer 410 to fill the third trench 105.

The formation of the third germanium layer 410 may include forming an a-Ge layer to fill the third trench 105. The formation of the third germanium layer 410 may include a CVD process.

Figure 42A:
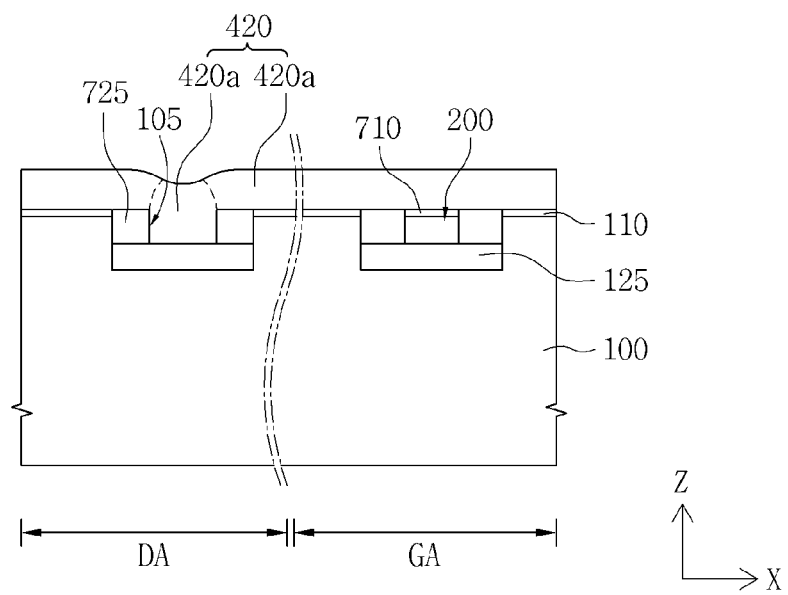
Figure 42B:
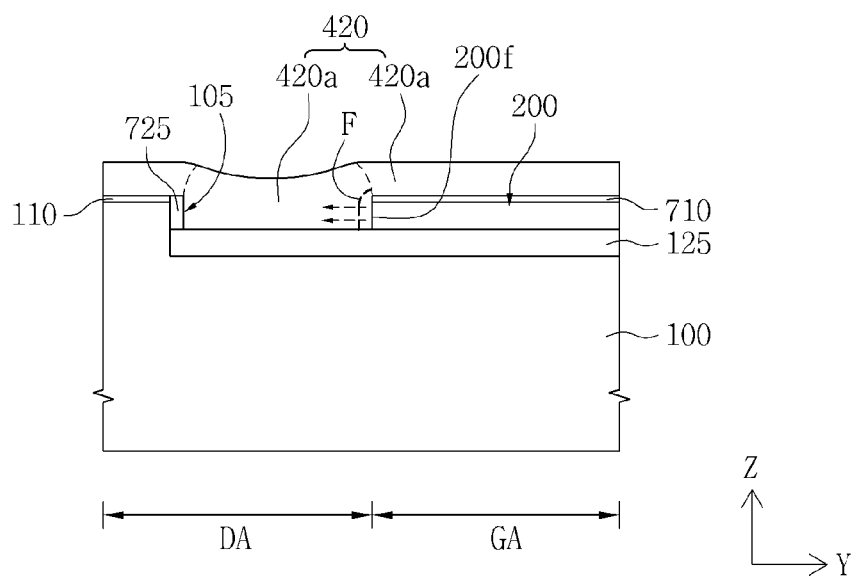

Subsequently, as shown in FIGS. 42A and 42B, the method of fabricating the optical I/O device shown in FIGS. 6A through 6C may include crystallizing the third germanium layer 410 to form a fourth germanium layer 420.

The formation of the fourth germanium layer 420 may include crystallizing the third germanium layer 410 using an RTA process or a laser crystallization process. The laser crystallization process may include a laser-induced LEF process. In this case, the end surface 200f of the waveguide 200 may be used as a crystallization seed.

Specifically, the formation of the fourth germanium layer 420 may include crystallizing a portion of the third germanium layer 410 using the end surface 200f of the waveguide 200 as the crystallization seed. Thus, the fourth germanium layer 420 may include a crystal defect region F disposed adjacent to the end surface 200f of the waveguide 200.

The third germanium layer 410 disposed on the first insulating layer 110 may be crystallized without crystallization seeds. Thus, the fourth germanium layer 420 may include a single crystallization germanium region 420a and a poly-Ge region 420b. The single crystalline germanium region 410a may be disposed within and on the third trench 105. The poly-Ge region 320b may be disposed on the first insulating layer 110.

Figure 43A:
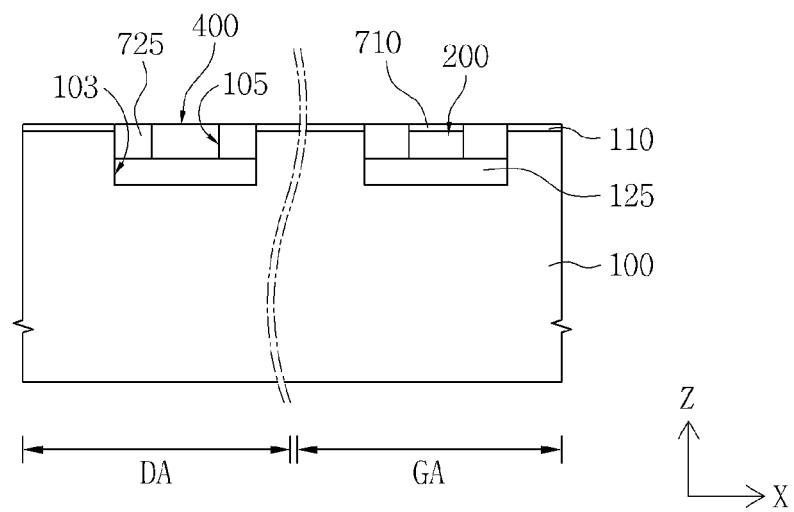
Figure 43B:
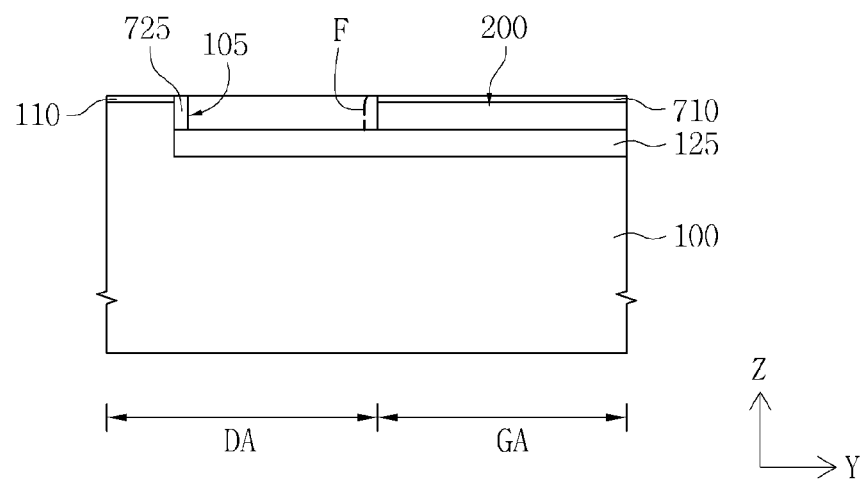

Thereafter, as shown in FIGS. 43A and 43B, the method of fabricating the optical I/O device shown in FIGS. 6A through 6C may include forming a preliminary PD 400 to fill the third trench 105.

The formation of the preliminary PD 400 may include planarizing the fourth germanium layer 420. Thus, the preliminary PD 400 may include a crystal defect region F disposed adjacent to the waveguide 200. The planarization of the fourth germanium layer 420 may include a CMP process.

Figure 44A:
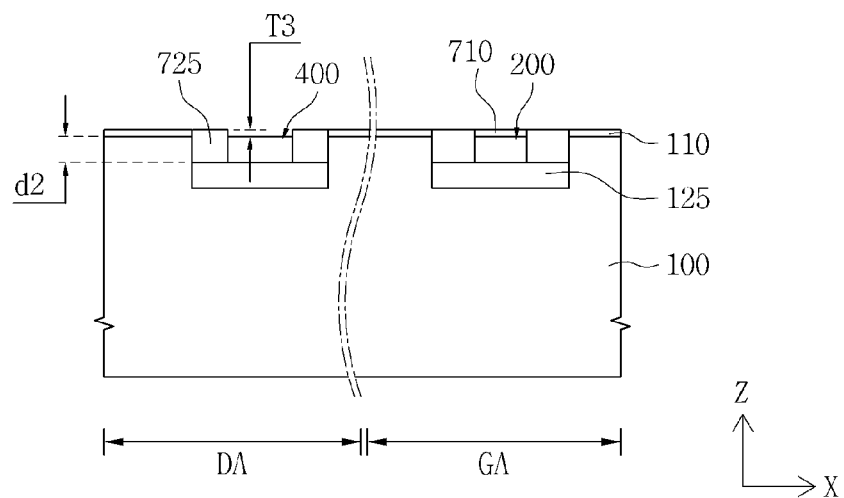
Figure 44B:
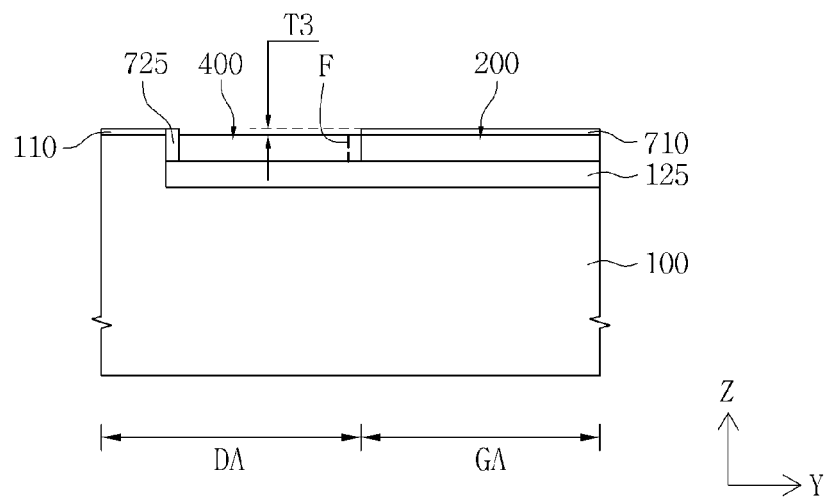

Next, as shown in FIGS. 44A and 44B, the method of fabricating the optical I/O device shown in FIGS. 6A through 6C may include recessing the preliminary PD 400.

The recessing of the preliminary PD 400 may include recessing a top surface of the preliminary PD 400 to a depth equal to a third vertical thickness T3. Thus, the top surface of the preliminary PD 400 may be at the same level as a top surface of the substrate 100. The germanium pattern 325 may have a vertical thickness equal to the second vertical depth d2.

Figure 45A:
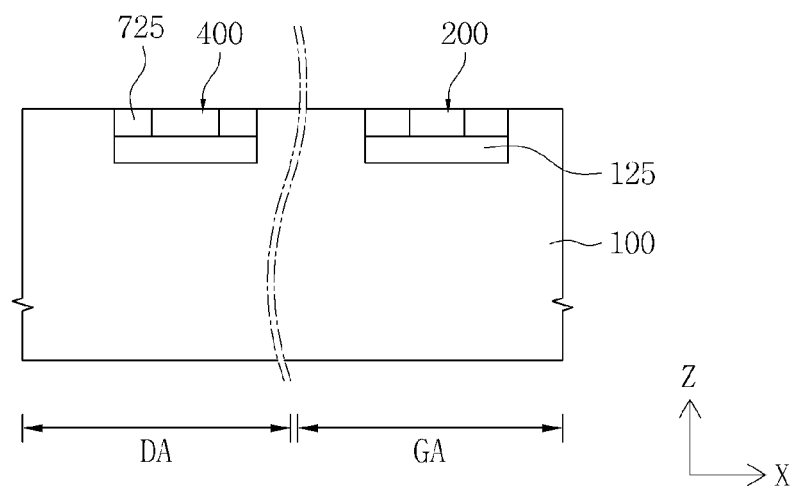
Figure 45B:
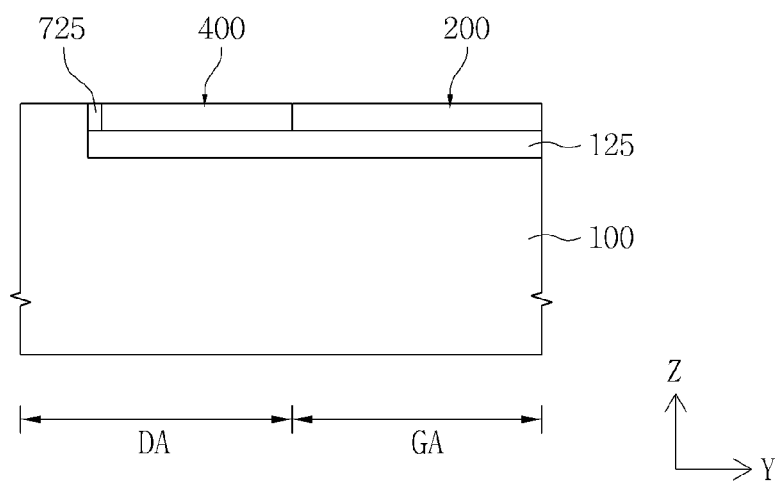

Subsequently, as shown in FIGS. 45A and 45B, the method of fabricating the optical I/O device shown in FIGS. 6A through 6C may include removing the first insulating layer 110 until the top surface of the substrate 100 is exposed.

The removal of the first insulating layer 110 may include planarizing a top surface of the second insulating pattern 725. Thus, the top surface of the second insulating pattern 725 may be at the same level as a top surface of the PD 300. To this end, the removal of the first insulating layer 110 may include planarizing the first insulating layer 110 until the top surface of the substrate 100 is exposed. The planarization of the first insulating layer 130 may include a CMP process.

Figure 46A:
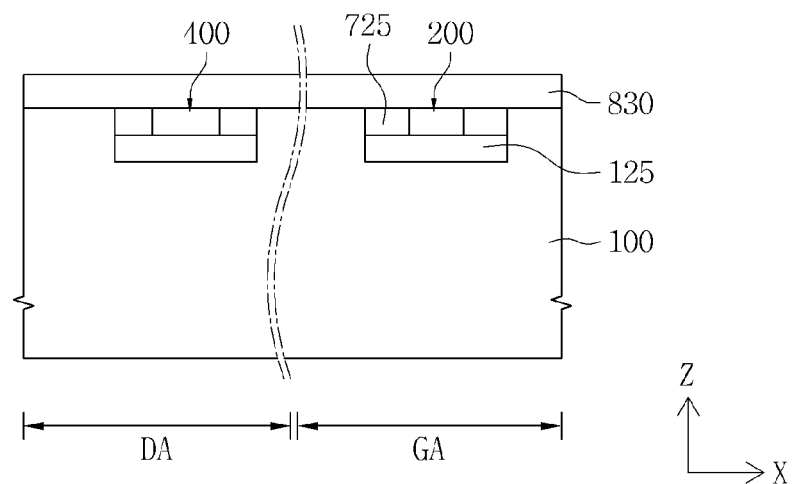
Figure 46B:
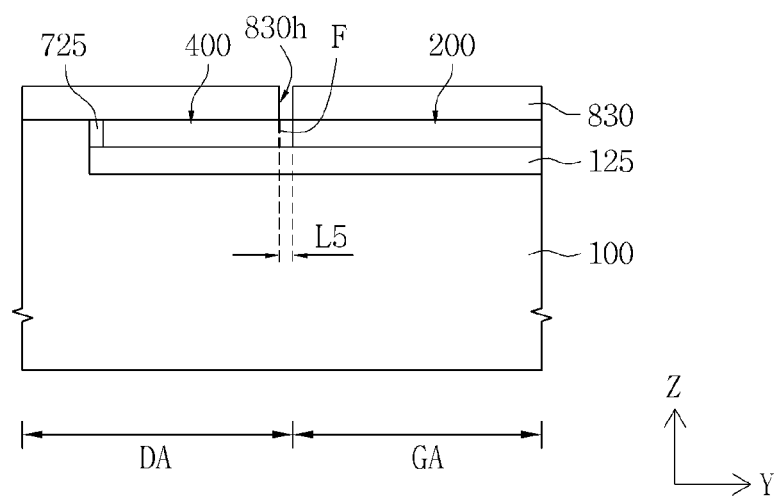

Thereafter, as shown in FIGS. 46A and 46B, the method of fabricating the optical I/O device shown in FIGS. 6A through 6C may include forming a sixth photoresist pattern 830 on the waveguide 200 and the preliminary PD 400.

The sixth photoresist pattern 830 may include an eleventh hole 830h having a fifth horizontal length L5. The eleventh hole 830h may expose the crystal defect region F of the PD 300 disposed adjacent to the end surface 200f of the waveguide 200.

Figure 47A:
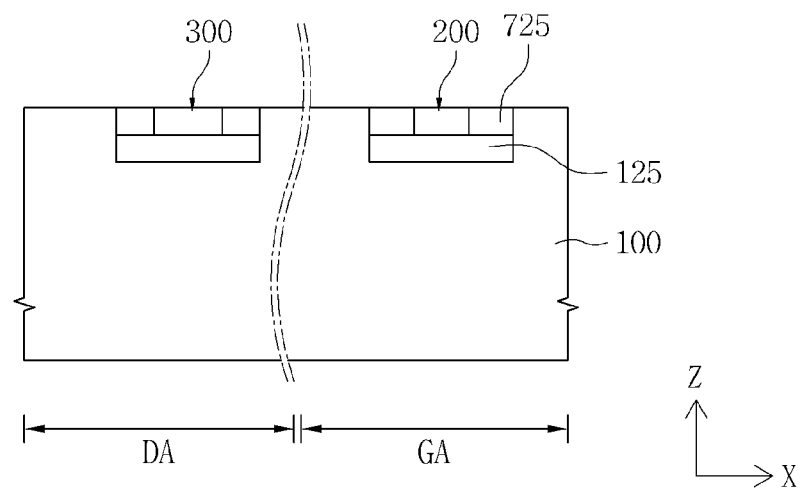
Figure 47B:
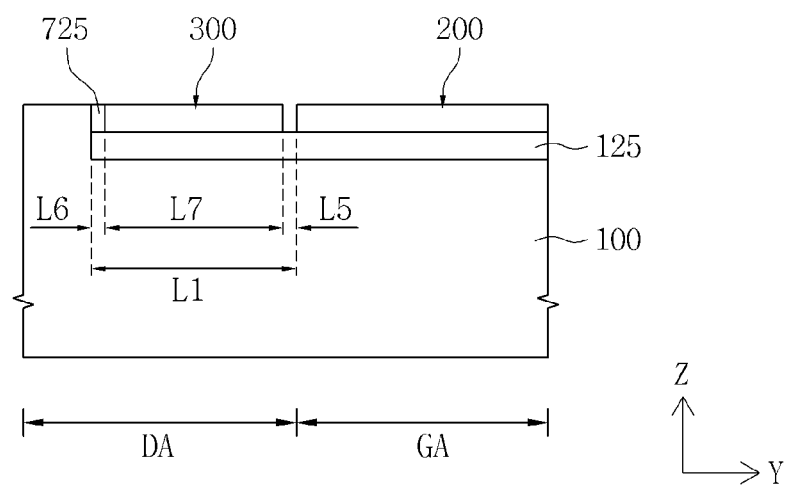

Next, as shown in FIGS. 47A and 47B, the method of fabricating the optical I/O device shown in FIGS. 6A through 6C may include forming the PD 300 using the sixth photoresist pattern 830.

The formation of the PD 300 may include removing the crystal defect region F of the preliminary PD 400 using the sixth photoresist pattern 830. Thus, the PD 300 may be formed so as not to include crystal defects.

The PD 300 may have a seventh horizontal length L7. The seventh horizontal length L7 may be a value obtained by subtracting the fifth horizontal length L5 and the sixth horizontal length L6 from the first horizontal length L1.

Figure 48A:
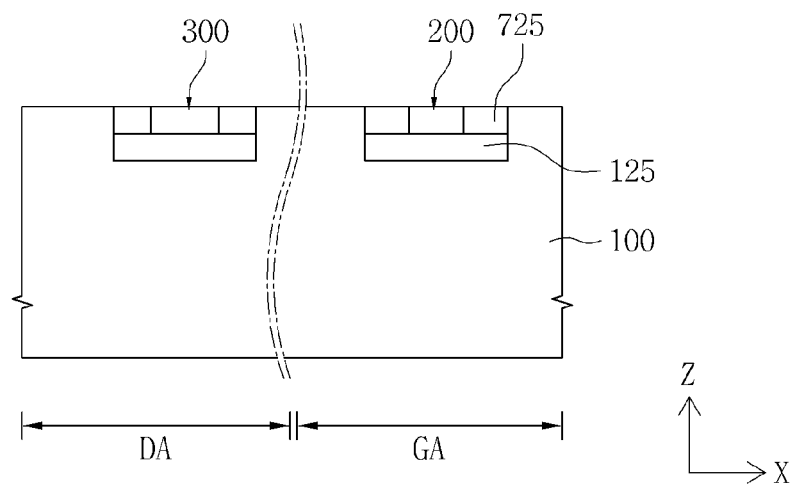
Figure 48B:
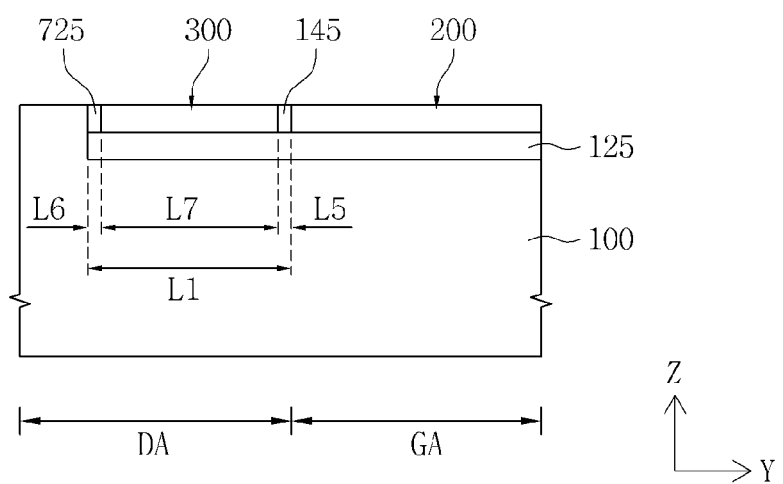

Subsequently, as shown in FIGS. 48A and 48B, the method of fabricating the optical I/O device shown in FIGS. 6A through 6C may include forming a light-transmitting insulating layer 145 between the PD 300 and the waveguide 200.

The formation of the light-transmitting insulating layer 145 may include a thermal oxidation process or a CVD process. The formation of the light-transmitting insulating layer 145 may include a CMP process. The light-transmitting insulating layer 145 may have the fifth horizontal length L6.

Thereafter, as shown in FIGS. 6A and 6B, the method of fabricating the optical I/O device shown in FIGS. 6A through 6C according to the ninth exemplary embodiment may include forming a first doping region 300P and a second doping region 300N in the PD 300.

Finally, the method of fabricating the optical I/O device shown in FIGS. 6A through 6C according to the ninth exemplary embodiment may include forming an upper cladding insulating layer 160 on the waveguide 200 and the PD 300.

Here, the method of fabricating the optical I/O device according to the ninth exemplary embodiment may include forming the upper cladding insulating layer 160 after removing the crystal defect region F. In this case, the upper cladding insulating layer 160 may fill a space between the waveguide 200 and the PD 300. That is, the method of fabricating the optical I/O device shown in FIGS. 6A through 6C according to the ninth exemplary embodiment may include simultaneously forming the light-transmitting insulating layer 145 and the upper cladding insulating layer 160.

Exemplary Embodiment 10

Figure 49:
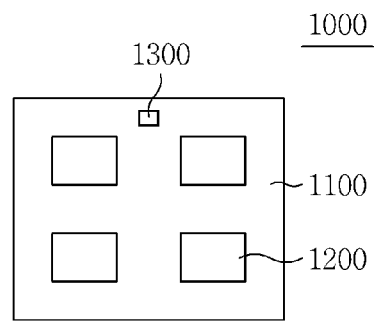
FIG. 49 is a construction diagram of a semiconductor device including an optical I/O device according to exemplary embodiments.

FIG. 49 is a construction diagram of a memory device according to a tenth exemplary embodiment, including an optical I/O device according to exemplary embodiments.

Referring to FIG. 49, a memory device 1000 including an optical I/O device according to exemplary embodiments may include a memory substrate 1100, a plurality of memory cells 1200, and an I/O module 1300. The memory substrate 1100 may be a bulk silicon wafer.

Each of the plurality of memory cells 1200 may be a cell of a dynamic random access memory (DRAM), a static random access memory (SRAM), a flash memory, a phase-change memory, a magnetic random access memory (MRAM), or a resistive random access memory (RRAM).

The I/O module 1300 may include an optical I/O device according to exemplary embodiments. For example, the I/O module 1300 may include an optical I/O device including a waveguide, a coupler, and a PD, which are buried in the memory substrate 1100. Thus, the I/O module 1300 may exhibit excellent reliability as compared with the related art.

The memory device 1000 may optically transmit/receive data to/from an electronic device disposed adjacent thereto or the memory device 1000 using the I/O module 1300 including the optical I/O device according to the exemplary embodiments. Thus, the memory device 1000 may stably and rapidly transmit/receive data.

Exemplary Embodiment 11

Figure 50:
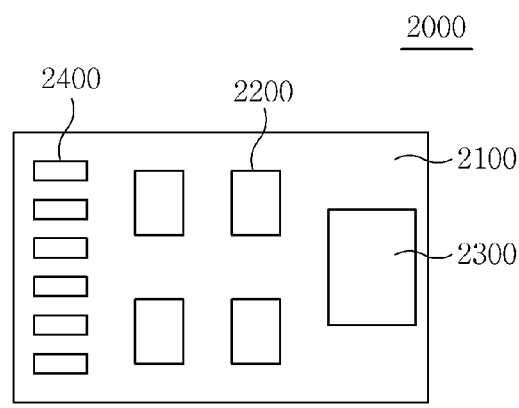
FIG. 50 is a construction diagram of a memory module including an optical I/O device according to exemplary embodiments.

FIG. 50 is a construction diagram of a semiconductor module according to an eleventh exemplary embodiment, including an optical I/O device according to exemplary embodiments.

Referring to FIG. 50, a semiconductor module 2000 including an optical I/O device according to exemplary embodiments may include a module substrate 2100, a plurality of semiconductor packages 2200, a control chip package 2300, and a plurality of I/O modules 2400. The plurality of semiconductor packages 2200 and the control chip package 2300 may be electrically connected to the I/O modules 2400.

The plurality of semiconductor packages 2200 may include a volatile memory chip, a non-volatile memory chip, or a combination thereof. The volatile memory chip may include a DRAM and an SRAM. The non-volatile memory chip may include a flash memory, a phase-change memory, an MRAM, and an RRAM. The semiconductor module 2000 may alternatively not include the control chip package 2200. Thus, the semiconductor module 2000 including the optical I/O device according to the exemplary embodiments may be a memory module. For example, the semiconductor module 2000 may be a memory card.

Each of the plurality of I/O modules 2400 may include an optical I/O device according to exemplary embodiments. For example, each of the I/O modules 2400 may include an optical I/O device including a waveguide, a coupler, and a PD, which are buried in the module substrate 2100. Thus, the plurality of I/O modules 2400 may exhibit excellent reliability as compared with the related art.

The semiconductor module 2000 may optically transmit/receive data to/from an external electronic device using the plurality of I/O modules 2400, each I/O module including the optical I/O device according to the exemplary embodiments. Thus, the semiconductor module 2000 may stably and rapidly transmit/receive data.

In addition, as described and illustrated above, each of the plurality of semiconductor packages 2200 may include a memory device. That is, each of the plurality of semiconductor packages 2200 may include an optical I/O device according to exemplary embodiments. Thus, the plurality of semiconductor packages 2200 may be optically connected to one another. As a result, the semiconductor module 2000 may enable data to be stably and rapidly transmitted/received between the plurality of semiconductor packages 2200.

Exemplary Embodiment 12

Figure 51:
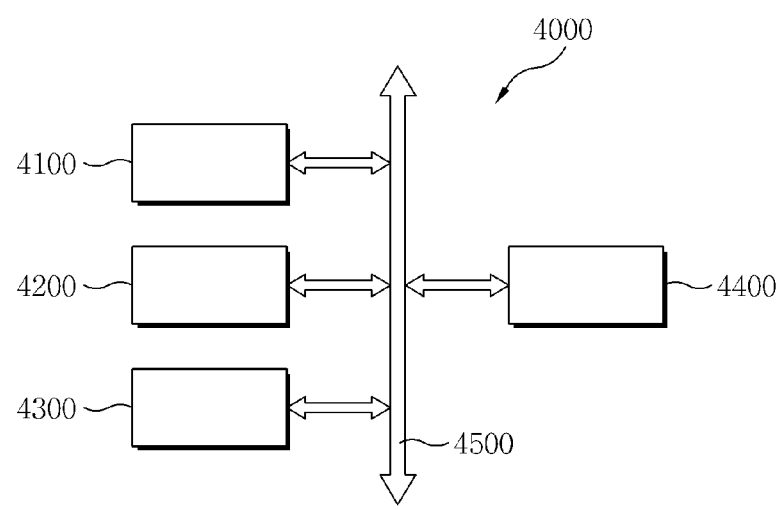
FIG. 51 is a construction diagram of an electronic system including an optical I/O device according to exemplary embodiments.

FIG. 51 is a construction diagram of an electronic system according to a twelfth exemplary embodiment, including an optical I/O device according to exemplary embodiments.

Referring to FIG. 51, an electronic system 4000 including an optical I/O device according to exemplary embodiments may include an interface 4100, a controller 4200, a memory 4300, and an external I/O device 4400. The interface 4100 may be electrically connected to the controller 4200, the memory 4300, and the external I/O device 4400 through a bus 4500.

The electronic system 4000 may include a personal digital assistant (PDA), a portable computer, a web tablet, a wireless phone, a mobile phone, and a digital music player.

The interface 4100 may communicate data with an external system. Specifically, the interface 4100 may transmit/receive data to/from a communication network. The interface 4100 may include an optical I/O device according to exemplary embodiments. The interface 4100 may communicate data with the external system using an optical signal. Thus, the interface 4100 may exhibit excellent reliability as compared with the related art.

The controller 4200 may include a microprocessor (MP), a digital processor, a microcontroller, or other processing devices similar thereto. The external I/O device 4400 may be a keypad, a keyboard, or a display device.

The memory 4300 may be used to store commands executed by the controller 4200. The memory 4300 may be optically connected to the interface 4100. In this case, the memory 4300 may be a memory device including an optical I/O device according to exemplary embodiments. For example, the memory 4300 may include an optical I/O device in which a waveguide, a coupler, and a PD are buried in a memory substrate (not shown). As a result, communication of data between the memory 4300 and the interface 4100 may be enabled more reliably than in the conventional art.

The electronic system 4000 may optically transmit/receive data to/from an external system using the interface 4100 including the optical I/O device according to the exemplary embodiments. As a result, the electronic system 4000 may stably and rapidly transmit/receive data.

In an optical I/O device according to exemplary embodiments, a PD optically connected to an end surface of a waveguide does not include crystal defects. That is, in the optical I/O device according to the exemplary embodiments, crystal defects are not disposed on a path through which an optical signal travels. As a result, the optical I/O device according to the exemplary embodiments may have improved reliability.

The foregoing is illustrative of exemplary embodiments and is not to be construed as limiting thereof. Although a few exemplary embodiments have been described, those skilled in the art will readily appreciate that many modifications are possible without materially departing from the novel teachings and advantages. Accordingly, all such modifications are intended to be included within the scope of the inventive concept as defined in the claims. In the claims, means-plus-function clauses are intended to cover the structures described herein as performing the recited function, and not only structural equivalents but also equivalent structures.

What is claimed is:

1. An optical input/output device comprising:
a substrate including a first region and a second region;
an upper trench; disposed in the substrate, the upper trench running across the first region and the second region;
a waveguide disposed within the upper trench of the first region of the substrate;
a photodetector disposed within the upper trench of the second region of the substrate and including a first end surface optically connected to an end surface of the waveguide; and
a light-transmitting insulating layer interposed between the end surface of the waveguide and the first end surface of the photodetector,
wherein a horizontal width of the photodetector is the same as a horizontal width of the waveguide,
wherein a horizontal width of the upper trench disposed in the second region is greater than a horizontal width of the upper trench disposed in the first region, and
wherein the substrate further includes a seed region exposed by the upper trench, and the seed region is disposed in the second region of the substrate.

2. The optical input/output device of claim 1, wherein a distance between a first sidewall of the upper trench and a first lateral surface of the waveguide is equal to a distance between the first sidewall of the upper trench and a first lateral surface of the photodetector.

3. The optical input/output device of claim 1, wherein a horizontal length of the upper trench disposed in the second region is greater than a sum of a horizontal length of the photodetector and a horizontal length of the light-transmitting insulating layer.

4. The optical input/output device of claim 3, wherein a distance between a second end surface of the photodetector and the upper trench is equal to the horizontal length of the light-transmitting insulating layer.

5. The optical input/output device of claim 1, wherein the substrate further includes a lower trench disposed under the upper trench,
wherein a horizontal width of the lower trench disposed in the first region is equal to a horizontal width of the lower trench disposed in the second region.

6. The optical input/output device of claim 5, wherein a first sidewall of the lower trench is vertically aligned with a first sidewall of the upper trench.

7. The optical input/output device of claim 5, wherein the horizontal width of the lower trench is equal to the horizontal width of the upper trench disposed in the first region.

8. The optical input/output device of claim 1, wherein a horizontal width of the photodetector is equal to a horizontal width of the waveguide.

9. The optical input/output device of claim 1, wherein the waveguide includes silicon, and the photodetector includes germanium.

10. The optical input/output device of claim 1, wherein the photodetector further includes a first doping region, a second doping region spaced apart from the first doping region, and an intrinsic region, and
wherein the first doping region includes first impurities and the second doping region includes second impurities, and the second impurities are of a different conductivity type from the first impurities.

11. The optical input/output device of claim 1, further comprising an upper cladding insulating layer disposed on the waveguide and the photodetector,
wherein the upper cladding insulating layer includes a same material as the light transmitting insulating layer.

12. An optical input/output device comprising:
a substrate including an upper trench;
a waveguide disposed within the upper trench of the substrate;
a photodetector disposed within the upper trench of the substrate and including a first end surface optically connected to an end surface of the waveguide; and
a light-transmitting insulating layer interposed between the end surface of the waveguide and the first end surface of the photodetector, wherein the substrate further includes a first region where the waveguide is disposed, and a second region where the photodetector is disposed,
wherein a horizontal width of the upper trench disposed in the second region is greater than a horizontal width of the upper trench disposed in the first region, and
wherein the substrate further includes a seed region exposed by the upper trench, and the seed region is disposed in the second region of the substrate.

13. An optical input/output device comprising:
a substrate comprising a lower trench and an upper trench formed over the lower trench, the upper trench and the lower trench extending long a y-axis direction;
a waveguide disposed in the upper trench of the substrate in a first region of the substrate;
a photodetector disposed in the upper trench of the substrate in a second region of the substrate, the photodetector comprising a first end surface optically connected to an end surface of the waveguide; and
a light-transmitting insulating layer interposed between the end surface of the waveguide and the first end surface of the photodetector,
wherein a width of the photodetector is less than a width of the upper trench in the second region and less than a width of the lower trench in the second region,
a width of the upper trench in the second region is greater than a width of the lower trench in the second region so as to provide a seed region of the substrate in the second region, and
the widths extending in an x-axis direction.

14. The device of claim 13, wherein the width of the upper trench in the first region and the width of the lower trench in the first region are the same, and the waveguide is centered in the upper trench in the width direction.

15. The device of claim 13, wherein the photodetector is provided in the upper trench in the second region so as to be centered in the width direction with respect to the lower trench in the second region.

16. The device of claim 13, wherein a width of the waveguide and a width of the photodetector are equal to a width of the light-transmitting insulating layer.

17. The device of claim 13, wherein the light-transmitting insulating layer is disposed in the second region of the substrate.

* * * * *